(12) United States Patent
Beon et al.

(10) Patent No.: US 12,329,021 B2
(45) Date of Patent: Jun. 10, 2025

(54) POLARIZING PLATE AND DISPLAY DEVICE INCLUDING THE SAME

(71) Applicants: Samsung Display Co., LTD., Yongin-si (KR); DONGWOO FINE-CHEM CO., LTD., Iksan-si (KR)

(72) Inventors: Beong Hun Beon, Yongin-si (KR); Min Seok Kim, Iksan-si (KR); Duk Jin Lee, Yongin-si (KR); Young Eun Choi, Iksan-si (KR); Eun Ok Lee, Iksan-si (KR); Soo An Cho, Iksan-si (KR); Sun Hwa Kim, Yongin-si (KR); Ga Hee Park, Yongin-si (KR); Yeon Su Woo, Yongin-si (KR); Woo Suk Jung, Yongin-si (KR)

(73) Assignees: SAMSUNG DISPLAY CO., LTD., Yongin-si (KR); DONGWOO FINE-CHEM CO., LTD., Iksan-si (KR)

( * ) Notice: Subject to any disclaimer, the term of this patent is extended or adjusted under 35 U.S.C. 154(b) by 0 days.

(21) Appl. No.: 18/473,397

(22) Filed: Sep. 25, 2023

(65) Prior Publication Data

US 2024/0284770 A1 Aug. 22, 2024

(30) Foreign Application Priority Data

Feb. 10, 2023 (KR) ........................ 10-2023-0018341

(51) Int. Cl.
*G02B 5/30* (2006.01)
*G02B 1/08* (2006.01)
(Continued)

(52) U.S. Cl.
CPC ........... *H10K 59/8793* (2023.02); *G02B 1/08* (2013.01); *G02B 5/3016* (2013.01);
(Continued)

(58) Field of Classification Search
CPC ............. H10K 59/8793; H10K 59/352; H10K 59/353; H10K 59/873; H10K 77/111; G02B 1/08; G02B 5/3016
See application file for complete search history.

(56) References Cited

U.S. PATENT DOCUMENTS 10,283,735 B2    5/2019  Kim et al.
2015/0369981 A1* 12/2015  Takeda ................. G02B 5/3025
                                                                359/488.01
(Continued)

FOREIGN PATENT DOCUMENTS

CN      107037522    8/2017
EP      933 181      6/2008
(Continued)

*Primary Examiner* — Elmito Breval
(74) *Attorney, Agent, or Firm* — KILE PARK REED & HOUTTEMAN PLLC

(57) ABSTRACT

A polarizing plate and a display device including the same are provided. A polarizing plate includes a polarizer comprising an absorption axis and a transmission axis that intersect each other, a first retardation layer disposed on a surface of the polarizer, and a second retardation layer disposed on another surface opposite to the surface of the polarizer. An in-plane retardation value of the second retardation layer is greater than about 20 nm and less than about 100 nm. An angle between the absorption axis of the polarizer and a retardation axis of the second retardation layer is in a range of about 10° to about 45°.

35 Claims, 48 Drawing Sheets

(51) Int. Cl.
*H10K 59/35* (2023.01)
*H10K 59/80* (2023.01)
*H10K 77/10* (2023.01)

(52) U.S. Cl.
CPC ......... *H10K 59/352* (2023.02); *H10K 59/353* (2023.02); *H10K 59/873* (2023.02); *H10K 77/111* (2023.02)

(56) References Cited

U.S. PATENT DOCUMENTS

2019/0331838 A1* 10/2019 Konno ................ B32B 7/02
2021/0359275 A1* 11/2021 Beon ................ G02B 5/3008
2024/0134102 A1    4/2024 Lee et al.

FOREIGN PATENT DOCUMENTS

| | | |
|---|---|---|
| JP | 2021-92685 | 6/2021 |
| KR | 10-2015-0122410 | 11/2015 |
| KR | 10-2021-0028876 | 3/2021 |
| KR | 10-2021-0142038 | 11/2021 |
| KR | 10-2388437 | 4/2022 |
| KR | 10-2442909 | 9/2022 |
| KR | 10-2444973 | 9/2022 |
| KR | 10-2458598 | 10/2022 |
| KR | 10-2024-0048069 | 4/2024 |

\* cited by examiner

FIG. 19

| φ1 \ φ2 | 0° | 45° | 90° | 135° | 180° | 225° | 270° | 315° |
|---|---|---|---|---|---|---|---|---|
| 0° | × | ○ | ○ | ○ | ○ | ○ | ○ | ○ |
| 45° | ○ | × | ○ | ○ | ○ | ○ | ○ | ○ |
| 90° | ○ | ○ | × | ○ | ○ | ○ | ○ | ○ |
| 135° | ○ | ○ | ○ | × | ○ | ○ | ○ | ○ |
| 180° | ○ | ○ | ○ | ○ | × | ○ | ○ | ○ |
| 225° | ○ | ○ | ○ | ○ | ○ | × | ○ | ○ |
| 270° | ○ | ○ | ○ | ○ | ○ | ○ | × | ○ |
| 315° | ○ | ○ | ○ | ○ | ○ | ○ | ○ | × | ced
POLARIZING PLATE AND DISPLAY DEVICE INCLUDING THE SAME

CROSS-REFERENCE TO RELATED APPLICATION(S)

This application claims priority to and benefits of Korean Patent Application No. 10-2023-0018341 under 35 U.S.C. § 119, filed on Feb. 10, 2023, in the Korean Intellectual Property Office (KIPO), the entire contents of which are incorporated herein by reference.

BACKGROUND

1. Technical Field

Embodiments relate to a polarizing plate and a display device including the polarizing plate.

2. Description of the Related Art

With the advance of information-oriented society, more and more demands are placed on display devices for displaying images in various ways. The display device may include a flat panel display panel such as a liquid crystal display panel, an organic light emitting display panel, an inorganic light emitting display panel, and the like.

The display device may include an optical film such as a polarizing plate disposed on a display panel to prevent a decrease in visibility due to external light. The optical film may prevent the external light incident on the display device from being reflected from the display panel.

SUMMARY

Embodiments provide a polarizing plate capable of preventing a viewer from feeling a color difference and a display device including the polarizing plate.

However, embodiments are not limited to those set forth herein. The above and other embodiments will be apparent to one of ordinary skill in the art to which the disclosure pertains by referencing the detailed description of the disclosure given below.

According to an embodiment, a polarizing plate may include a polarizer including an absorption axis and a transmission axis that intersect each other, a first retardation layer disposed on a surface of the polarizer, and a second retardation layer disposed on another surface opposite to the surface of the polarizer. An in-plane retardation value of the second retardation layer may be greater than about 20 nm and less than about 100 nm. An angle between the absorption axis of the polarizer and a retardation axis of the second retardation layer may be about 10° to about 45°.

An in-plane retardation value of the first retardation layer may be greater than the in-plane retardation value of the second retardation layer.

An angle between a retardation axis of the first retardation layer and the absorption axis of the polarizer may be about 45°.

The polarizer and the first retardation layer may be defined as a first part. An in-plane retardation value (Ro) of the first part at a wavelength of about 550 nm may be in a range of about 100 nm to about 180 nm. A value of Ro(450)/Ro(550) may be equal to or less than about 1.00, the Ro(450) may be an in-plane retardation value of the first part at a wavelength of about 450 nm, and the Ro(550) may be an in-plane retardation value of the first part at a wavelength of about 550 nm.

The polarizing plate may further include a protective film disposed between the polarizer and the first retardation layer.

The polarizer, the protective film, and the first retardation layer may be defined as a first part. An in-plane retardation value (Ro) of the first part at a wavelength of about 550 nm may be in a range of about 100 nm to about 180 nm, a value of Ro(450)/Ro(550) may be equal to or less than about 1.00, the Ro(450) may be an in-plane retardation value of the first part at a wavelength of about 450 nm, and the Ro(550) may be an in-plane retardation value of the first part at a wavelength of about 550 nm.

The polarizing plate may further include: a positive C retardation layer having an optical axis in a direction perpendicular to the surface of the polarizer.

The polarizer, the positive C retardation layer, the protective film, and the first retardation layer may be defined as a first part, an in-plane retardation value (Ro) of the first part at a wavelength of about 550 nm may be in a range of about 100 nm to about 180 nm, a value of Ro(450)/Ro(550) may be equal to or less than about 1.00, the Ro(450) may be an in-plane retardation value of the first retardation layer at a wavelength of about 450 nm, and the Ro(550) may be an in-plane retardation value of the first retardation layer at a wavelength of about 550 nm.

The polarizing plate may further include a positive C retardation layer having an optical axis in a direction perpendicular to the surface of the polarizer.

The positive C retardation layer may be disposed on a surface of the first retardation layer.

The first retardation layer may include a plurality of retardation layers. The positive C retardation layer may be disposed between the plurality of retardation layers.

The polarizer, the positive C retardation layer, and the first retardation layer may be defined as a first part. An in-plane retardation value (Ro) of the first part at a wavelength of about 550 nm may be in a range of about 100 nm to about 180 nm, a value of Ro(450)/Ro(550) may be equal to or less than about 1.00, the Ro(450) may be an in-plane retardation value of the first retardation layer at a wavelength of about 450 nm, and the Ro(550) may be an in-plane retardation value of the first retardation layer at a wavelength of about 550 nm.

A frontside reflectance may be less than about 6%.

An orthogonal transmittance may be in a range of about 2% to about 14%.

The second retardation layer may include a norbornene-based resin.

According to an embodiment, a display device may include a display panel, and a polarizing plate disposed on the display panel. The polarizing plate may include a polarizer including an absorption axis and a transmission axis that intersect each other, a first retardation layer disposed on a surface of the polarizer, and a second retardation layer disposed on another surface opposite to the surface of the polarizer. An in-plane retardation value of the second retardation layer may be greater than about 20 nm and less than about 100 nm. An angle between the absorption axis of the polarizer and a retardation axis of the second retardation layer may be in a range of about 10° to about 45°.

The display panel may include a pixel electrode disposed on a substrate, a light emitting layer disposed on the pixel electrode, and a common electrode disposed on the light emitting layer.

The display panel may further include a capping layer disposed on the common electrode, and an encapsulation layer disposed on the capping layer.

The encapsulation layer may include at least two encapsulation inorganic layers having different refractive indices, and an encapsulation organic layer disposed between the at least two encapsulation inorganic layers and having a refractive index different from those of the at least two encapsulation inorganic layers.

A maximum color difference value may be less than about 0.0050.

Color values may be calculated at intervals of about P° at an azimuth angle from about 0° to about 3600 and at intervals of about R° at a polar angle from about 0° to about Q°, where P, Q, and R may be positive integers, color difference values may be calculated with changing the polar angle at intervals of about R° at first and second azimuth angles, which are two different azimuth angles, and a maximum value among the calculated color difference values may be calculated as the maximum color difference value.

A minimum perceptible color difference (MPCD) may be equal to or less than about 10.

A difference between a luminance ratio of red light or a luminance ratio of green light and a luminance ratio of blue light expressed as CIE XYZ tristimulus values may be less than about 10%.

An in-plane retardation value of the first retardation layer may be greater than the in-plane retardation value of the second retardation layer.

An angle between a retardation axis of the first retardation layer and the absorption axis of the polarizer may be about 45°.

The polarizer and the first retardation layer may be defined as a first part. An in-plane retardation value (Ro) of the first part at a wavelength of about 550 nm may be in a range of about 100 nm to about 180 nm, a value of Ro(450)/Ro(550) may be equal to or less than about 1.00, the Ro(450) may be an in-plane retardation value of the first part at a wavelength of about 450 nm, and the Ro(550) may be an in-plane retardation value of the first part at a wavelength of about 550 nm.

The display device may further include a protective film disposed between the polarizer and the first retardation layer.

The polarizer and the first retardation layer may be defined as a first part. An in-plane retardation value (Ro) of the first part at a wavelength of about 550 nm may be in a range of about 100 nm to about 180 nm, a value of Ro(450)/Ro(550) may be equal to or less than about 1.00, the Ro(450) may be an in-plane retardation value of the first part at a wavelength of about 450 nm, and the Ro(550) may be an in-plane retardation value of the first part at a wavelength of about 550 nm.

The display device may further include: a positive C retardation layer having an optical axis in a direction perpendicular to the surface of the polarizer.

The polarizer, the positive C retardation layer, the protective film, and the first retardation layer may be defined as a first part, an in-plane retardation value (Ro) of the first part at a wavelength of about 550 nm may be in a range of about 100 nm to about 180 nm, a value of Ro(450)/Ro(550) may be equal to or less than about 1.00, the Ro(450) may be an in-plane retardation value of the first retardation layer at a wavelength of about 450 nm, and the Ro(550) may be an in-plane retardation value of the first retardation layer at a wavelength of about 550 nm.

The display device may further include a positive C retardation layer having an optical axis in a direction perpendicular to the surface of the polarizer.

The positive C retardation layer may be disposed on a surface of the first retardation layer.

The first retardation layer may include a plurality of retardation layers. The positive C retardation layer may be disposed between the plurality of retardation layers.

The polarizer, the first retardation layer, and the positive C retardation layer may be defined as a first part. An in-plane retardation value (Ro) of the first part at a wavelength of about 550 nm may be in a range of about 100 nm to about 180 nm, a value of Ro(450)/Ro(550) may be equal to or less than about 1.00, the Ro(450) may be an in-plane retardation value of the first part at a wavelength of about 450 nm, and the Ro(550) may be an in-plane retardation value of the first part at a wavelength of about 550 nm.

A frontside reflectance of the polarizing plate may be less than about 6%.

An orthogonal transmittance of the polarizing plate may be about 2% to about 14%.

The second retardation layer may include a norbornene-based resin.

According to an embodiment, it is possible to prevent a viewer from feeling a color difference in the image of the display device by setting the in-plane retardation value of the retardation layer disposed on the viewer side of a polarizer to be greater than or equal to about 20 nm and smaller than about 100 nm, and setting the angle between the retardation axis of the retardation layer and the absorption axis of the polarizer to about 10° to about 45°.

Other features and embodiments may be apparent from the following detailed description and the drawings.

BRIEF DESCRIPTION OF THE DRAWINGS

The accompanying drawings, which are included to provide a further understanding of the disclosure, illustrate embodiments in which:

FIG. 19 is a table showing a first azimuth angle and a second azimuth angle;

DETAILED DESCRIPTION OF THE EMBODIMENTS

Figure 1:
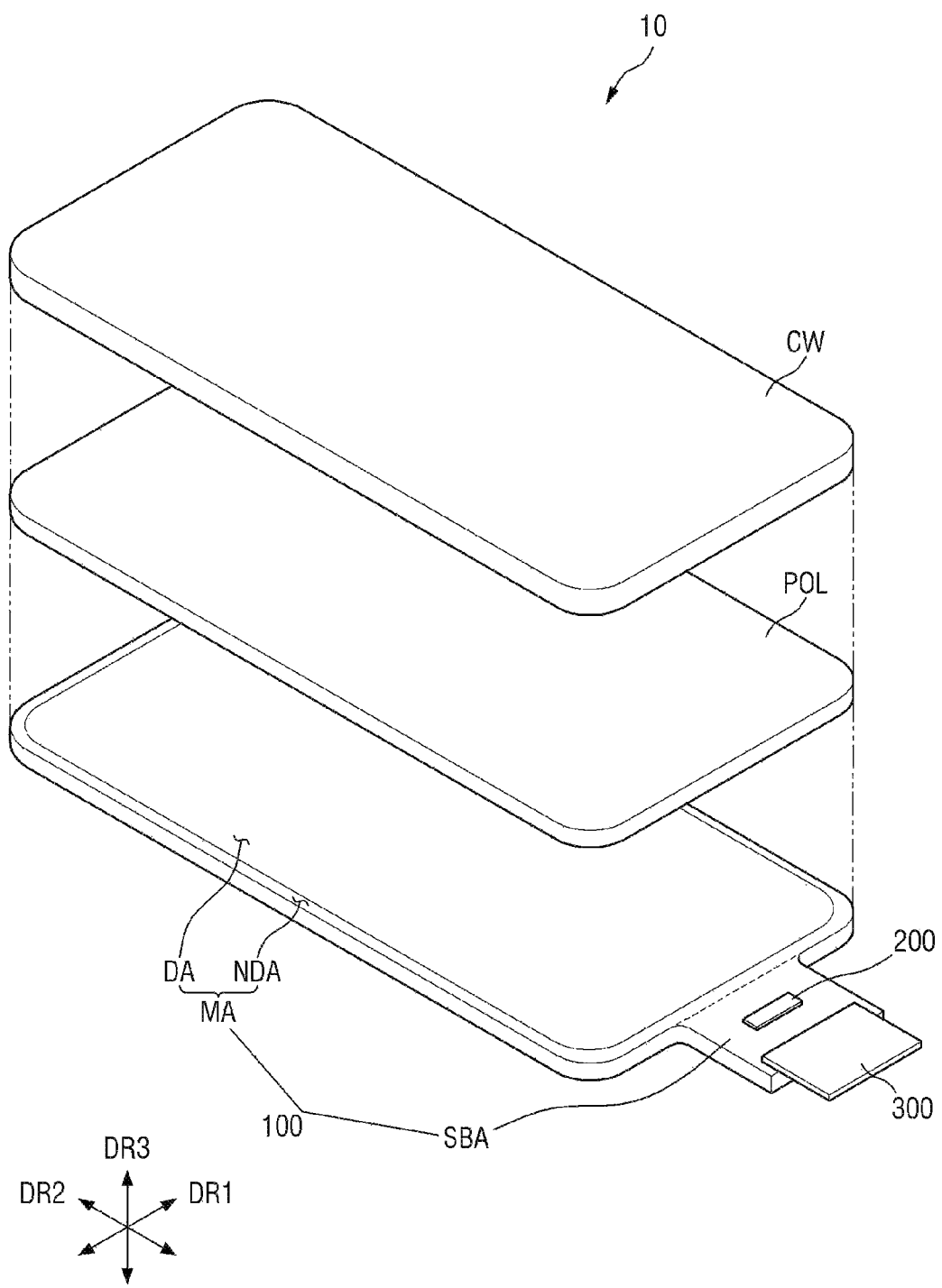
FIG. 1 is an exploded schematic perspective view showing a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on another layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within about ±30%, ±20%, ±10%, ±5% of the stated value.

In the description, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the description, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

Figure 2:
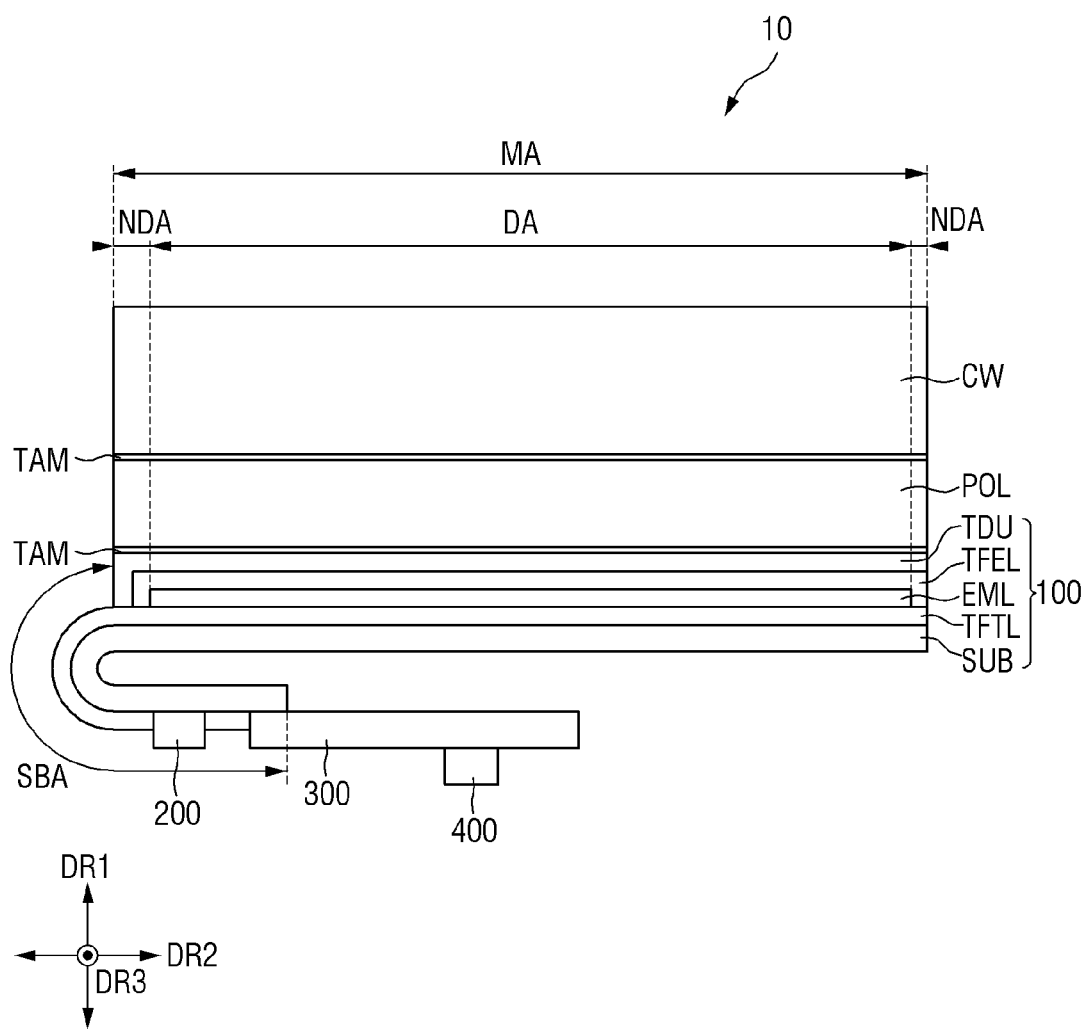
FIG. 2 is a schematic side view illustrating a display device according to an embodiment.

FIG. 1 is an exploded schematic perspective view showing a display device according to an embodiment. FIG. 2 is a schematic side view illustrating a display device according to an embodiment.

Referring to FIGS. 1 and 2, a display device 10 may be a device that displays a moving image or a still image. The display device 10 may be used as a display screen of various devices, such as a television, a laptop computer, a monitor, a billboard and an Internet-of-Things (IoT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device, and an ultra-mobile PC (UMPC).

The display device 10 according to an embodiment may be a light emitting display device such as an organic light emitting display including an organic light emitting diode, a quantum dot light emitting display including a quantum dot light emitting layer, an inorganic light emitting display including an inorganic semiconductor, and a micro or nano light emitting display including a micro or nano light emitting diode (LED). In the following description, it is assumed that the display device 10 according to an embodiment is an organic light emitting display device, but embodiments are not limited thereto.

The display device 10 may include a display panel 100, a display driving circuit 200, and a circuit board 300.

The display panel 100 may, in plan view, be formed in a rectangular shape having short sides in a first direction DR1 and long sides in a second direction DR2 crossing the first direction DR1. The corner where the short side in the first direction DR1 and the long side in the second direction DR2 meet may be rounded to have a certain curvature or may be right-angled. The planar shape of the display panel 100 is not limited to the rectangular shape, and may be formed in another polygonal shape, a circular shape or an elliptical shape. The display panel 100 may be formed to be flat, but embodiments are not limited thereto. For example, the display panel 100 may include a curved portion formed at left and right end portions and having a constant curvature or a varying curvature. For example, the display panel 100 may be formed flexibly so that it may be curvable, bendable, foldable, or rollable.

A substrate SUB of the display panel 100 may include a main region MA and a sub-region SBA.

The main region MA may include a display area DA that displays an image and a non-display area NDA that is a peripheral area of the display area DA. The display area DA may occupy most of the main region MA. The display area DA may be disposed at the center portion of the main region MA. The non-display area NDA may be disposed adjacent to the display area DA. The non-display area NDA may be an area outside the display area DA. The non-display area NDA may surround the display area DA. The non-display area NDA may be an edge area of the display panel 100.

The sub-region SBA may extend in the second direction DR2 from a side of the main region MA. The length of the sub-region SBA in the second direction DR2 may be less than the length of the main region MA in the second direction DR2. The length of the sub-region SBA in the first direction DR1 may be substantially equal to or less than the length of the main region MA in the first direction DR1. The sub-region SBA may be foldable to be disposed under the display panel 100. For example, the sub-region SBA may overlap the main region MA in a third direction DR3.

The display driving circuit 200 may generate signals and voltages for driving the display panel 100. The display driving circuit 200 may be formed as an integrated circuit (IC) and attached to the sub-region SBA of the display panel 100 by a chip on glass (COG) method, a chip on plastic (COP) method, or an ultrasonic bonding method. In another example, the display driving circuit 200 may be attached onto the circuit board 300 by a chip on film (COF) method.

The circuit board 300 may be attached to an end portion of the sub-region SBA of the display panel 100. Thus, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip on film.

A touch driving circuit 400 may be disposed on the circuit board 300. The touch driving circuit 400 may be formed as an integrated circuit (IC) and attached to the circuit board 300.

The touch driving circuit 400 may be electrically connected to driving electrodes and sensing electrodes of a touch sensing unit TDU. The touch driving circuit 400 applies a touch driving signal to the driving electrodes, and senses a touch sensing signal of each of the touch nodes, for example, a charge change amount of mutual capacitance through the sensing electrodes. The touch driving circuit 400 may determine whether the user's touch occurs, whether the user is proximate, and the like, according to the touch sensing signals of each of the touch nodes. The user's touch means that an object such as a user's finger or pen is in direct contact with the front surface of the display device 10 disposed on the touch sensing unit TDU. The proximity of the user indicates that an object such as a user's finger or a pen is positioned away from the front surface of the display device 10, such as hovering.

As shown in FIG. 2, the display panel 100 may include a substrate SUB, a thin film transistor layer TFTL, a light emitting element layer EML, an encapsulation layer TFEL, and the touch sensing unit TDU.

The substrate SUB may be formed of an insulating material such as polymer resin. For example, the substrate SUB may be formed of polyimide. The substrate SUB may be a flexible substrate which is bendable, foldable, or rollable.

The thin film transistor layer TFTL may be disposed on the substrate SUB. The thin film transistor layer TFTL may be arranged in the main region MA and the sub-region SBA. The thin film transistor layer TFTL may include thin film transistors.

The light emitting element layer EML may be disposed on the thin film transistor layer TFTL. The light emitting element layer EML may be arranged in the display area DA of the main region MA. The light emitting element layer EML may include light emitting elements arranged in emission portions.

The encapsulation layer TFEL may be disposed on the light emitting element layer EML. The encapsulation layer TFEL may be arranged in the display area DA and the non-display area NDA of the main region MA. The encapsulation layer TFEL may include at least one inorganic layer and at least one organic layer for encapsulating the light emitting element layer.

The touch sensing unit TDU may be disposed on the encapsulation layer TFEL. The touch sensing unit TDU may be disposed in the display area DA and the non-display area NDA of the main region MA. The touch sensing unit TDU may sense a touch of a person or an object using touch electrodes.

The polarizing plate POL may be disposed on the touch sensing unit TDU of the display panel 100. The polarizing plate POL may be a structure for preventing a decrease in visibility of the image displayed by the display panel 100 due to external light reflected from the display panel 100. The polarizing plate POL may be attached onto the display panel 100 by a transparent adhesive member TAM such as an optically clear adhesive (OCA) film or an optically clear resin (OCR).

Figure 9:
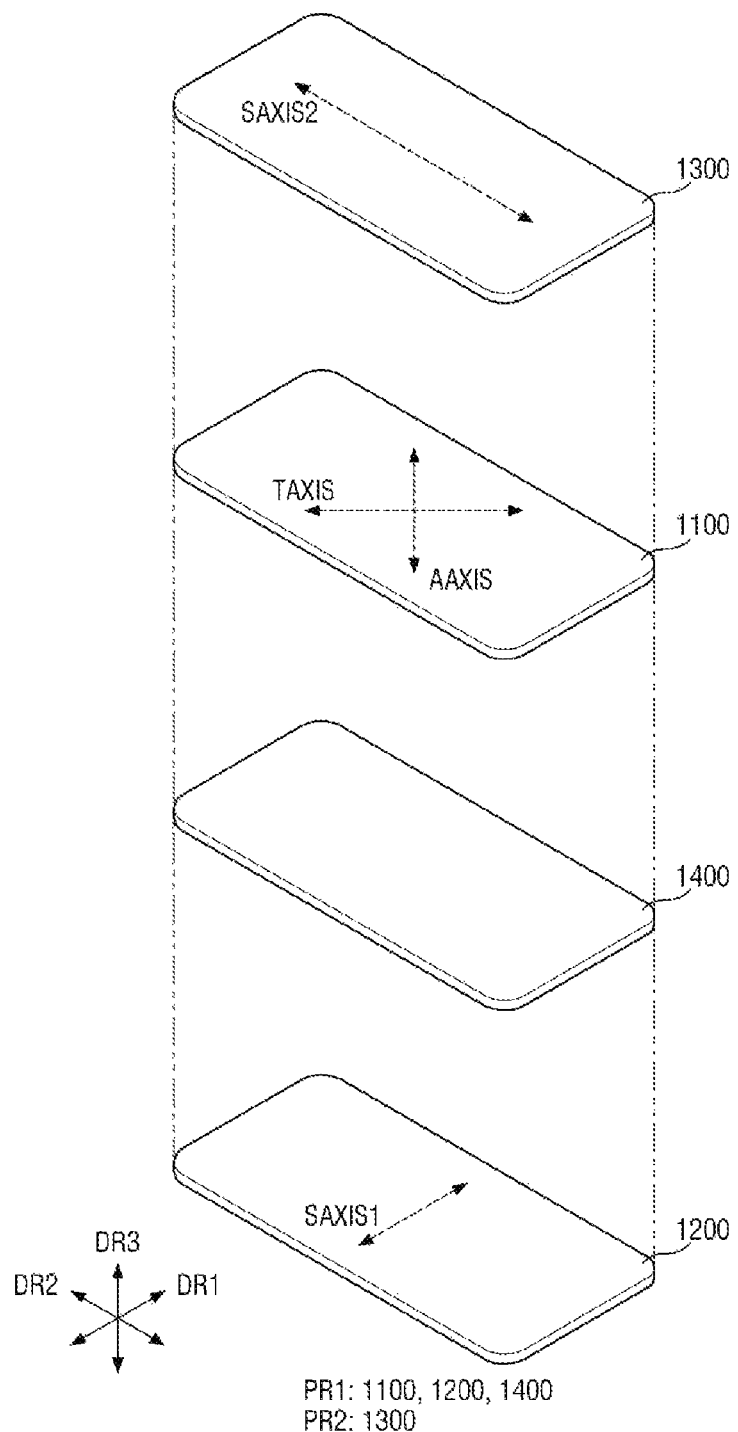
FIG. 9 is an exploded schematic perspective view illustrating a polarizing plate according to an embodiment.

The polarizing plate POL may include a surface treatment layer such as a hard coating layer disposed on an uppermost layer. For example, as shown in FIG. 9, the polarizing plate POL may further include the surface treatment layer disposed on a second retardation layer 1300 that is the uppermost layer.

A cover window CW may be disposed on the polarizing plate POL to protect the upper portion of the display panel 100. The cover window CW may be attached onto the polarizing plate POL by a transparent adhesive member TAM such as an OCA film or an OCR. The cover window CW may be made of an inorganic material such as glass, or an organic material such as plastic or a polymer material. The cover window CW may be omitted.

Figure 3:
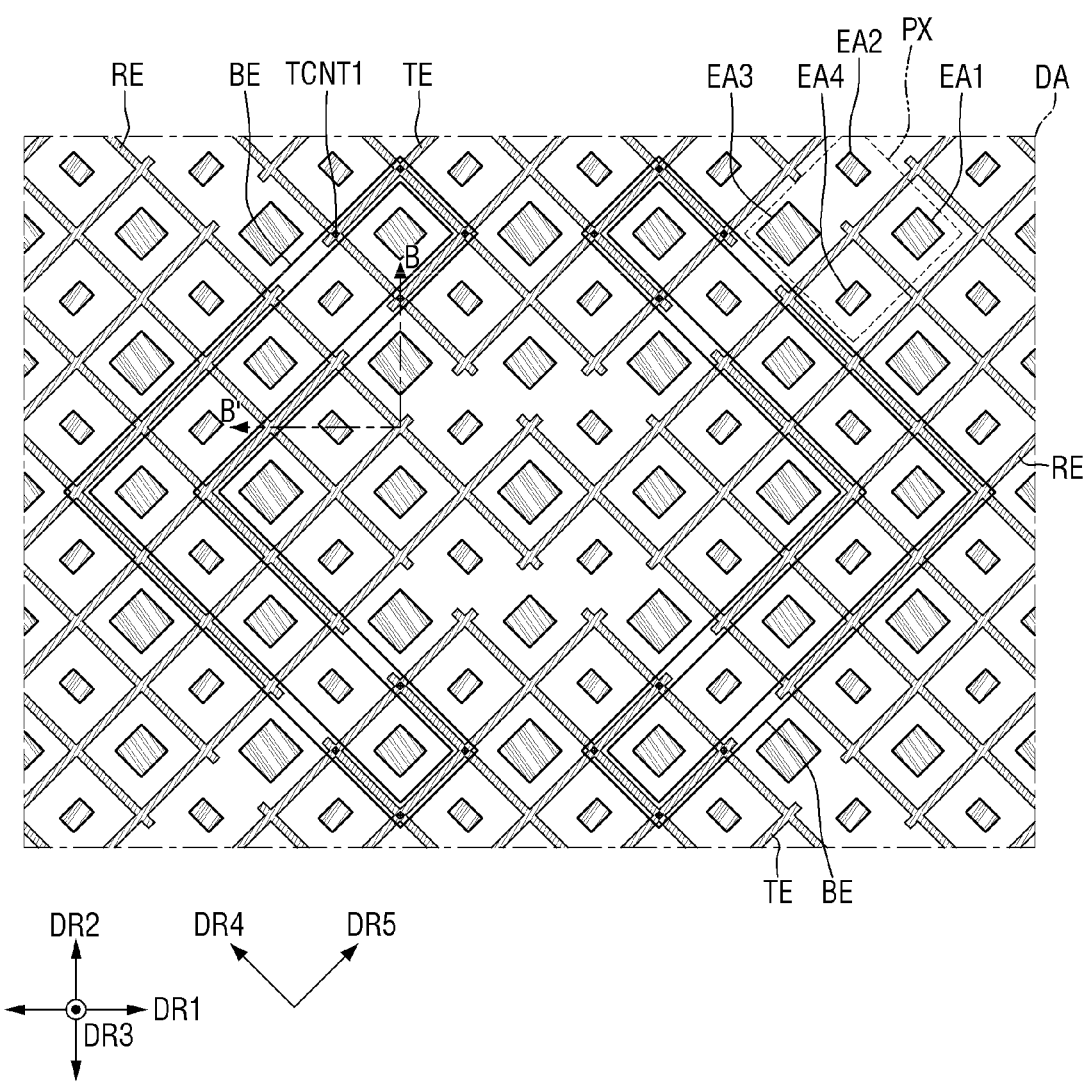
FIG. 3 is a schematic layout view illustrating a display area of a display panel according to an embodiment.

FIG. 3 is a schematic layout view illustrating a display area of a display panel according to an embodiment. FIG. 3 shows emission portions EA1, EA2, EA3, and EA4 of the light emitting element layer EML and touch electrodes TE and RE of the touch sensing unit TDU. FIG. 3 shows an example of a touch node that is an intersection of driving electrodes TE and sensing electrodes RE among the touch electrodes TE and RE.

The display area DA of the display panel 100 may include pixels PX. Each of the pixels PX may include a first emission portion EA1 of a first sub-pixel emitting light of a first color, a second emission portion EA2 of a second sub-pixel emitting light of a second color, a third emission portion EA3 of a third sub-pixel emitting light of a third color, and a fourth emission portion EA4 of a fourth sub-pixel emitting light of the second color. For example, the first color light may be red wavelength light, the second color light may be green wavelength light, and the third color light may be blue wavelength light. The red wavelength light may be defined as light having a wavelength of about 650 nm, the green wavelength light may be defined as light having a wavelength of about 550 nm, and the blue wavelength light may be defined as light having a wavelength of about 450 nm, but embodiments are not limited thereto.

The first emission portion EA1 and the second emission portion EA2 of each of the pixels PX may be adjacent to each other in a fourth direction DR4, and the third emission portion EA3 and the fourth emission portion EA4 may be adjacent to each other in the fourth direction DR4. The first emission portion EA1 and the fourth emission portion EA4 of each of the pixels PX may be adjacent to each other in a fifth direction DR5, and the second emission portion EA2 and the third emission portion EA3 may be adjacent to each other in the fifth direction DR5.

Figure 5:
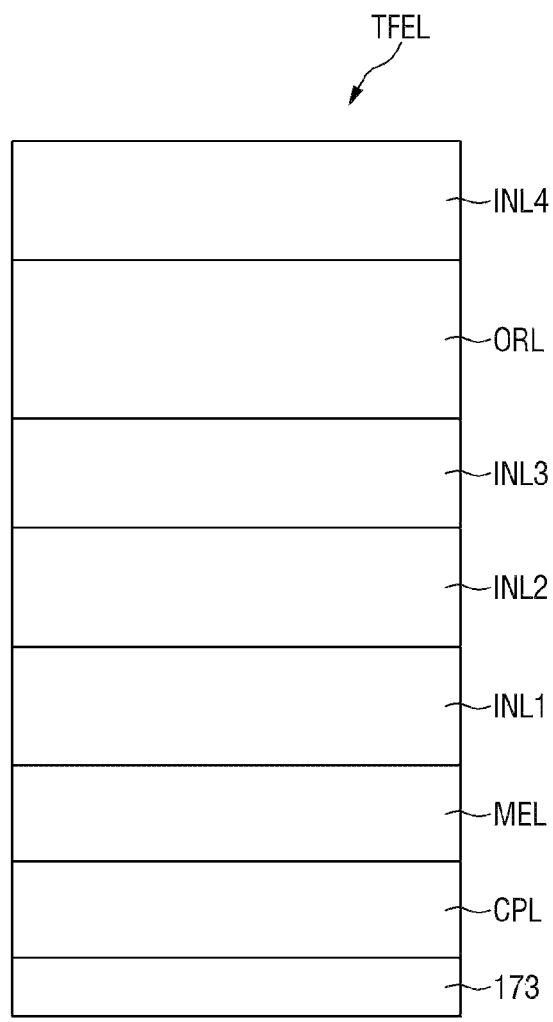
FIG. 5 is a schematic cross-sectional view showing an example of the encapsulation layer of FIG. 4.

Each of the first emission portion EA1, the second emission portion EA2, the third emission portion EA3, and the fourth emission portion EA4 may have a rhombus shape or a rectangular shape in plan view, but embodiments are not limited thereto. Each of the first emission portion EA1, the second emission portion EA2, the third emission portion EA3, and the fourth emission portion EA4 may have a polygonal shape other than a quadrilateral shape, a circular shape, or an elliptical shape in plan view. Further, FIG. 5 illustrates that the third emission portion EA3 has the largest area and the second emission portion EA2 and the fourth emission portion EA4 have the smallest area, but embodiments are not limited thereto.

The second emission portions EA2 and the fourth emission portions EA4 may be arranged in odd rows. The second emission portions EA2 and the fourth emission portions EA4 may be disposed side by side in the first direction DR1 in each of the odd rows. The second emission portions EA2 and the fourth emission portions EA4 may be arranged alternately in the odd rows. Each of the second emission portions EA2 may have a short side in the fourth direction DR4 and a long side in the fifth direction DR5, whereas each of the fourth emission portions EA4 may have a long side in the fourth direction DR4 and a short side in the fifth direction DR5. The fourth direction DR4, which is the direction between the first direction DR1 and the second direction DR2, may be inclined by 45 degrees with respect to the first direction DR1. The fifth direction DR5 may a direction orthogonal to the fourth direction DR4.

The first emission portions EA1 and the third emission portions EA3 may be arranged in even rows. The first emission portions EA1 and the third emission portions EA3 may be arranged side by side in the first direction DR1 in each of the even rows. The first emission portions EA1 and the third emission portions EA3 may be arranged alternately in each of the even rows.

The second emission portions EA2 and the fourth emission portions EA4 may be arranged in odd columns. The second emission portions EA2 and the fourth emission portions EA4 may be disposed side by side in the second direction DR2 in each of the odd columns. The second emission portions EA2 and the fourth emission portions EA4 may be arranged alternately in each of the odd columns.

The first emission portions EA1 and the third emission portions EA3 may be arranged in even columns. The first emission portions EA1 and the third emission portions EA3 may be arranged side by side in the second direction DR2 in each of the even columns. The first emission portions EA1 and the third emission portions EA3 may be arranged alternately in each of the even columns.

The touch sensing unit TDU may include the touch electrodes TE and RE having the driving electrodes TE and the sensing electrodes RE. The driving electrodes TE and the sensing electrodes RE may be arranged on the same layer and may be spaced apart from each other. For example, a gap may be formed between the driving electrode TE and the sensing electrode RE adjacent to each other.

Connection electrodes BE may be arranged on a different layer from the driving electrodes TE and the sensing electrodes RE. The connection electrode BE may be formed in such a way of being bent at least once. The connection electrode BE may overlap the driving electrodes TE adjacent in the second direction DR2 in the third direction DR3 that is the thickness direction of the substrate SUB. The connection electrode BE may overlap the sensing electrode RE in the third direction DR3. A side of the connection electrode BE may be connected to any one driving electrode TE among the driving electrodes TE adjacent in the second direction DR2 through touch contact holes TCNT1. Another side of the connection electrode BE may be connected to another driving electrode TE among the driving electrodes TE adjacent in the second direction DR2 through the touch contact holes TCNT1.

Due to the connection electrodes BE, the driving electrodes TE and the sensing electrodes RE may be electrically separated at the intersections thereof. Accordingly, the mutual capacitance may be generated between the driving electrodes TE and the sensing electrodes RE.

Each of the driving electrodes TE, the sensing electrodes RE, and the connection electrodes BE may have a shape of a mesh or a net in plan view. Accordingly, each of the driving electrodes TE, the sensing electrodes RE, and the connection electrodes BE may not overlap emission portions EA1, EA2, EA3, and EA4 of each of pixels PX. Therefore, the light emitted from the emission portions EA1, EA2, EA3, and EA4 may be blocked by the driving electrodes TE, the sensing electrodes RE, and the connection electrodes BE, thereby preventing a decrease in the luminance of the light.

Figure 4:
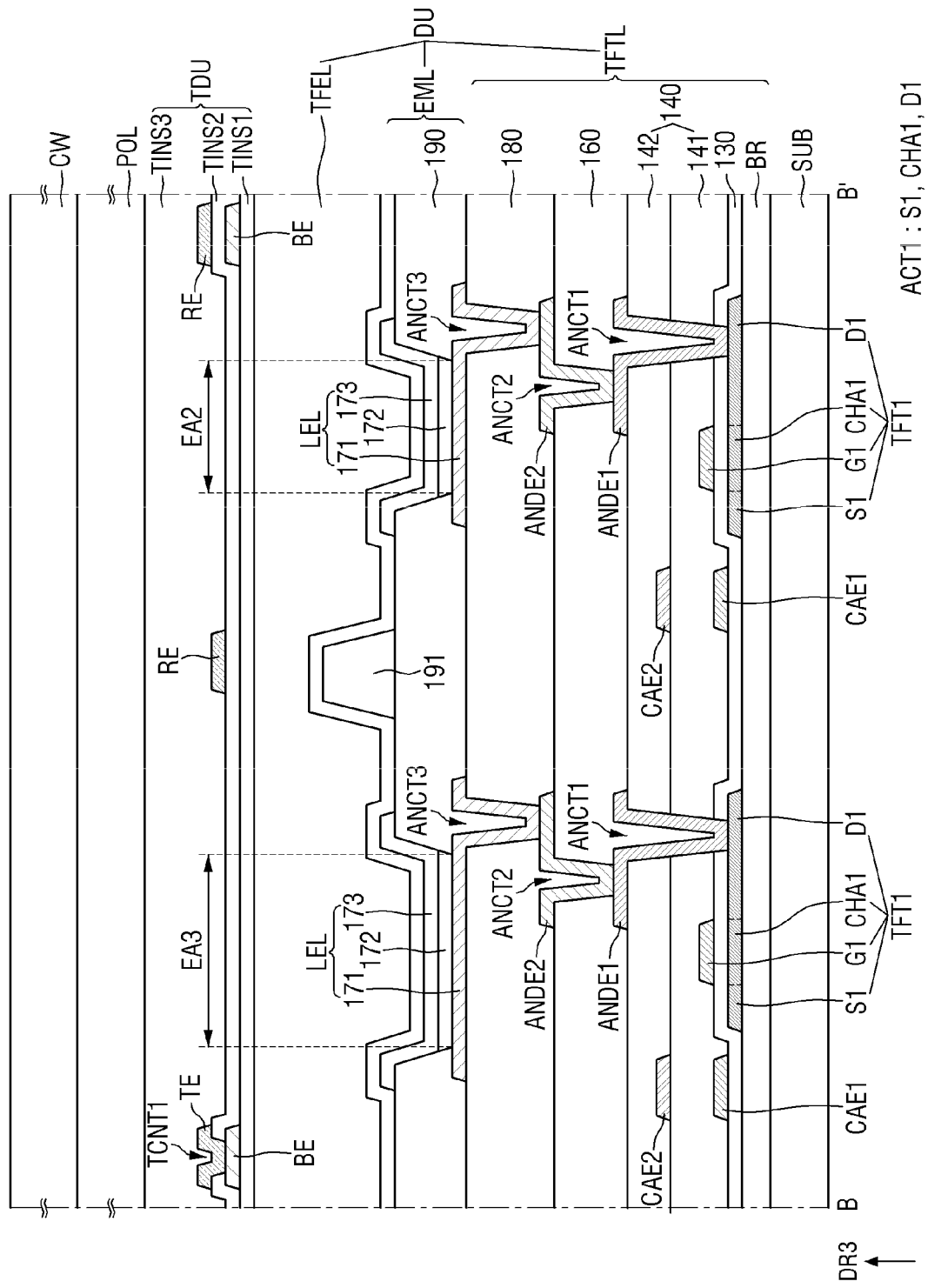
FIG. 4 is a schematic cross-sectional view illustrating an example of a display panel taken along line B-B' of FIG. 3.

FIG. 4 is a schematic cross-sectional view illustrating an example of a display panel 100 taken along line B-B' of FIG. 3.

Referring to FIG. 4, the display panel 100 may include the substrate SUB, a display unit DU, the touch sensing unit TDU, the polarizing plate POL, and the cover window CW. For example, the display unit DU may include the thin film transistor layer TFTL, the light emitting element layer EML, and the encapsulation layer TFEL. Referring to FIG. 4, a barrier layer BR may be disposed on the substrate SUB. The substrate SUB may be formed of an insulating material such as polymer resin. For example, the substrate SUB may be formed of polyimide. The substrate SUB may be a flexible substrate which can be bent, folded or rolled.

The barrier layer BR may be a layer for protecting transistors of the thin film transistor layer TFTL and a light emitting layer 172 of the light emitting element layer EML from moisture permeating through the substrate SUB which is susceptible to moisture permeation. The barrier layer BR may be formed as inorganic layers that are alternately stacked. For example, the barrier layer BR may be formed of multiple layers in which one or more inorganic layers of a silicon nitride layer, a silicon oxynitride layer, a silicon oxide layer, a titanium oxide layer and an aluminum oxide layer are alternately stacked.

A first thin film transistor TFT1 may be disposed on the barrier layer BR. The first thin film transistor TFT1 may include a first active layer ACT1 and a first gate electrode G1.

The first active layer ACT1 of the first thin film transistor TFT1 may be disposed on the barrier layer BR. The first active layer ACT1 of the first thin film transistor TFT1 may include polycrystalline silicon, monocrystalline silicon, low-temperature polycrystalline silicon, amorphous silicon, or an oxide semiconductor.

The first active layer ACT1 may include a first channel region CHA1, a first source region S1, and a first drain region D1. The first channel region CHA1 may be a region overlapping the first gate electrode G1 in the third direction DR3 that is the thickness direction of the substrate SUB. The first source region S1 may be disposed on a side of the first channel region CHA1, and the first drain region D1 may be disposed on another side of the first channel region CHA1. The first source region S1 and the first drain region D1 may be regions that do not overlap the first gate electrode G1 in the third direction DR3. The first source region S1 and the first drain region D1 may be regions having conductivity by doping a silicon semiconductor or an oxide semiconductor with ions or impurities.

A first gate insulating layer 130 may be disposed on the first active layer ACT1 of the first thin film transistor TFT1. The first gate insulating layer 130 may be formed of an inorganic layer, for example, a silicon nitride layer, a silicon oxynitride layer, a silicon oxide layer, a titanium oxide layer, or an aluminum oxide layer.

The first gate electrode G1 of the first thin film transistor TFT1 and a first capacitor electrode CAE1 may be disposed on the first gate insulating layer 130. The first gate electrode G1 may overlap the first active layer ACT1 in the third direction DR3. FIG. 4 illustrates that the first gate electrode G1 and the first capacitor electrode CAE1 are spaced apart from each other, but the first gate electrode G1 and the first capacitor electrode CAE1 may be connected to each other. The first gate electrode G1 and the first capacitor electrode CAE1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A first interlayer insulating layer 141 may be disposed on the first gate electrode G1 of the first thin film transistor TFT1 and the first capacitor electrode CAEL. The first interlayer insulating layer 141 may be formed of an inorganic layer, for example, a silicon nitride layer, a silicon oxynitride layer, a silicon oxide layer, a titanium oxide layer, or an aluminum oxide layer. The first interlayer insulating layer 141 may be formed of inorganic layers.

The second capacitor electrode CAE2 may be disposed on the first interlayer insulating layer 141. The second capacitor electrode CAE2 may overlap the first capacitor electrode CAE1 in the third direction DR3. In case that the first capacitor electrode CAE1 is connected to the first gate electrode G1, the second capacitor electrode CAE2 may overlap the first gate electrode G1 in the third direction DR3. Since the first interlayer insulating layer 141 has a certain dielectric constant, a capacitor may be formed by the first capacitor electrode CAE1, the second capacitor electrode CAE2, and the first interlayer insulating layer 141 disposed therebetween. The second capacitor electrode CAE2 may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

A second interlayer insulating layer 142 may be disposed on the second capacitor electrode CAE2. The second interlayer insulating layer 142 may be formed of an inorganic layer, for example, a silicon nitride layer, a silicon oxynitride layer, a silicon oxide layer, a titanium oxide layer, or an aluminum oxide layer. The second interlayer insulating layer 142 may be formed of inorganic layers.

The first anode connection electrode ANDE1 may be disposed on the second interlayer insulating layer 142. The first anode connection electrode ANDE1 may be connected to a first drain region D1 of the first thin film transistor TFT1 through a first connection contact hole ANCT1 penetrating (or passing through) the first gate insulating layer 130, the first interlayer insulating layer 141, and the second interlayer insulating layer 142. The first anode connection electrode ANDE1 may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

A first planarization layer 160 for flattening a stepped portion formed by the first thin film transistor TFT1 may be disposed on the first anode connection electrode ANDE1. The first planarization layer 160 may be formed of an organic layer such as acryl resin, epoxy resin, phenolic resin, polyamide resin, polyimide resin and the like.

A second anode connection electrode ANDE2 may be disposed on the first planarization layer 160. The second anode connection electrode ANDE2 may be connected to the first anode connection electrode ANDE1 through a second connection contact hole ANCT2 penetrating (or passing through) the first planarization layer 160. The second anode connection electrode ANDE2 may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

The second planarization layer 180 may be disposed on the second anode connection electrode ANDE2. The second planarization layer 180 may be formed of an organic layer such as acryl resin, epoxy resin, phenolic resin, polyamide resin, polyimide resin and the like.

Light emitting elements LEL and a bank 190 may be disposed on the second planarization layer 180. Each of the light emitting elements LEL may include a pixel electrode 171, a light emitting layer 172, and a common electrode 173.

The pixel electrode 171 may be disposed on the second planarization layer 180. The pixel electrode 171 may be connected to a second anode connection electrode ANDE2 through a third connection contact hole ANCT3 penetrating (or passing through) the second planarization layer 180.

In a top emission structure in which light is emitted toward the common electrode 173 when viewed with respect to the light emitting layer 172, the pixel electrode 171 may be formed of a metal material having high reflectivity to have a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy may be an alloy of silver (Ag), palladium (Pd) and copper (Cu).

The bank 190 may be formed to partition (or define) the pixel electrode 171 on the second planarization layer 180 in order to define the first emission portion EA1, the second emission portion EA2, the third emission portion EA3, and the fourth emission portion EA4. The bank 190 may cover the edge portion of the pixel electrode 171. The bank 190 may be formed of an organic layer such as acryl resin, epoxy resin, phenolic resin, polyamide resin, polyimide resin and the like.

Each of the first emission portion EA1, the second emission portion EA2, the third emission portion EA3, and the fourth emission portion EA4 may be an area in which the pixel electrode 171, the light emitting layer 172, and the common electrode 173 are sequentially stacked, and holes from the pixel electrode 171 and electrons from the common electrode 173 are recombined in the light emitting layer 172 to emit light.

The light emitting layer 172 may be disposed on the pixel electrode 171 and the bank 190. The light emitting layer 172 may include an organic material to emit light in a certain color. For example, the light emitting layer 172 may include a hole transporting layer, an organic material layer, and an electron transporting layer.

The common electrode 173 may be disposed on the light emitting layer 172. The common electrode 173 may cover the light emitting layer 172. The common electrode 173 may be a common layer that is commonly formed at the first emission portion EA1, the second emission portion EA2, the third emission portion EA3, and the fourth emission portion EA4. A capping layer CPL may be formed on the common electrode 173.

In the top emission structure, the common electrode 173 may be formed of a transparent conductive material (TCO) such as ITO or IZO capable of transmitting light or a semi-transmissive conductive material such as magnesium (Mg), silver (Ag), or an alloy of magnesium (Mg) and silver (Ag). In case that the common electrode 173 is formed of a semi-transmissive conductive material, the light emission efficiency may be improved due to a micro-cavity effect.

A spacer 191 may be disposed on the bank 190. The spacer 191 may function to support a mask during the fabricating process of fabricating the light emitting layer 172. The spacer 191 may be formed of an organic layer such as acryl resin, epoxy resin, phenolic resin, polyamide resin, polyimide resin and the like.

The encapsulation layer TFEL may be disposed on the capping layer CPL, which is disposed on the common electrode 173. The encapsulation layer TFEL may include at least one inorganic layer to prevent oxygen or moisture from permeating into the light emitting layer 172 of the light emitting element layer EML. For example, the encapsulation layer TFEL may include at least one organic layer to protect the light emitting element layer EML from foreign substances such as dust. The encapsulation layer TFEL may include an inorganic layer and an organic layer according to various embodiments, and the description of the encapsulation layer TFEL will be described later in conjunction with FIGS. 5 to 8.

The touch sensing unit TDU may be disposed on the encapsulation layer TFEL. The touch sensing unit TDU may include a first touch insulating layer TINS1, the connection electrode BE, a second touch insulating layer TINS2, the driving electrode TE, the sensing electrode RE, and a third touch insulating layer TINS3.

The first touch insulating layer TINS1 may be formed of an inorganic layer, for example, a silicon nitride layer, a silicon oxynitride layer, a silicon oxide layer, a titanium oxide layer, or an aluminum oxide layer.

The connection electrode BE may be disposed on the first touch insulating layer TINS1. The connection electrode BE may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

The second touch insulating layer TINS2 may be disposed on the connection electrode BE. The second touch insulating layer TINS2 may be formed of an inorganic layer, for example, a silicon nitride layer, a silicon oxynitride layer, a silicon oxide layer, a titanium oxide layer, or an aluminum oxide layer. In another example, the second touch insulating layer TINS2 may be formed of an organic layer such as acryl resin, epoxy resin, phenolic resin, polyamide resin, polyimide resin and the like.

The driving electrodes TE and the sensing electrodes RE may be disposed on the second touch insulating layer TINS2. Further, dummy pattern layers, first touch driving lines, second touch driving lines, and touch sensing lines may be arranged on the second touch insulating layer TINS2. The driving electrodes TE and the sensing electrodes RE may be formed as a single layer or multiple layers made of any one of molybdenum (Mo), aluminum (Al), chromium (Cr), gold (Au), titanium (Ti), nickel (Ni), neodymium (Nd) and copper (Cu), or an alloy thereof.

The driving electrode TE and the sensing electrode RE may overlap the connection electrode BE in the third direction DR3. The driving electrode TE may be connected to the connection electrode BE through a touch contact hole TCNT1 penetrating (or passing through) the first touch insulating layer TINS1.

The third touch insulating layer TINS3 may be formed on the driving electrodes TE and the sensing electrodes RE. The third touch insulating layer TINS3 may function to flatten the stepped portion formed by the driving electrodes TE, the sensing electrodes RE, and the connection electrodes BE. The third touch insulating layer TINS3 may be formed of an organic layer such as acryl resin, epoxy resin, phenolic resin, polyamide resin, polyimide resin and the like.

FIG. 5 is a schematic cross-sectional view showing an example of the common electrode, the capping layer, the intermediate layer, and the encapsulation layer of FIG. 4.

Referring to FIG. 5, the capping layer CPL may be disposed on the common electrode 173. The capping layer CPL may include an inorganic insulating material of at least one of aluminum oxide, titanium oxide, tantalum oxide, hafnium oxide, zinc oxide, silicon oxide, silicon nitride, or silicon oxynitride.

The intermediate layer MEL may be disposed on the capping layer CPL. The intermediate layer MEL may include lithium fluoride (LiF).

The encapsulation layer TFEL may be disposed on the intermediate layer MEL. The encapsulation layer TFEL may include a first encapsulation inorganic layer INL1, a second encapsulation inorganic layer INL2, a third encapsulation inorganic layer INL3, an encapsulation organic layer ORL, and a fourth encapsulation inorganic layer INL4.

The first encapsulation inorganic layer INL1 may be disposed on the intermediate layer MEL, the second encapsulation inorganic layer INL2 may be disposed on the first encapsulation inorganic layer INL1, and the third encapsulation inorganic layer INL3 may be disposed on the second encapsulation inorganic layer INL2. Further, the encapsulation organic layer ORL may be disposed on the third encapsulation inorganic layer INL3, and the fourth encapsulation inorganic layer INL4 may be disposed on the encapsulation organic layer ORL.

The first encapsulation inorganic layer INL1, the second encapsulation inorganic layer INL2, the third encapsulation inorganic layer INL3, and the fourth encapsulation inorganic layer INL4 may include an inorganic insulating material of at least one of aluminum oxide, titanium oxide, tantalum oxide, hafnium oxide, zinc oxide, silicon oxide, silicon nitride, or silicon oxynitride. For example, the first encapsulation inorganic layer INL1 and the fourth encapsulation inorganic layer INL4 may be silicon nitride ($SiN_x$), and the second encapsulation inorganic layer INL2 may be silicon oxynitride ($SiO_xN_y$).

The organic layer ORL may include a monomer. The organic layer ORL may be formed by applying a monomer and curing the monomer by using heat or ultraviolet rays.

For example, the refractive index of the capping layer CPL may be about 2.0, and the refractive index of the intermediate layer MEL may be about 1.4. The refractive index of the first encapsulation inorganic layer INL1 may be about 1.89, the refractive index of the second encapsulation inorganic layer INL2 may be about 1.62, and the refractive index of the third encapsulation inorganic layer INL3 may be about 1.57. The refractive index of the encapsulation organic layer ORL may be about 1.51, and the refractive index of the fourth encapsulation inorganic layer INL4 may be about 1.89.

Figure 6:
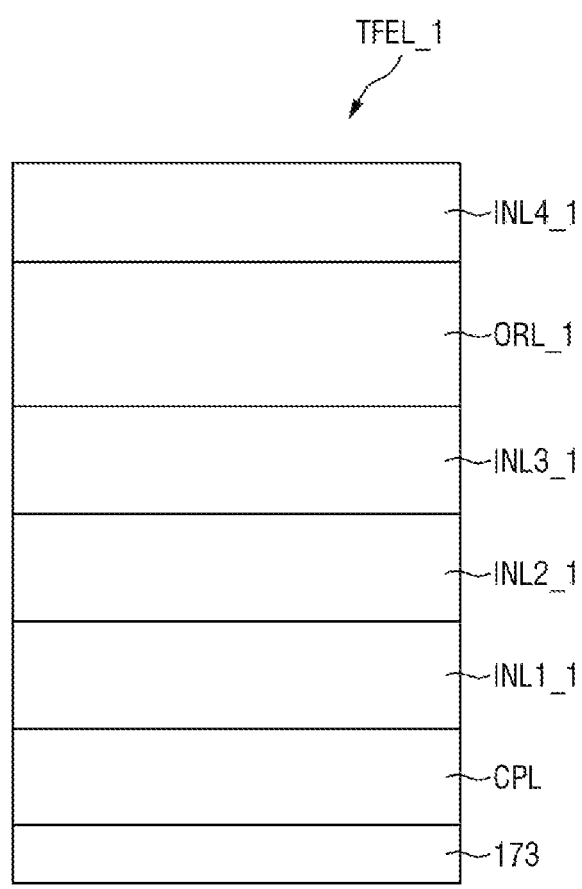
FIG. 6 is a schematic cross-sectional view showing another example of the encapsulation layer of FIG. 4.

FIG. 6 is a schematic cross-sectional view showing another example of the encapsulation layer of FIG. 4.

Referring to FIG. 6, an encapsulation layer TFEL_1 may be disposed on the capping layer CPL. The encapsulation layer TFEL_1 may include a first encapsulation inorganic layer INL1_1, a second encapsulation inorganic layer INL2_1, a third encapsulation inorganic layer INL3_1, an encapsulation organic layer ORL_1, and a fourth encapsulation inorganic layer INL4_1.

The first encapsulation inorganic layer INL1_1 may be disposed on the capping layer CPL, the second encapsulation inorganic layer INL2_1 may be disposed on the first encapsulation inorganic layer INL1_1, and the third encapsulation inorganic layer INL3_1 may be disposed on the second encapsulation inorganic layer INL2_1. Further, the encapsulation organic layer ORL_1 may be disposed on the third encapsulation inorganic layer INL3_1, and the fourth encapsulation inorganic layer INL4_1 may be disposed on the encapsulation organic layer ORL_1.

The first encapsulation inorganic layer INL1_1, the second encapsulation inorganic layer INL2_1, the third encapsulation inorganic layer INL3_1, and the fourth encapsulation inorganic layer INL4_1 may include an inorganic insulating material of at least one of aluminum oxide, titanium oxide, tantalum oxide, hafnium oxide, zinc oxide, silicon oxide, silicon nitride, or silicon oxynitride. For example, the first encapsulation inorganic layer INL1_1 may be silicon oxide ($SiO_x$) or silicon oxynitride ($SiO_xN_y$), and the fourth encapsulation inorganic layer INL4_1 may be silicon oxynitride ($SiO_xN_y$).

The organic layer ORL_1 may include a monomer. The organic layer ORL_1 may be formed by applying a monomer and then curing the monomer by using heat or ultraviolet rays.

For example, the refractive index of the capping layer CPL may be about 2.0, and the refractive index of the first encapsulation inorganic layer INL1_1 may be smaller than about 1.52. The refractive index of the second encapsulation inorganic layer INL2_1 may be about 1.77 or about 1.89, and the refractive index of the third encapsulation inorganic layer INL3_1 may be about 1.62 or about 1.70. The refractive index of the encapsulation organic layer ORL_1 may be about 1.51, and the refractive index of the fourth encapsulation inorganic layer INL4_1 may be about 1.62.

Figure 7:
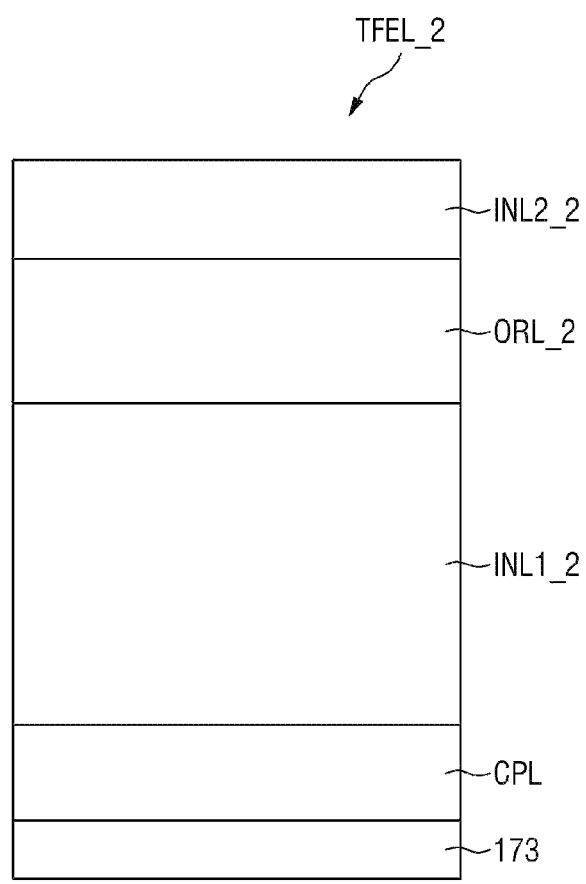
FIG. 7 is a schematic cross-sectional view showing still another example of the encapsulation layer of FIG. 4.

FIG. 7 is a schematic cross-sectional view showing still another example of the encapsulation layer of FIG. 4.

Referring to FIG. 7, an encapsulation layer TFEL_2 may be disposed on the capping layer CPL. The encapsulation layer TFEL_2 may include a first encapsulation inorganic layer INL1_2, an encapsulation organic layer ORL_2, and a second encapsulation inorganic layer INL2_2.

The first encapsulation inorganic layer INL1_2 may be disposed on the capping layer CPL, the encapsulation organic layer ORL_2 may be disposed on the first encapsulation inorganic layer INL1_2, and the second encapsulation inorganic layer INL2_2 may be disposed on the encapsulation organic layer ORL_2.

The first encapsulation inorganic layer INL1_2 and the second encapsulation inorganic layer INL2_2 may include an inorganic insulating material of at least one of aluminum oxide, titanium oxide, tantalum oxide, hafnium oxide, zinc oxide, silicon oxide, silicon nitride, or silicon oxynitride. For example, the first encapsulation inorganic layer INL1_2 may be silicon oxynitride ($SiO_xN_y$), and the second encapsulation inorganic layer INL2_2 may be silicon nitride ($SiN_x$). The thickness of the first encapsulation inorganic layer INL1_2 may be greater than the thickness of the second encapsulation inorganic layer INL2_2. For example, the first encapsulation inorganic layer INL1_2 may have a thickness of about 10,000 Å.

The organic layer ORL_2 may include a monomer. The organic layer ORL_2 may be formed by applying a monomer and then curing the monomer by using heat or ultraviolet rays.

For example, the refractive index of the capping layer CPL may be about 2.0, and the refractive index of the first encapsulation inorganic layer INL1_2 may be smaller than about 1.52. The refractive index of the second encapsulation inorganic layer INL2_2 may be about 1.77 or about 1.89, and the refractive index of the third encapsulation inorganic layer INL3_2 may be about 1.62 or about 1.70. The refractive index of the encapsulation organic layer ORL_2 may be about 1.51, and the refractive index of the fourth encapsulation inorganic layer INL4_2 may be about 1.62.

Figure 8:
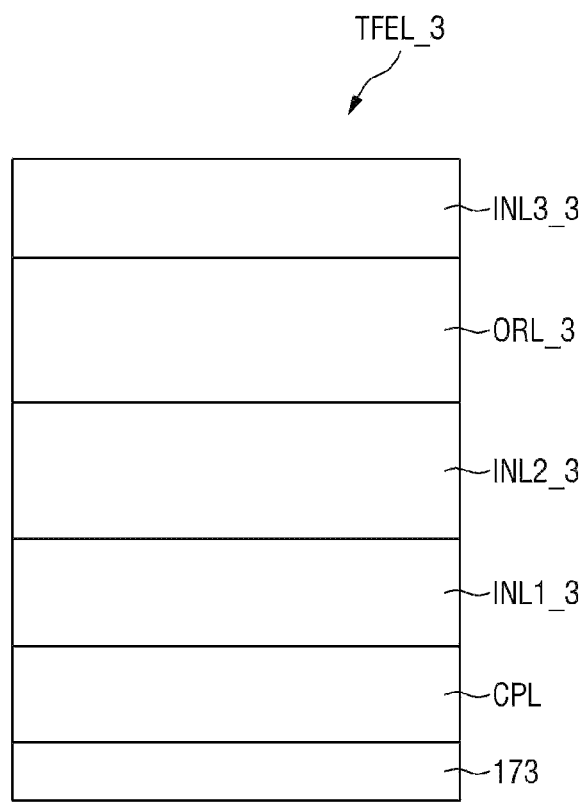
FIG. 8 is a schematic cross-sectional view showing still another example of the encapsulation layer of FIG. 4.

FIG. 8 is a schematic cross-sectional view showing still another example of the encapsulation layer of FIG. 4.

Referring to FIG. 8, an encapsulation layer TFEL_3 may be disposed on the capping layer CPL. The encapsulation layer TFEL_3 may include a first encapsulation inorganic layer INL1_3, a second encapsulation inorganic layer INL2_3, an encapsulation organic layer ORL_3, and a third encapsulation inorganic layer INL3_3.

The first encapsulation inorganic layer INL1_3 may be disposed on the capping layer CPL, and the second encapsulation inorganic layer INL2_3 may be disposed on the first encapsulation inorganic layer INL1_3. Further, the encapsulation organic layer ORL_3 may be disposed on the second encapsulation inorganic layer INL2_3, and the third encapsulation inorganic layer INL3_3 may be disposed on the encapsulation organic layer ORL_3.

The first encapsulation inorganic layer INL1_3, the second encapsulation inorganic layer INL2_3, and the third encapsulation inorganic layer INL3_3 may include an inorganic insulating material of at least one of aluminum oxide, titanium oxide, tantalum oxide, hafnium oxide, zinc oxide, silicon oxide, silicon nitride, or silicon oxynitride. For example, the first encapsulation inorganic layer INL1_3 and the second encapsulation inorganic layer INL2_3 may be silicon oxynitride ($SiO_xN_y$), and the third encapsulation inorganic layer INL3_3 may be silicon nitride ($SiN_x$).

The organic layer ORL_3 may include a monomer. The organic layer ORL_3 may be formed by applying a monomer and then curing the monomer by using heat or ultraviolet rays.

For example, the refractive index of the capping layer CPL may be about 2.0, and the refractive index of the first encapsulation inorganic layer INL1_3 may be about 1.77. The refractive index of the second encapsulation inorganic layer INL2_3 may be about 1.62, the refractive index of the encapsulation organic layer ORL_3 may be about 1.51, and the refractive index of the third encapsulation inorganic layer INL3_3 may be about 1.89.

FIG. 9 is an exploded schematic perspective view illustrating a polarizing plate POL according to an embodiment.

Referring to FIG. 9, the polarizing plate POL may include a first part PR1 and a second part PR2. The first part PR1 may function as an anti-reflection part to prevent a decrease in visibility of the image of the display panel 100 due to external light. The second part PR2 may include a sunglasses free retarder for increasing visibility of the image of the display panel 100 for a viewer wearing polarized sunglasses.

The first part PR1 may include a polarizer 1100, a first retardation layer 1200, and a protective film 1400. The second part PR2 may include the second retardation layer 1300.

In order to function the first part PR1 as the anti-reflection part, the in-plane retardation value $R_o$ of the first part PR1 including the polarizer 1100, the first retardation layer 1200, and the protective film 1400 at a wavelength of about 550 nm may be about 100 nm to about 180 nm. Further, the value of Ro(450)/Ro(550) of the first part PR1 may be smaller than or equal to about 1.00. The Ro(450) may be the in-plane retardation value of the first part PR1 at a wavelength of about 450 nm, and the Ro(550) may be the in-plane retardation value of the first part PR1 at a wavelength of about 550 nm.

The polarizer 1100 may function to polarize incident light into light in the same direction as a transmission axis TAXIS. FIG. 9 illustrates that an absorption axis AAXIS of the polarizer 1100 is inclined by about 45° with respect to the first direction DR1, and the transmission axis TAXIS of the polarizer 1100 is inclined by about 1350 with respect to the first direction DR1, but embodiments are not limited thereto. The transmission axis TAXIS and the absorption axis AAXIS of the polarizer 1100 may intersect each other. The angle between the transmission axis TAXIS and the absorption axis AAXIS of the polarizer 1100 may be about 90°.

The polarizer 1100 may be a polyvinyl alcohol (PVA) resin film including a polarizer or a dichroic dye.

The polyvinyl alcohol resin may be obtained by saponifying a polyvinyl acetate-based resin. Examples of the polyvinyl acetate-based resin may include polyvinyl acetate that is a homopolymer of vinyl acetate, or a copolymer of vinyl acetate and another monomer that is copolymerizable therewith. Examples of another monomer that is copolymerizable with the vinyl acetate may include an unsaturated carboxylic acid-based monomer, an unsaturated sulfonic acid-based monomer, an olefin-based monomer, a vinyl ether-based monomer, an acrylamide-based monomer having an ammonium group, and the like.

A polyvinyl alcohol-based resin may be modified, and polyvinyl formal or polyvinyl acetal modified with aldehydes may also be used. The degree of saponification of the polyvinyl alcohol-based resin may be about 85 mol % to about 100 mol %, e.g., about 98 mol % or more. The degree of polymerization of the polyvinyl alcohol-based resin may be about 1,000 to about 10,000, e.g., about 1,500 to about 5,000.

The polyvinyl alcohol-based resin may be used as a base film of the polarizer 1100. The thickness of the base film may be about 10 m to about 150 m.

The dichroic dye may be iodine molecules or dye molecules.

The polarizer 1100 may be fabricated by a process of continuously uniaxially stretching a polyvinyl alcohol-based film in an aqueous solution, a process of dyeing it with a dichroic dye and adsorbing the dichroic dye, a process of treating it with an aqueous solution of boric acid, a process of washing it with water and drying it, or the like. The polyvinyl alcohol resin film may be stretched in a direction, and may be immersed in an iodine or dichroic dye solution. For example, iodine molecules or dichroic dye molecules may be arranged side by side in the stretching direction. Since iodine molecules and dye molecules exhibit dichroism, light oscillating in the stretching direction may be absorbed, and light oscillating in a direction perpendicular thereto may be transmitted.

The first retardation layer 1200 may be disposed on a surface of the polarizer 1100. For example, the first retardation layer 1200 may be disposed on the bottom surface (or lower surface) of the polarizer 1100.

The first retardation layer 1200 may have a negative wavelength dispersion property, a flat wavelength dispersion property, or a positive wavelength dispersion property. The first retardation layer 1200 may have a negative wavelength dispersion property to reduce color variation.

The first retardation layer 1200 may be varied/modified as long as it is capable of exhibiting anti-reflection performance of light incident from the outside. The first retardation layer 1200 may include a single retardation layer or a plurality of retardation layers.

In case that the first retardation layer 1200 includes a single retardation layer, the single retardation layer may be a quarter-wavelength (λ/4) retardation layer. The quarter-wavelength retardation layer may retard the phase of the component oscillating in a slow axis direction in incident light by ¼ and may emit the retarded incident light. The quarter-wavelength retardation layer may convert light emitted from the display panel 100 into circularly polarized light or elliptically polarized light.

In case that the first retardation layer 1200 includes a plurality of retardation layers, the plurality of retardation layers may include two retardation layers, for example, a half-wavelength (λ/2) retardation layer and a quarter-wavelength (λ/4) retardation layer or two one-third wavelength (λ/3) retardation layers, but embodiments are not limited thereto.

The angle between a retardation axis SAXIS1 of the first retardation layer 1200 and the absorption axis AAXIS of the polarizer 1100 may be about 45°±α. For example, α may be about 0.5°, but embodiments are not limited thereto.

The second retardation layer 1300 may be disposed on another surface (or upper surface) of the polarizer 1100. For example, the second retardation layer 1300 may be disposed on the top surface (or upper surface) of the polarizer 1100.

In this specification, "viewer side" refers to a side adjacent to a user or a viewer in case that the polarizing plate POL is attached to a side of the display panel 100. "Panel side", which is the opposite side of the viewer side, refers to a side adjacent to the display panel 100. Therefore, the top surface (or upper surface) of the polarizer 1100 and the second retardation layer 1300 may be disposed on the viewer side of the polarizing plate POL, and the bottom surface (or lower surface) of the polarizer 1100 and the first retardation layer 1200 may be disposed on the panel side of the polarizing plate POL.

The second retardation layer 1300 may convert linearly polarized light that has passed through the polarizer 1100 into circularly polarized light or elliptically polarized light, so that a viewer may view the image of the display panel 100 regardless of the polarization direction of sunglasses worn by the viewer.

The in-plane retardation value $R_o$ of the second retardation layer 1300 at a wavelength of about 550 nm may be smaller than about 100 nm. For example, the in-plane retardation value $R_o$ of the second retardation layer about 1300 at a wavelength of about 550 nm may be greater than or equal to about 20 nm and smaller than about 100 nm, but embodiments are not limited thereto. For example, in case that the first retardation layer 1200 is a quarter-wavelength retardation layer, the in-plane retardation value $R_o$ at a wavelength of about 550 nm may be about 140 nm and, thus, the in-plane retardation value $R_o$ of the second retardation layer 1300 at a wavelength of about 550 nm may be smaller than the in-plane retardation value $R_o$ of the first retardation layer 1200 at a wavelength of about 550 nm.

The in-plane retardation value $R_o$ of the second retardation layer 1300 may be calculated as in the following Equation (1):

$$R_o = (nx - ny) \times d, \; nx \geq ny \qquad (1)$$

In Equation (1), nx and ny indicate the in-plane refractive indices of a film. In case that x indicates the oscillation direction in which the in-plane refractive index becomes maximum, nx indicates the refractive index of light oscillating in the oscillation direction. Here, nx and ny may be perpendicular to each other. d indicates the thickness of the film.

The wavelength dispersion characteristics of the second retardation layer 1300 may have, for example, negative wavelength dispersion characteristics, flat wavelength dispersion characteristics, and the like without being limited, and have negative wavelength dispersion characteristics in terms of color difference reduction.

The angle between a retardation axis SAXIS2 of the second retardation layer 1300 and the absorption axis AAXIS of the polarizer 1100 may be within a range of about 10° to about 45°. For example, the angle between the retardation axis SAXIS2 of the second retardation layer 1300 and the absorption axis AAXIS of the polarizer 1100 may be implemented within a range of about 15° to about 40°. The angle between the retardation axis SAXIS2 of the second retardation layer 1300 and the absorption axis AAXIS of the polarizer 1100 indicates the angle between the absorption axis AAXIS of the polarizer 1100 and the retardation axis SAXIS2 of the second retardation layer 1300. For example, as shown in FIG. 10B, an angle ($\angle\theta$) between the retardation axis SAXIS2 of the second retardation layer 1300 and the absorption axis AAXIS of the polarizer 1100 indicates an angle ($\angle\theta1$) from the absorption axis AAXIS of the polarizer 1100 to a retardation axis SAXIS2' of the second retardation layer 1300 in a clockwise direction and an angle ($\angle\theta2$) from the absorption axis AAXIS of the polarizer 1100 to a retardation axis SAXIS2" of the second retardation layer 1300 in a counterclockwise direction. Since the retardation axis SAXIS2 of the second retardation layer 1300 and the absorption axis AAXIS of the polarizer 1100 are defined on the plane defined by the first direction DR1 and the second directions DR2, the angle ($\angle\theta$) between the retardation axis SAXIS2 of the second retardation layer 1300 and the absorption axis AAXIS of the polarizer 1100 may also be defined on the plane defined by the first direction DR1 and the second direction DR2.

In the description, the retardation axis indicates an axis in which the refractive index of polarized light becomes maximum in the plane. The retardation axis may also be referred to as a slow axis. Further, in the description, "absorption axis" indicates an axis that absorbs linearly polarized light. The "absorption axis" may be an axis of which orientation is perpendicular to that of the "transmission axis."

As described above, in case that the in-plane retardation value $R_o$ of the second retardation layer 1300 is smaller than about 100 nm, and the angle between the retardation axis SAXIS2 of the second retardation layer 1300 and the absorption axis AAXIS of the polarizer 1100 may be within a range of about 10° to about 45°, it is possible to provide the polarizing plate POL capable of minimizing or preventing occurrence of color variation depending on an azimuth angle in the display device 10.

Further, since the light polarized by the polarizer 1100 is elliptically polarized by passing through the second retardation layer 1300, a viewer wearing polarized sunglasses may view the image of the display device 10.

Each of the first retardation layer 1200 and the second retardation layer 1300 may be formed of, for example, a film type or a liquid crystal coating layer type. The film-type retardation layer may be obtained by orienting a polymer film in a uniaxial direction, a biaxial direction, or by another appropriate method. For example, the polymer film may include a cyclic olefin polymer (COP)-based polymer, a polycarbonate-based polymer, a polyester-based polymer, a polysulfone-based polymer, a polyethersulfone-based polymer, a polystyrene-based polymer, a polyolefin-based polymer, a polyvinyl alcohol-based polymer, a cellulose acetate-based polymer, a polymethyl methacrylate-based polymer, a polyvinyl chloride-based polymer, a polyacrylate-based polymer, a polyamide-based polymer, or the like.

The liquid crystal coating layer type retardation layer may be fabricated by using a reactive liquid crystal composition including a nematic or smectic liquid crystal material. For example, the liquid crystal coating layer type retardation layer may be fabricated by coating the reactive liquid crystal composition on a substrate, orienting the reactive liquid crystal composition in planar orientation, and exposing the reactive liquid crystal composition to heat or ultraviolet rays to induce polymerization.

For example, in case that the liquid crystal coating layer type retardation layer includes a nematic liquid crystal material, the nematic liquid crystal may have a structure shown in the following structural formula 1.

[Structural formula 1]

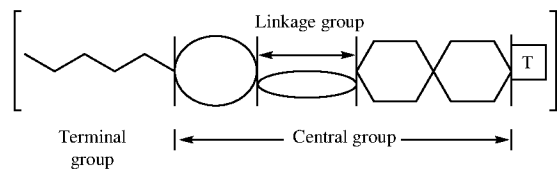

For example, a terminal group (or a linkage group) may affect the length and viscosity of a liquid crystal molecule. The terminal group may be alkyl, alkoxy, alkenyl or alkenyloxy having 1 to 20 carbon atoms. The linkage group may be toluene, ester ethylene, C—C bonds, OCH$_2$ or (CH$_2$)$_n$, wherein n may be within a range of 1 to 20. However, the structural formula 1 is merely an embodiment, and embodiments are not limited thereto.

Further, a central group in the structural formula 1 may affect a refractive index value and refractive index anisotropic characteristics. The central group may include one or more selected from the following chemical formulas 1 to 8, but embodiments are not limited thereto.

[Chemical formula 1]

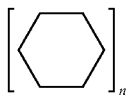

[Chemical formula 2]

[Chemical formula 3]

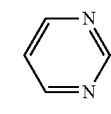

[Chemical formula 4]

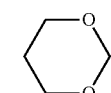

[Chemical formula 5]

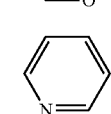

[Chemical formula 6]

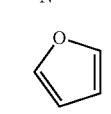

[Chemical formula 7]

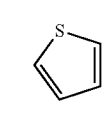

[Chemical formula 8]

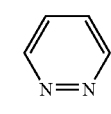

In the chemical formulas 1 and 2, n may be within a range of 1 to 10.

In the structural formula 1, T group may affect polarity. T may be selected among alkyl, alkoxy, CN, and halogen atoms having 1 to 20 carbon atoms.

In the structural formula 1, the short-wavelength refractive index may tend to increase depending on the aromatic ring content of the central group. Therefore, the wavelength dispersion property may be controlled by appropriately adjusting the ratio of the aromatic ring of the central group and the terminal group, but this is merely an embodiment.

The second retardation layer 1300 may include a surface treatment layer disposed on at least one surface. For example, the surface treatment layer may be a hard coating layer, an antiglare layer, an antifouling layer, an antistatic layer, an easy adhesion layer, or the like. The surface treatment layer may be formed of a single layer or two or more layers.

The hard coating layer may be formed by using a hard coating composition including a light-transmitting resin, a photoinitiator, and a solvent. The hard coating composition may further include a UV absorber, inorganic oxide fine particles, a fluorine-based additive, or the like.

The light-transmitting resin may be a photocurable resin, and the photocurable resin may include a photocurable (meth)acrylate oligomer and/or a monomer.

As the photocurable (meth)acrylate oligomer, epoxy (meth)acrylate, urethane (meth)acrylate, or the like is commonly used, and urethane (meth)acrylate may be used. Urethane (meth)acrylate may be obtained by reacting (meth)acrylate having a hydroxy group in a molecule and a compound having an isocyanate group in the presence of a catalyst. Examples of the (meth)acrylate having a hydroxyl group in a molecule include 2-hydroxyethyl(meth)acrylate, 2-hydroxyisopropyl(meth)acrylate, 4-hydroxybutyl(meth)acrylate, caprolactone ring-opening hydroxyacrylate, pentaerythritol tri(meth)acrylate, pentaerythritol tetra(meth)acrylate, dipentaerythritol penta(meth)acrylate, pentaerythritol hexa(meth)acrylate, and the like. For example, examples of the compound having an isocyanate group include 1,4-diisocyanatobutane, 1,6-diisocyanatohexane, 1,8-diisocyanatooctane, 1,12-diisocyanatododecane, 1,5-diisocyanato-2-methylpentane, trimethyl-1,6-diisocyanatohexane, 1,3-bis(isocyanatomethyl)cyclohexane, trans-1,4-cyclohexene diisocyanate, 4,4'-methylenebis(cyclohexylisocyanate), isophorone diisocyanate, toluene-2,4-diisocyanate, toluene-2,6-diisocyanate, xylene1,4-diisocyanate, tetramethylxylene-1,3-diisocyanate, 1-chloromethyl-2,4-diisocyanate, 4,4'-methylenebis(2,6-dimethylphenylisocyanate), 4,4'-oxybis(phenylisocyanate), trifunctional isocyanate derived from hexamethylene diisocyanate, trimethane propanol adduct toluene diisocyanate, and the like.

As the monomer, commonly used monomers may be used without limitation, and a monomer having an unsaturated group such as a (meth)acryloyl group, a vinyl group, a styryl group, an allyl group, or the like in a molecule may be used as a photocurable functional group, and a monomer having a (meth)acryloyl group may be used among them.

Examples of the monomer having a (meth)acryloyl group may be at least one selected from the group consisting of neopentyl glycol acrylate, 1,6-hexanediol di(meth)acrylate, propylene glycol di(meth)acrylate, triethylene glycol di(meth)acrylate, dipropylene glycol di(meth)acrylate, polyethylene glycol di(meth)acrylate, polypropylene glycol di(meth)acrylate, trimethylolpropane tri(meth)acrylate, trimethylolethanetri(meth)acrylate, 1,2,4-cyclohexane tetra (meth)acrylate, pentaglycerol tri(meth)acrylate, pentaerythritol tetra(meth)acrylate, pentaerythritol tri(meth)acrylate, dipentaerythritol tri(meth)acrylate, dipentaerythritol penta (meth)acrylate, dipentaerythritol tetra(meth)acrylate, dipentaerythritol hexa(meth)acrylate, tripentaerythritol tri(meth)acrylate, tripentaerythritol hexa(meth)acrylate, bis(2-hydroxyethyl)isocyanurate di(meth)acrylate, hydroxyethyl (meth)acrylate, hydroxypropyl(meth)acrylate, hydroxybutyl (meth)acrylate, isooctyl(meth)acrylate, isodexyl(meth)acrylate, stearyl(meth)acrylate, tetrahydrofurfuryl(meth)acrylate, phenoxyethyl(meth)acrylate, and isoborneol(meth)acrylate.

The photocurable (meth)acrylate oligomer and monomer, which are the above light transmitting resins, may be used alone or in combination of two or more.

The photoinitiator used in the art may be used without limitation as long as it is capable of generating radicals by light irradiation. For example, hydroxy ketones, amino ketones, hydrogen decyclic photoinitiators, or the like may be used.

For example, the photoinitiator may be 2-methyl-1-[4-(methylthio)phenyl]2-morpholinepropanone-1, diphenylketone, benzyl dimethylketal, 2-hydroxy-2-methyl-1-phenyl-1-on, 2,2-dimethoxy-2-phenyl-acetophenone, anthraquinone, fluorene, triphenylamine, carbazole, 3-methylacetophenone, 4-chloroacetophenone, 4,4-dimethoxyacetophenone, 4,4-diaminobenzophenone, 1-hydroxycyclohexyl phenyl ketone, benzophenone, diphenyl(2,4,6-trimethylbenzoyl)phosphineoxide, or the like. The photoinitiators may be used alone or in combination of two or more.

The solvent may be used without limitation as long as it is used in the art. For example, alcohols (methanol, ethanol, isopropanol, butanol, methyl cellosolve, ethyl cellosolve, and the like), ketones (methyl ethyl ketone, methyl butyl ketone, methyl isobutyl ketone, diethyl ketone, dipropyl ketone, cyclohexanone, and the like), acetates (ethyl acetate, propyl acetate, normal butyl acetate, tertiary butyl acetate, methyl cellosolve acetate, ethyl cellosolve acetate, propylene glycol monomethyl ether acetate, propylene glycol monoethyl ether acetate, propylene glycol monopropyl ether acetate, methoxybutyl acetate, methoxypentyl acetate, and the like), hexanes (hexane, heptane, octane, and the like), benzenes (benzene, toluene, xylene, and the like), ethers (diethylene glycol dimethyl ether, diethylene glycol diethyl ether, diethylene glycol dipropyl ether, diethylene glycol dibutyl ether, propylene glycol monomethyl ether, and the like) may be used. The above solvents may be used alone or in combination of two or more.

The thickness of the hard coating layer may be about 3 µm to about 20 µm, e.g., about 3 µm to about 15 µm. Since the hard coating layer having a thickness within the above-described range is included, excellent surface hardness, ease of handling, and flexibility may be provided.

A method of applying a hard coating composition is not limited as long as it is applicable to the technical field to which the disclosure belongs, and it is possible to use, for example, a bar coating method, a knife coating method, a roll coating method, a blade coating method, a die coating method, a micro-gravure coating method, a comma coating method, a slot die coating method, a lip coating method, a solution casting method, or the like.

In case that the hard coating composition includes a UV absorber that absorbs ultraviolet light, the UV absorber may be, for example, a triazine-based UV absorber, a benzophenone-based UV absorber, a benzotriazole-based UV absorber, a benzoate-based UV absorber, a cyanoacrylate-based UV absorber, or the like. They may be used alone, or two or more of them may be used together. Commercially available UV absorbers may include, for example, Sumisorb (registered trademark) 340 manufactured by Sumika Chemtex Co., Ltd., Adekastab (registered trademark) LA-31 manufactured by ADEKA Corporation, and Tinuvin (registered trademark) 1577 manufactured by BASF Japan Co., Ltd.

In another example of the surface treatment layer, the composition and the applying method that are known may be employed for each surface treatment function within a range in which the effects of the disclosure can be achieved.

The protective film 1400 may be disposed between the polarizer 1100 and the first retardation layer 1200. For example, the protective film 1400 may be disposed on the bottom surface (or lower surface) of the polarizer 1100, and may be disposed on the top surface (or upper surface) of the first retardation layer 1200. The protective film 1400 may be adhered or tackified with the polarizer 1100 and the first retardation layer 1200 by an adhesive or a cohesion.

Each of the second retardation layer 1300 and the protective film 1400 may include a resin film having excellent transparency, mechanical strength, thermal stability, moisture barrier characteristics, and isotropic characteristics. For example, each of the second retardation layer 1300 and the protective film 1400 may include a norbornene-based resin. Each of the second retardation layer 1300 and the protective film 1400 may include an acrylic-based resin film such as polymethyl (meth)acrylate and polyethyl (meth)acrylate, a polyester-based resin film such as polyethylene terephthalate, polyethylene isophthalate, polyethylene naphthalate, and polybutylene terephthalate, a cellulose-based resin film such as diacetyl cellulose and triacetyl cellulose, a polyolefin-based resin film such as polyethylene, polypropylene, polyolefin having a cyclic or norbornene structure, and an ethylene-propylene copolymer, or the like.

Each of the second retardation layer 1300 and the protective film 1400 may further include an additive. Such an additive may be, for example, a UV absorber, a whitening agent, a silica dispersing agent, an antioxidant, a pH adjuster, and a leveling agent. Each of the second retardation layer 1300 and the protective film 1400 may be a single layer or a laminated structure of a plurality of layers, and is not limited as long as the object of the invention is achieved. In the case of the plurality of layers, for example, a functional layer may be laminated on one side or both sides of a resin film.

Figure 10A:
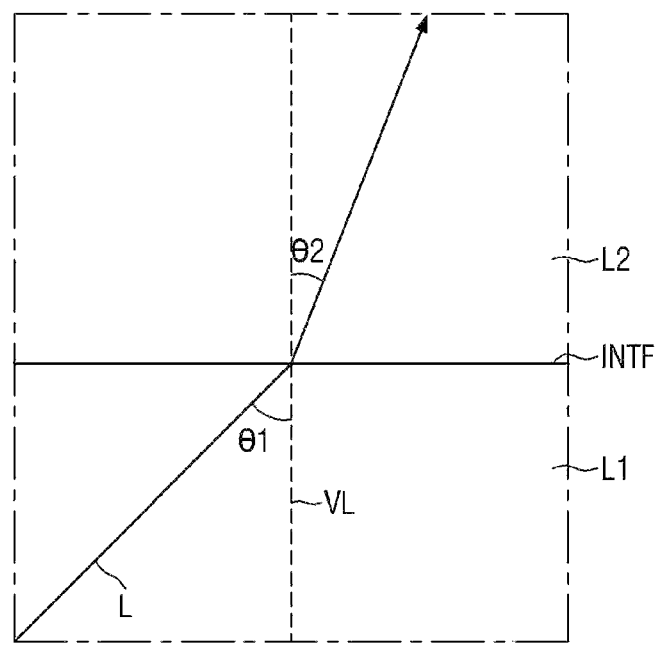
FIG. 10A is a schematic diagram illustrating refraction of light at the interface between layers having different refractive indices.
Figure 10B:
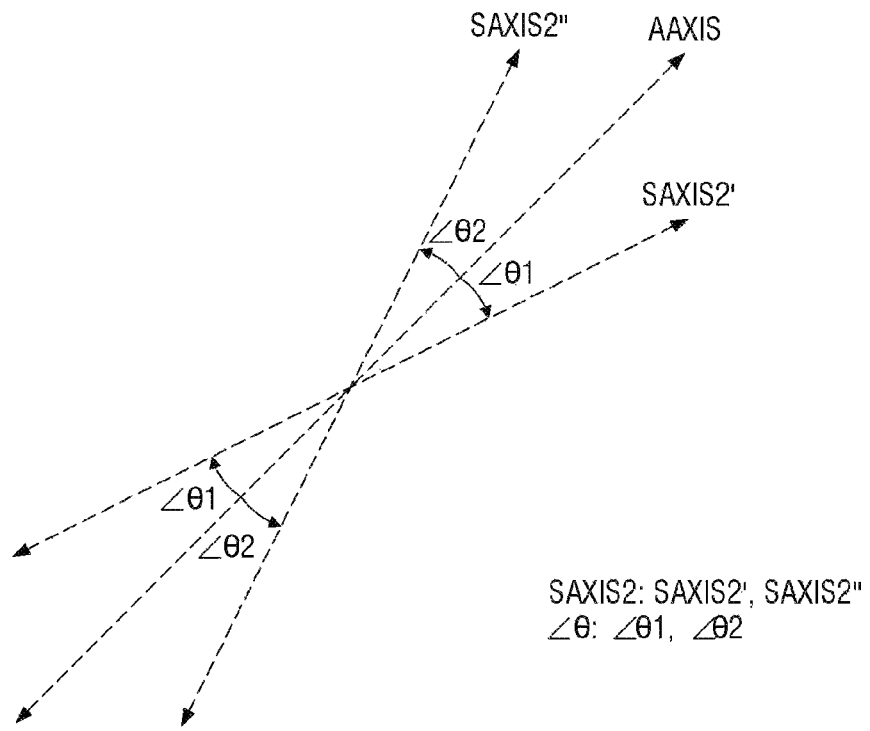
FIG. 10B is a schematic diagram showing an angle between a retardation axis of a second retardation layer and an absorption axis of a polarizer.

FIG. 10A is a schematic diagram illustrating refraction of light L at the interface between layers having different refractive indices.

Referring to FIG. 10A, the transmittance of light L passing through an interface INTF between two layers L1 and L2 having different refractive indices may be determined by Equation (2). FIG. 10A illustrates that the refractive index of the first layer L1 is lower than the refractive index of the second layer L2, but embodiments are not limited thereto. For example, in case that the refractive index of the first layer L1 is higher than the refractive index of the second layer L2, the transmittance of light L passing through the interface INTF between the two layers L1 and L2 having different refractive indices may be determined by Equation (2):

$$T = 1 - \frac{1}{2}(Rs + Rp), Rs = \left[\frac{\sin(\theta 1 - \theta 2)}{\sin(\theta 1 + \theta 2)}\right]^2, Rp = \left[\frac{\tan(\theta 1 - \theta 2)}{\tan(\theta 1 + \theta 2)}\right]^2 \quad (2)$$

In Equation (2), T indicates the transmittance of light L, Rs indicates the reflectivity of S-polarized light, Rp indicates the reflectivity of P-polarized light, θ1 indicates the incidence angle of light L incident from the first layer L1 to the second layer L2, and θ2 indicates the refraction angle of light L refracted at the interface INTF between the first layer L1 and the second layer L2. The incidence angle θ1 of light L indicates the angle between a normal line VL perpendicular to the interface INTF and an incident ray, and the refraction angle θ2 of light L indicates the angle between the normal line VL and a refracted ray.

Since the reflectivity of the P-polarized light and the reflectivity of the S-polarized light are different at the interface between the two layers L1 and L2 having different refractive indices, the transmittance of the P-polarized light and the transmittance of the S-polarized light may be different. For example, the reflectivity of the S-polarized light may be higher than the reflectivity of the P-polarized light at the interface between two layers having different refractive indices, so that the transmittance of the P-polarized light may be higher than the transmittance of the S-polarized light.

As shown in FIGS. 5 to 8, the encapsulation layer TFEL may include a plurality of layers having different refractive indices. For example, since the encapsulation layer TFEL including a plurality of layers having different refractive indices is disposed above the light emitting layer 172, the transmittance of the P-polarized light and the transmittance of the S-polarized light passing through the plurality of layers having different refractive indices may be different.

Further, as shown in FIG. 2, the refractive indices of the polarizing plate POL and the transparent adhesive member TAM that are sequentially stacked, the refractive indices of the transparent adhesive member TAM and the cover window CW that are sequentially stacked, and the refractive indices of the cover window CW and air may be different, so that the transmittance of the P-polarized light and the transmittance of the S-polarized light passing through the interface between the polarizing plate POL and the transparent adhesive member TAM, the interface between the transparent adhesive member TAM and the cover window CW, and the interface between the cover window CW and air may be different. For example, the transmittance of the P-polarized light passing through the interface between the polarizing plate POL and the transparent adhesive member TAM, the interface between the transparent adhesive member TAM and the cover window CW, and the interface between the cover window CW and air may be higher than the transmittance of the S-polarized light.

Figure 11:
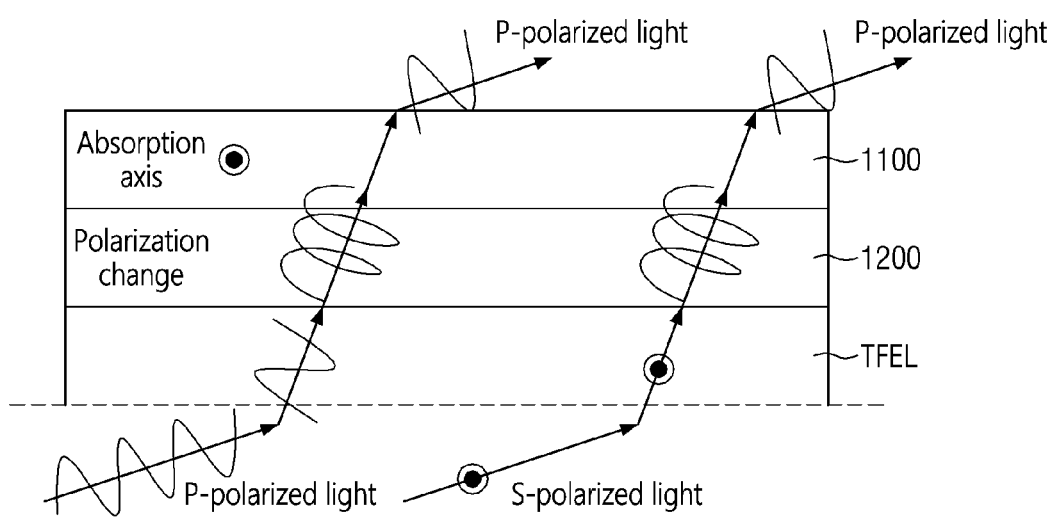
FIG. 11 is a schematic diagram showing paths of P-polarized light and S-polarized light in an encapsulation layer, a first retardation layer, and a polarizer in the case where the oscillation direction of the S-polarized light in the polarizer of FIG. 9 coincides with an absorption axis.
Figure 12:
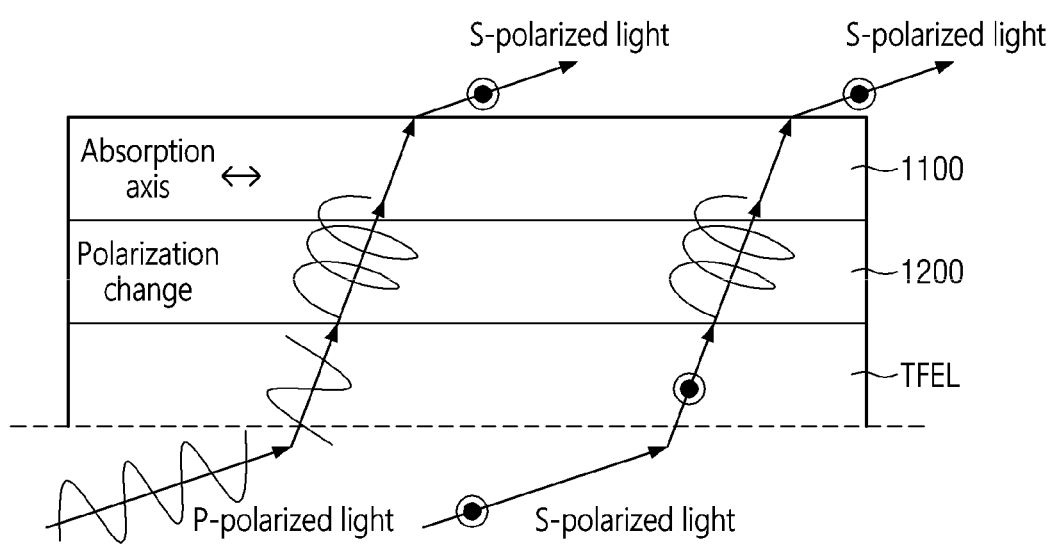
FIG. 12 is a schematic diagram showing paths of P-polarized light and S-polarized light in an encapsulation layer, a first retardation layer, and a polarizer in the case where the oscillation direction of the P-polarized light in the polarizer of FIG. 9 coincides with an absorption axis.

FIG. 11 is a schematic diagram showing paths of P-polarized light and S-polarized light in an encapsulation layer, a first retardation layer, and a polarizer in the case where the oscillation direction of the S-polarized light in the polarizer of FIG. 9 coincides with an absorption axis. FIG. 12 is a schematic diagram showing paths of P-polarized light and S-polarized light in an encapsulation layer, a first retardation layer, and a polarizer in the case where the oscillation direction of the P-polarized light in the polarizer of FIG. 9 coincides with an absorption axis.

Referring to FIGS. 11 and 12, since P-polarized light is converted into circularly polarized light or elliptically polarized light and S-polarized light is converted into circularly polarized light or elliptically polarized light in the first retardation layer 1200, both the circularly polarized light or elliptically polarized light converted from the P-polarized light and the circularly polarized light or elliptically polarized light converted from the S-polarized light may pass through the polarizer 1100. For example, as shown in FIG. 11, in case that the oscillation direction of the S-polarized light coincides with the absorption axis AAXIS, the P-polarized light may pass through the polarizer 1100. Further, as shown in FIG. 12, in case that the oscillation direction of the P-polarized light coincides with the absorption axis AAXIS, the S-polarized light may pass through the polarizer 1100.

As shown in FIG. 10A, in the light passing through the encapsulation layer TFEL including a plurality of layers having different refractive indices, the transmittance of the P-polarized light may be higher than the transmittance of the S-polarized light, so that the transmittance of the circularly polarized light or elliptically polarized light converted from the P-polarized light passing through the polarizer 1100 may be higher than the transmittance of the circularly polarized light or elliptically polarized light converted from the S-polarized light.

The thickness of the plurality of layers of the encapsulation layer TFEL may be set in consideration of the resonance distance of the red wavelength light emitted from the first emission portion EA1, the resonance distance of the green wavelength light emitted from the second emission portion EA2 and the fourth emission portion EA4, and the resonance distance of the blue wavelength light emitted from the third emission portion EA3. However, it is difficult to design the thickness of the plurality of layers of the encapsulation layer TFEL in consideration of all the resonance distance of the red wavelength light, the resonance distance of the green wavelength light, and the resonance distance of the blue wavelength light. The efficiency (or lifetime) of the red wavelength light emitted from the first emission portion EA1 may be higher (longer) than the efficiency (or lifetime) of the green wavelength light emitted from the second emission portion EA2 and the fourth emission portion EA4 and the efficiency (or lifetime) of the blue wavelength light emitted from the third emission portion EA3. Therefore, it may be designed in consideration of the resonance distance of the green wavelength light and the resonance distance of the blue wavelength light rather than the resonance distance of the red wavelength light. Accordingly, the image outputted from the display panel 100 may have a reddish color along the transmission axis of the polarizer 1100. Therefore, it is necessary to improve the phenomenon that the image outputted from the display panel 100 has a reddish color.

Figure 13:
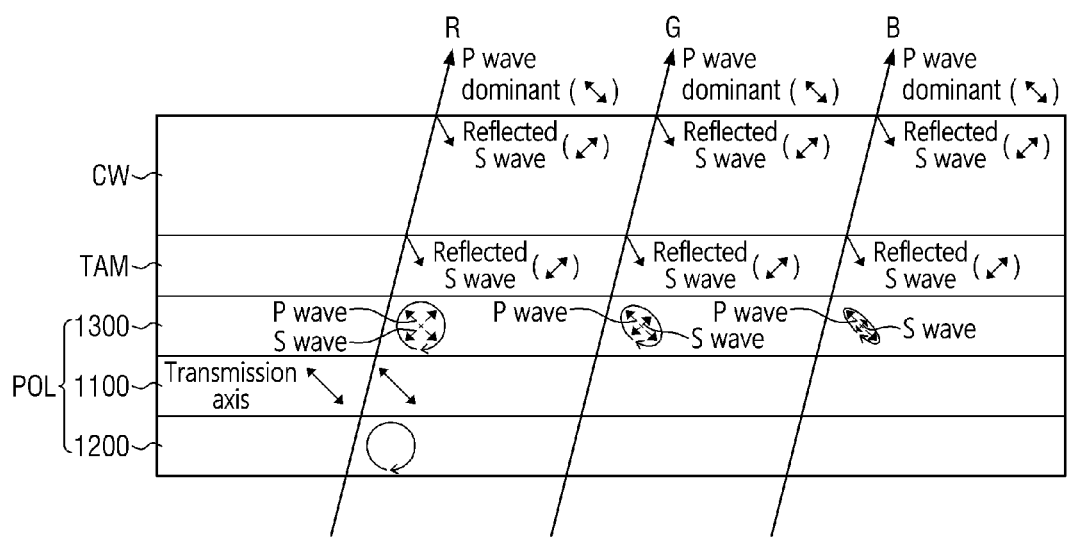
FIG. 13 is a schematic diagram showing polarization states of light passing through a first retardation layer, a polarizer, a second retardation layer, and a cover window for each of red wavelength light, green wavelength light, and blue wavelength light.

FIG. 13 is a schematic diagram showing polarization states of light passing through a first retardation layer, a polarizer, a second retardation layer, and a cover window for each of red wavelength light R, green wavelength light G, and blue wavelength light B.

Referring to FIG. 13, the red wavelength light R, the green wavelength light G, and the blue wavelength light B passing through the first retardation layer 1200 may have circularly polarized light or elliptically polarized light.

The red wavelength light R, the green wavelength light G, and the blue wavelength light B passing through the polarizer 1100 may have linearly polarized light oscillating in a direction parallel to the transmission axis TAXIS.

The red wavelength light R, the green wavelength light G, and the blue wavelength light B having linearly polarized light may pass through the second retardation layer 1300 and may be converted into circularly polarized light or elliptically polarized light. Each of the red wavelength light R, the green wavelength light G, and the blue wavelength light B passing through the second retardation layer 1300 may have S-polarized light and P-polarized light. For example, the transmittances of the S-polarized light and the P-polarized light of the red wavelength light R, the transmittances of the S-polarized light and the P-polarized light of the green wavelength light G, and the transmittances of the S-polarized light and the P-polarized light of the blue wavelength light B, which have passed through the second retardation layer 1300, may be different depending on an azimuth angle and a polar angle.

Furthermore, in case that the red wavelength light R, the green wavelength light G, and the blue wavelength light B having circularly polarized light or elliptically polarized light, which have passed through the second retardation layer 1300, pass through the interface between the polarizing plate POL and the transparent adhesive member TAM, the interface between the transparent adhesive member TAM and the cover window CW, and the interface between the cover window CW and air, the transmittance of the P-polarized light may be higher than the transmittance of the S-polarized light (or P wave dominant) in the red wavelength light R, the green wavelength light G, and the blue wavelength light B having circularly polarized light or elliptically polarized light.

Therefore, color shift may occur in the image displayed on the display device 10 due to the second retardation layer 1300. However, the second retardation layer 1300 is necessary for a viewer wearing polarized sunglasses to view the image of the display device 10, so that it is difficult to omit the second retardation layer 1300. Therefore, it is necessary to improve the phenomenon that the image outputted from the display panel 100 has a reddish color, which has been described in conjunction with FIGS. 11 and 12, and suppress the color shift occurring due to the second retardation layer 1300, which has been described in connection with FIG. 13, without omitting the second retardation layer 1300 in the polarizing plate POL.

Figure 14:
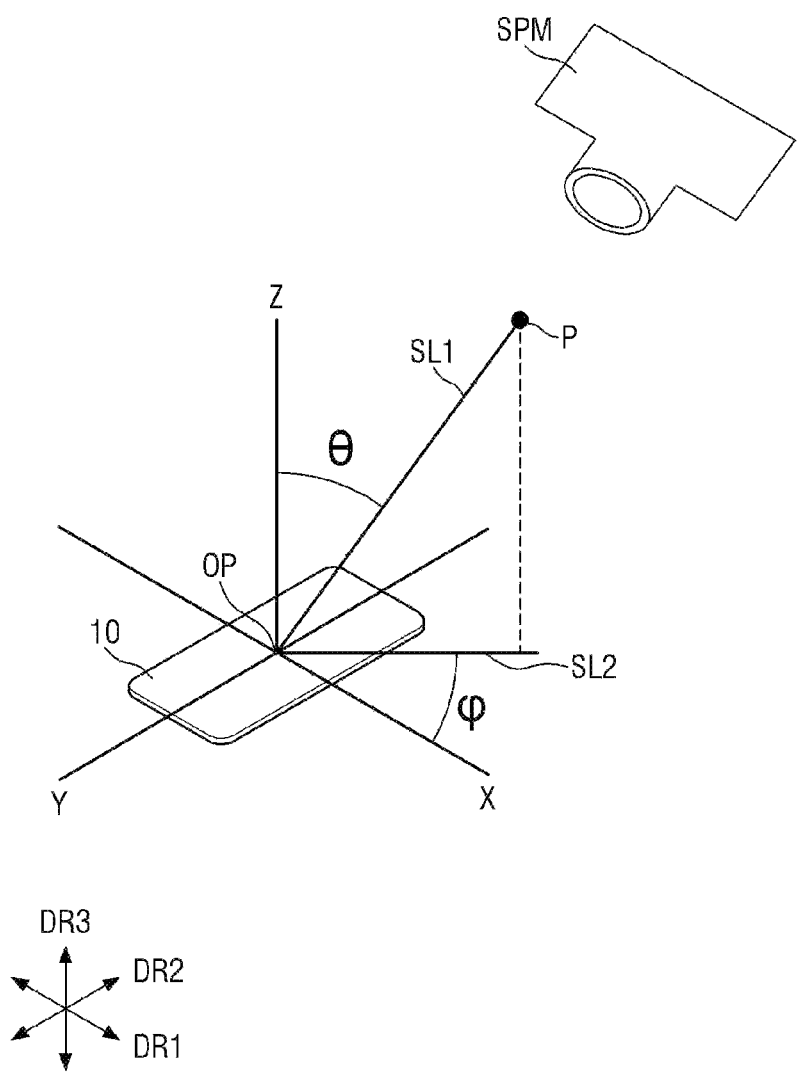
FIG. 14 is a schematic diagram illustrating an azimuth angle and a polar angle with respect to a display device.
Figure 15:
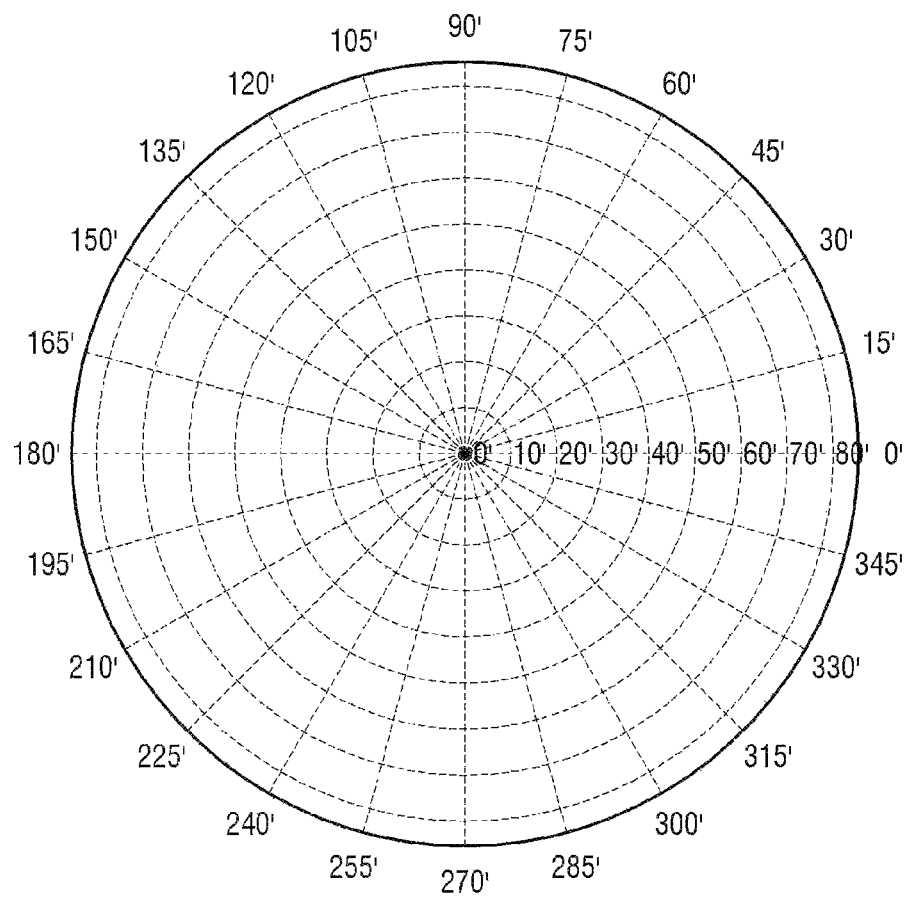
FIG. 15 is a schematic diagram showing azimuth angles and polar angles on a plane.

FIG. 14 is a schematic diagram illustrating an azimuth angle and a polar angle with respect to a display device. FIG. 15 is a schematic diagram showing azimuth angles and polar angles on a plane.

Referring to FIGS. 14 and 15, with respect to an origin OP that is the center portion of the top surface (or upper surface) of the display device 10 on the plane, the axis in the first direction DR1 is defined as the X-axis, the axis in the second direction DR2 is defined as the Y-axis, and the axis in the third direction DR3 is defined as the Z-axis. Further, a polar angle $\theta$ indicates the angle from the positive direction of the Z-axis to a straight line SL1 formed by the origin OP and a given point P. An azimuth angle $\varphi$ indicates the angle from the positive direction of the X-axis to a straight line SL2 obtained by projecting the straight line SL1 formed by the origin OP and P onto the plane defined by the X-axis and the Y-axis. The polar angle $\theta$ may be expressed from about 0° to about 90°, the azimuth angle $\varphi$ may be expressed from about 0° to about 360°, and the azimuth angle of about 0° may be substantially equal to the azimuth angle of about 360°.

Figure 16:
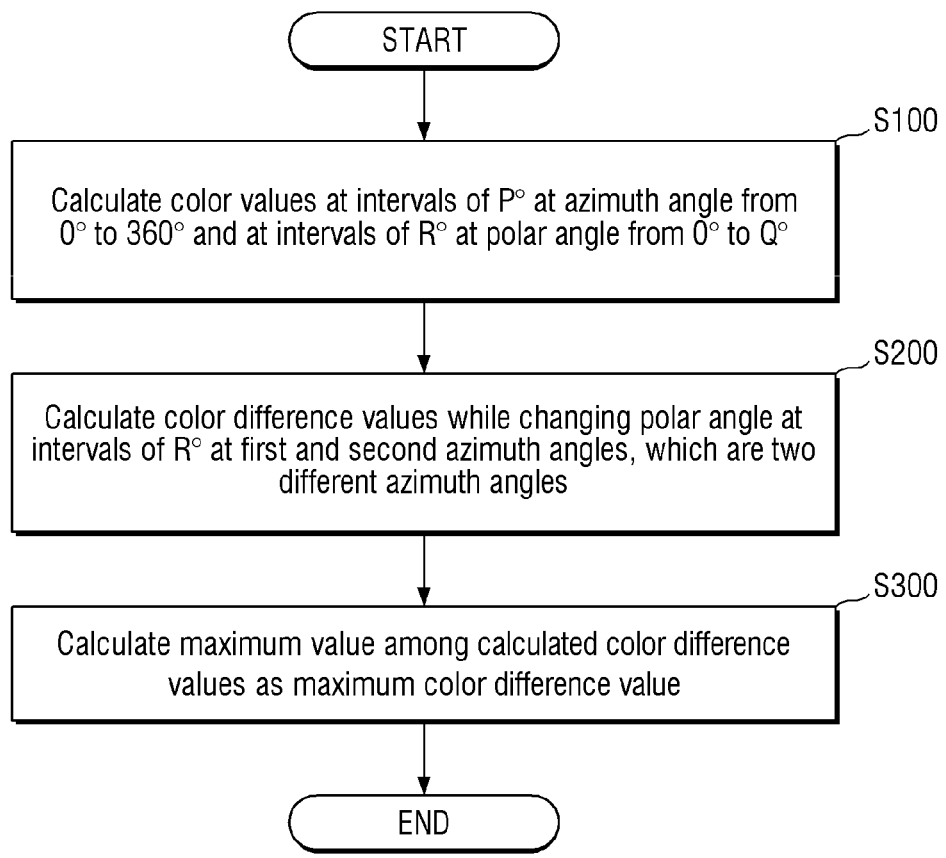
FIG. 16 is a flowchart illustrating a method of calculating a maximum color difference value according to an embodiment.
Figure 17:
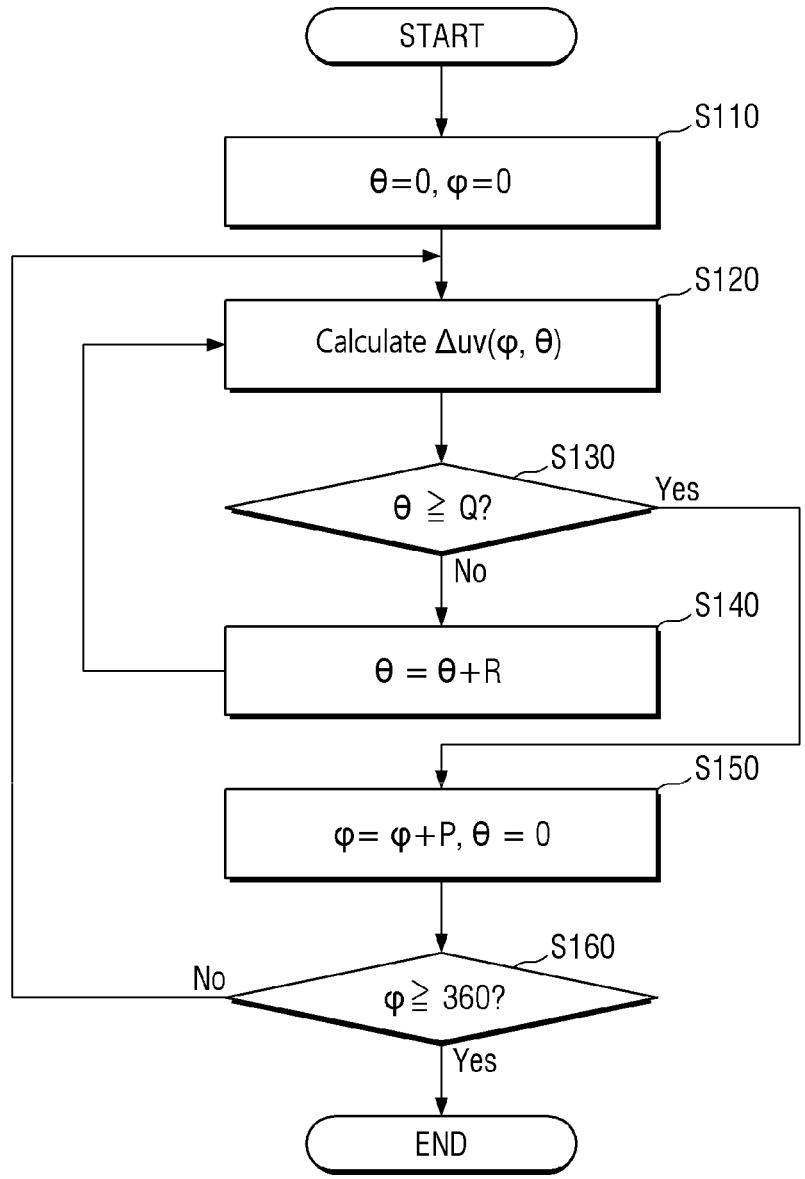
FIG. 17 is a flowchart showing step S100 of FIG. 16 in detail.
Figure 18:
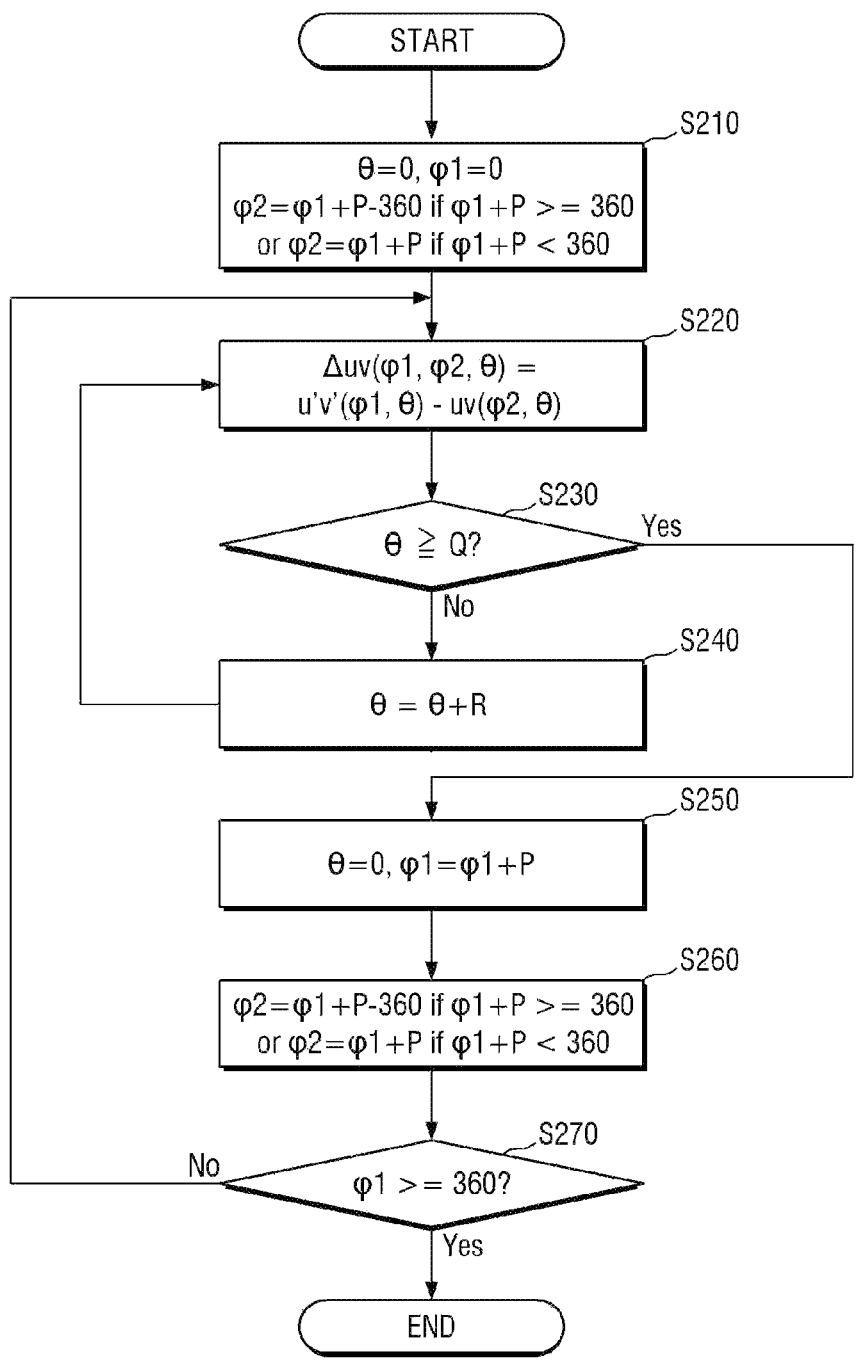
FIG. 18 is a flowchart showing step S200 of FIG. 16 in detail.

FIG. 16 is a flowchart illustrating a method of calculating a maximum color difference value according to an embodiment. FIG. 17 is a flowchart showing step S100 of FIG. 16 in detail. FIG. 18 is a flowchart showing step S200 of FIG. 16 in detail. FIG. 19 is a table showing a first azimuth angle and a second azimuth angle.

Firstly, an image displayed by the display device 10 may be measured by using a measuring device SPM, at intervals of about P° (P being a positive integer) at the azimuth angle $\varphi$ from about 0° to about 3600 and at intervals of about R° (R being a positive integer) at the polar angle $\theta$ from about 0° to about Q° (Q being a positive integer larger than R), and color values u'v' may be calculated from the measured images (step S100 of FIG. 16).

The measuring device SPM may be a spectrophotometer (or spectrometer).

For example, in case that P° is about 45°, Q° is about 60°, and R° is about 10°, the image displayed by the display device 10 may be measured at each of the polar angles $\theta$ of about 0°, about 10°, about 20°, about 30°, about 40°, about 50°, and about 600 with increasing the azimuth angle by about 45°, and the color values u'v' may be calculated from the measured images.

Hereinafter, a method of calculating the color value in the step S100 will be described in detail with reference to FIGS. 14, 15 and 17. For simplicity of description, the color value u'v' calculated at the azimuth angle $\varphi$ and the polar angle $\theta$ may be defined as u'v'($\varphi$, $\theta$). For example, u'v'(0, 0) indicates a color value u'v' calculated at a position where the azimuth angle $\varphi$ is about 0° and the polar angle $\theta$ is about 0°.

First, the azimuth angle $\varphi$ may be set to about 0°, and the polar angle $\theta$ may be set to about 0° (step S110 of FIG. 17).

Then, the image of the display device 10 may be measured by using the measuring device SPM at a position where the azimuth angle $\varphi$ is about 0° and the polar angle $\theta$ is about 0°, and the color value u'v'(0, 0) is calculated from the measured image. For example, the image of the display device 10 may be an image in which all pixels of the display device 10 display white light at maximum luminance (step S120 of FIG. 17).

Then, it is checked whether the polar angle $\theta$ is greater than or equal to about Q° (step S130 of FIG. 17).

In case that the polar angle $\theta$ is less than about Q°, the polar angle $\theta$ may be set to a value ($\theta=\theta+R$) obtained by adding about R° to the current polar angle $\theta$, and a color value u'v'(0, R) at a position where the azimuth angle $\varphi$ is about 0°, and the polar angle $\theta+R°$ may be (step S140 of FIG. 17).

The steps S120 to S140 of FIG. 17 may be repeated until the polar angle $\theta$ becomes about Q° or more. For example, in case that P° is about 45°, Q° is about 60°, and R° is about 10°, color values u'v'(0, 0), u'v'(0, 10), u'v'(0, 20), u'v'(0, 30), u'v'(0, 40), u'v'(0, 50), and u'v'(0, 60) may be calculated.

Then, in case that the polar angle $\theta$ is equal to or greater than about Q°, since the calculation of the color values has been completed at the azimuth angle $\varphi$ of about 0°, the azimuth angle $\varphi$ may be set to a value ($\varphi=\varphi+P$) obtained by adding about P° to the current azimuth angle $\varphi$, and the polar angle $\theta$ may be set to about 0° (step S150 of FIG. 17).

Then, it is checked whether the azimuth angle $\varphi$ is less than about 3600 (step S160 of FIG. 17).

In case that the azimuth angle $\varphi$ is less than about 360°, the steps S120 to S150 of FIG. 17 may be repeated. For example, in case that P° is about 45°, Q° is about 60°, and R° is about 10°, color values u'v'(45, 0), u'v'(45, 10), u'v'(45, 20), u'v'(45, 30), u'v'(45, 40), u'v'(45, 50), and u'v'(45, 60) may be additionally calculated.

For example, since the steps S120 to S160 of FIG. 17 may be repeated until the azimuth angle $\varphi$ becomes about 3600 with increasing the azimuth angle $\varphi$ at P° intervals, the color values may be calculated at P° intervals at the azimuth angle from about 0° to about 3600 and at R° intervals at the polar angle from about 0° to about Q°.

In case that the azimuth angle $\varphi$ is greater than or equal to about 360°, since all color values intended to be calculated have been calculated, the color value calculation may be terminated.

Secondly, color difference values $\Delta u'v'$ may be calculated with changing the polar angle $\theta$ at intervals of S° (S being a positive integer) at two different azimuth angles, i.e., a first azimuth angle $\varphi 1$ and a second azimuth angle $\varphi 2$ (step S200 of FIG. 16).

Hereinafter, a method of calculating the color difference values in the step S200 will be described in detail with reference to FIGS. 14, 15, and 18. For simplicity of description, the color difference value $\Delta u'v'$ between the first azimuth angle $\varphi 1$ and the second azimuth angle $\varphi 2$ at any one polar angle $\theta$ may be defined as $\Delta u'v'(\varphi 1, \varphi 2, \theta)$. As shown in FIG. 19, the first azimuth angle $\varphi 1$ and the second azimuth angle $\varphi 2$ may be different from each other.

First, the first azimuth angle $\varphi 1$ may be set to about 0°, and the polar angle $\theta$ may be set to about 0°. For example, since the second azimuth angle $\varphi 2$ is within the range of about 0° to about 360°, in case that $\varphi 1+P$ is greater than or equal to 360, the second azimuth angle φ2 may be set to φ1+P−360. For example, in case that φ1+P is less than 360, the second azimuth angle φ2 may be set to φ1+P (step S210 of FIG. 18).

Then, Δu'v'(φ1, φ2, θ) may be calculated as in Equation (3):

$$\Delta u'v'(\varphi 1, \varphi 2, \theta) = u'v'(\varphi 1, \theta) - u'v'(\varphi 2, \theta) \quad (3)$$

In Equation (3), u'v'(φ1, θ) indicates a color value at the first azimuth angle φ1 and the polar angle θ, and u'v'(φ2, θ) indicates a color value at the second azimuth angle φ2 and the polar angle θ. For example, in case that P° is about 45°, a difference between u'v'(0, 0) and u'v'(45, 0) may be calculated as a color difference value Δu'v'(0, 45, 0) between the first azimuth angle of about 0° and the second azimuth angle of about 45° at the polar angle of about 0° (step S220 of FIG. 18).

Then, it is checked whether the polar angle θ is greater than or equal to about Q° (step S230 of FIG. 18).

In case that the polar angle θ is less than about Q°, the polar angle θ may be set to a value (θ=θ+R) obtained by adding about R° to the current polar angle θ (step S240 of FIG. 18). Then, by repeating the step S220, a color difference value Δu'v'(φ1, φ2, θ+R) between the first azimuth angle of about 0° and the second azimuth angle of about 45° at the polar angle θ+R° may be calculated.

The steps S220 to S240 of FIG. 18 may be repeated until the polar angle θ becomes equal to or greater than about Q°. For example, in case that P° is about 45°, Q° is about 60°, R° is about 10°, and T° is about 0°, color difference values Δu'v'(0, 45, 0), Δu'v'(0, 45, 10), Δu'v'(0, 45, 20), Δu'v'(0, 45, 30), Δu'v'(0, 45, 40), Δu'v'(0, 45, 50), and Δu'v'(0, 45, 60) may be calculated. In case that the polar angle θ is equal to or greater than about 60°, since the calculation of the color difference values has been completed at the first azimuth angle φ1 of about 0° and the second azimuth angle φ2 of about 45°, the polar angle θ may be set to about 0°, and the first azimuth angle φ1 may be set to φ1+P (step S250 of FIG. 18).

Then, since the second azimuth angle φ2 is within the range of about 0° to about 360°, in case that φ1+P is greater than or equal to 360, the second azimuth angle φ2 may be set to φ1+P−360. For example, in case that φ1+P is less than 360, the second azimuth angle φ2 may be set to φ1+P (step S260 in FIG. 18).

In case that the first azimuth angle φ1 is less than about 360°, the steps S220 to S260 shown in FIG. 18 may be repeated. For example, since the steps S220 to S260 of FIG. 18 are repeated until the first azimuth angle φ1 becomes about 3600 with increasing the first azimuth angle φ1 at P° intervals, the color values may be calculated at different first and second azimuth angles φ1 and φ2 for each polar angle θ, at P° intervals at the first azimuth angle φ1 from about 0° to about 360°, P° intervals at the second azimuth angle φ2 from about 0° to about 360°, and R° intervals at the polar angle from about 0° to about Q°.

In case that the first azimuth angle φ1 is equal to or greater than about 360°, since all color difference values intended to be calculated have been calculated, the color difference value calculation may be terminated (step S270 in FIG. 18).

Thirdly, the maximum value of the calculated color difference values Δu'v'(φ1, φ2, θ) may be obtained as a maximum color difference value max_Δu'v' (step S300 of FIG. 16).

As the maximum color difference value max_Δu'v' increases, the color uniformity of the image displayed by the display device 10 may decrease. Conversely, as the maximum color difference value max_Δu'v' decreases, the color uniformity of the image displayed by the display device 10 may increase.

Figure 20:
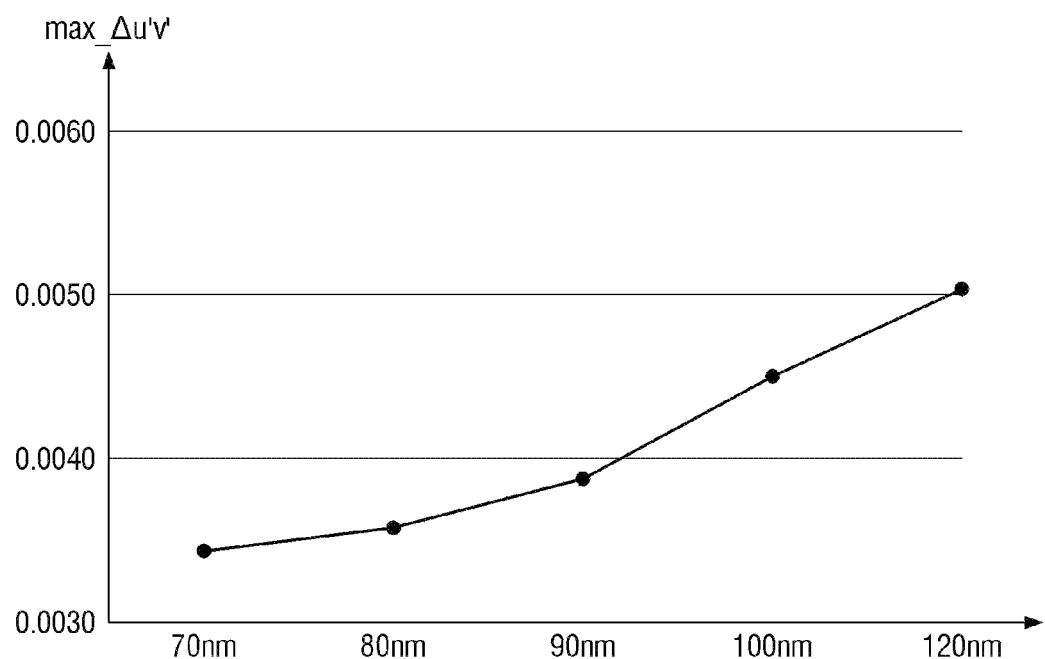
FIG. 20 is a graph showing a maximum color difference value depending on an in-plane retardation value of a second retardation layer in the display device including the polarizing plate according to the embodiment of FIG. 9.

FIG. 20 is a graph showing a maximum color difference value depending on an in-plane retardation value of a second retardation layer in the case of the display device including the polarizing plate according to the embodiment of FIG. 9. In FIG. 20, the horizontal axis indicates an in-plane retardation value $R_o$ of a second retardation layer 1300, and the vertical axis indicates the maximum color difference value. For example, here, the in-plane retardation value $R_o$ of the second retardation layer 1300 indicates an in-plane retardation value $R_o$ at about 550 nm of the second retardation layer 1300.

Referring to FIG. 20, in case that the in-plane retardation value $R_o$ of the second retardation layer 1300 is about 120 nm, the maximum color difference value max_Δu'v' may be about 0.0050. In case that the in-plane retardation value $R_o$ of the second retardation layer 1300 is about 100 nm, the maximum color difference value max_Δu'v' may be about 0.0045. In case that the in-plane retardation value $R_o$ of the second retardation layer 1300 is about 90 nm, the maximum color difference value max_Δu'v' may be about 0.0039. In case that the in-plane retardation value $R_o$ of the second retardation layer 1300 is about 80 nm, the maximum color difference value max_Δu'v' may be about 0.0035. In case that the in-plane retardation value $R_o$ of the second retardation layer 1300 is about 70 nm, the maximum color difference value max_Δu'v' may be about 0.0034.

For example, as the in-plane retardation value $R_o$ of the second retardation layer 1300 decreases, the maximum color difference value may decrease. Therefore, it can be seen that as the in-plane retardation value $R_o$ of the second retardation layer 1300 decreases, the color of the image of the display device 10 may be expressed uniformly. For example, it is said that in case that a viewer compares two displays side by side, the viewer may perceive a color difference in case that the color difference value Δu'v' exceeds a certain level. For example, it is known that the viewer feels a color difference in case that the maximum color difference value max_Δu'v' is equal to or greater than about 0.0050. Therefore, the maximum color difference value max_Δu'v' may be less than about 0.0050, and the in-plane retardation value $R_o$ of the second retardation layer 1300 satisfying this condition may be about 100 nm or less as shown in FIG. 20.

Figure 21:
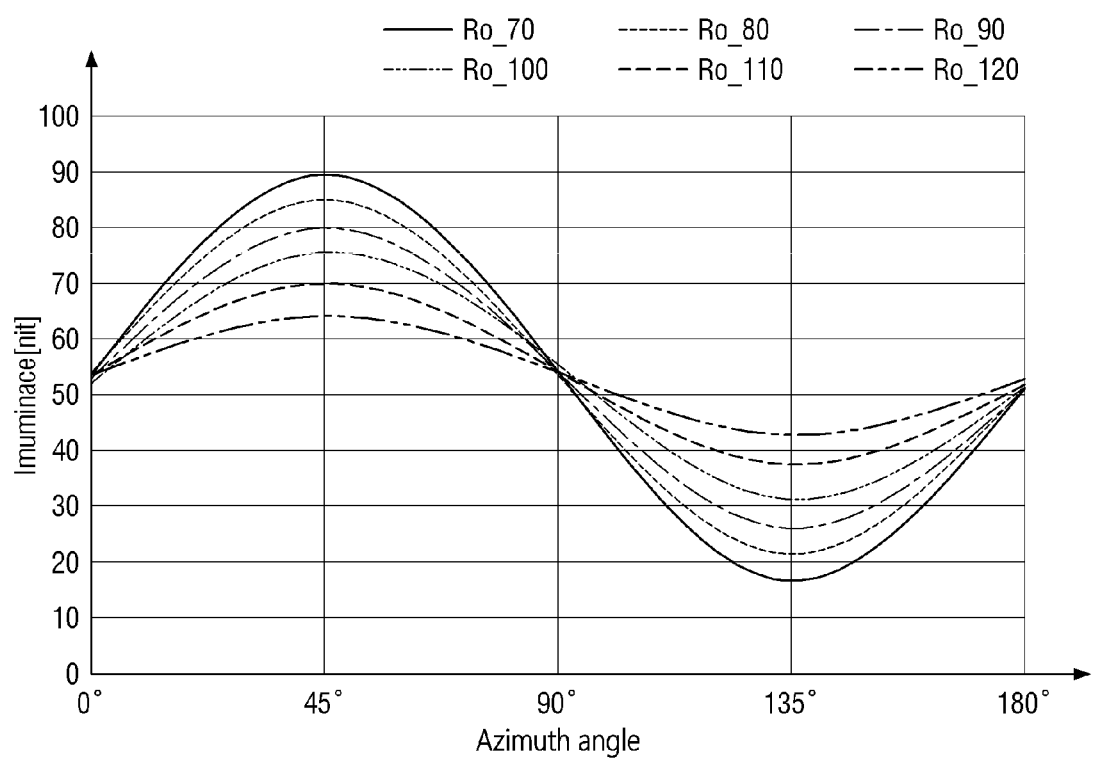
FIG. 21 is a graph showing luminance depending on an azimuth angle for each in-plane retardation value of the second retardation layer, in the display device including the polarizing plate according to the embodiment of FIG. 9.

FIG. 21 is a graph showing luminance depending on an azimuth angle for each in-plane retardation value of the second retardation layer, in the display device including the polarizing plate according to the embodiment of FIG. 9.

In FIG. 21, the horizontal axis indicates the azimuth angle and the vertical axis indicates the luminance. For example, FIG. 21 shows the luminance of the display device 10 measured at the polar angle of about 0° for each of the azimuth angles of about 0°, about 45°, about 90°, about 135°, and about 180°.

Referring to FIG. 21, the in-plane retardation value $R_o$ of the second retardation layer 1300 may correspond to the in-plane retardation value at about 550 nm of the second retardation layer 1300. Regardless of the in-plane retardation value $R_o$ of the second retardation layer 1300, the luminance may have a value corresponding to about 52 nits to about 53 nits at the azimuth angles of about 0°, about 90°, and about 180°. In case that the in-plane retardation value $R_o$ of the second retardation layer 1300 is about 120 nm (see $R_o$_120 in FIG. 21), the luminance may have a value of about 64 nits at the azimuth angle of about 45°. In case that the in-plane retardation value $R_o$ of the second retardation layer 1300 is about 110 nm (see $R_o$_110 in FIG. 21), the luminance may have a value of about 70 nits at the azimuth angle of about 45°. In case that the in-plane retardation value $R_o$ of the second retardation layer 1300 is about 100 nm (see $R_o$_100 in FIG. 21), the luminance may have a value of about 76 nits at the azimuth angle of about 45°. In case that the in-plane retardation value $R_o$ of the second retardation layer 1300 is about 90 nm (see $R_o$_90 in FIG. 21), the luminance may have a value of about 80 nits at the azimuth angle of about 45°. In case that the in-plane retardation value $R_o$ of the second retardation layer 1300 is about 80 nm (see $R_o$_80 in FIG. 21), the luminance may have a value of about 85 nits at the azimuth angle of about 45°. In case that the in-plane retardation value $R_o$ of the second retardation layer 1300 is about 70 nm (see $R_o$_70 in FIG. 21), the luminance may have a value of about 90 nits at the azimuth angle of about 45°.

For example, in case that the in-plane retardation value $R_o$ of the second retardation layer 1300 is about 120 nm, the luminance may have a value of about 44 nits at the azimuth angle of about 135°. In case that the in-plane retardation value $R_o$ of the second retardation layer 1300 is about 110 nm, the luminance may have a value of about 39 nits at the azimuth angle of about 135°. In case that the in-plane retardation value $R_o$ of the second retardation layer 1300 is 100 nm, the luminance may have a value of about 31 nits at the azimuth angle of about 135°. When the in-plane retardation value $R_o$ of the second retardation layer 1300 is about 90 nm, the luminance may have a value of about 25 nits at the azimuth angle of about 135°. In case that the in-plane retardation value $R_o$ of the second retardation layer 1300 is about 80 nm, the luminance may have a value of about 22 nits at the azimuth angle of about 135°. In case that the in-plane retardation value $R_o$ of the second retardation layer 1300 is about 70 nm, the luminance may have a value of about 17 nits at the azimuth angle of about 1350.

As shown in FIG. 21, as the in-plane retardation value $R_o$ of the second retardation layer 1300 decreases, the ratio of luminance at the azimuth angle of about 45° to luminance at the azimuth angle of about 0° may increase. For example, as the in-plane retardation value $R_o$ of the second retardation layer 1300 decreases, the ratio of luminance at the azimuth angle of about 135° to luminance at the azimuth angle of about 0° may decrease.

Figure 22:
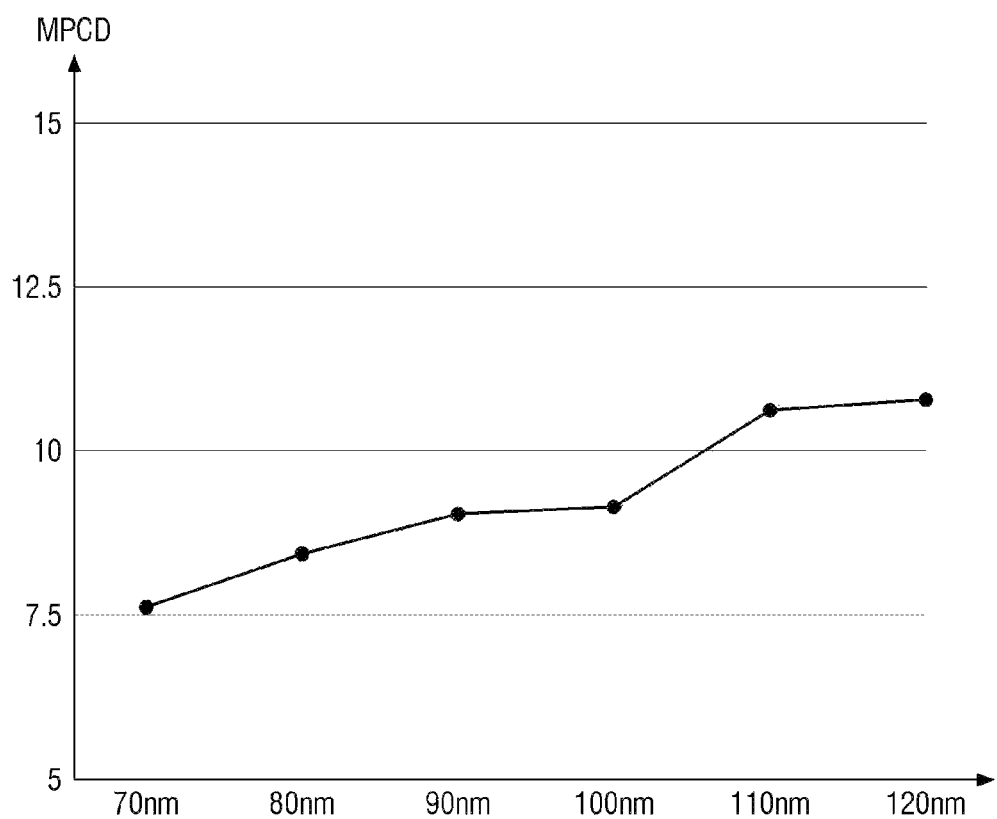
FIG. 22 is a graph showing a minimum perceptible color difference depending on an in-plane retardation value of a second retardation layer, in the display device including the polarizing plate according to the embodiment of FIG. 9.

FIG. 22 is a graph showing a minimum perceptible color difference depending on an in-plane retardation value of a second retardation layer, in the display device including the polarizing plate according to the embodiment of FIG. 9. In FIG. 22, the horizontal axis indicates the in-plane retardation value $R_o$ of the second retardation layer 1300, and the vertical axis indicates a minimum perceptible color difference.

The in-plane retardation value $R_o$ of the second retardation layer 1300 may correspond to the in-plane retardation value $R_o$ at about 550 nm of the second retardation layer 1300. The minimum perceptible color difference (MPCD) means a minimum value of perceptible color difference. It is said that in case that a viewer compares two displays side by side, the viewer may perceive a color difference in case that the color difference value Δu'v' exceeds a certain level. For example, it is known that the viewer feels a color difference in case that the maximum color difference value is equal to or greater than about 0.0050. Since 1 MPCD corresponds to about 0.0005 Δu'v', the MPCD may be about 10 or less, and the in-plane retardation value $R_o$ of the second retardation layer 1300 satisfying this condition may be about 100 nm or less as shown in FIG. 22.

In summary, as shown in FIGS. 21 and 22, as the in-plane retardation value $R_o$ of the second retardation layer 1300 decreases, the ratio of luminance at the azimuth angle of about 45° to luminance at the azimuth angle of about 0° may increase, and as the in-plane retardation value $R_o$ of the second retardation layer 1300 decreases, the ratio of luminance at the azimuth angle of about 135° to luminance at the azimuth angle of about 0° may decrease, but the in-plane retardation value $R_o$ of the second retardation layer 1300 satisfying that the MPCD considering both perceived levels of color and luminance is 10 or less may be about 100 nm or less.

Figure 23:
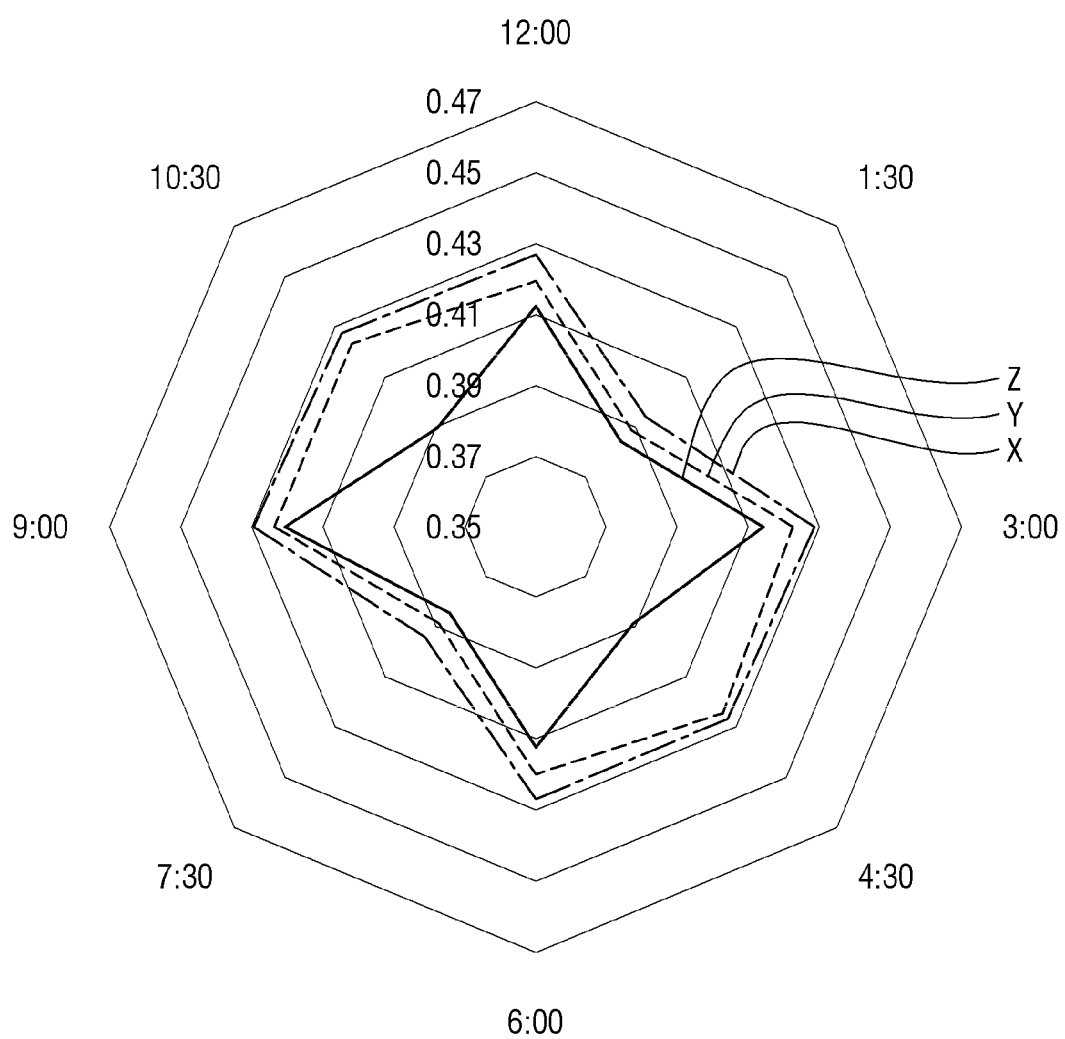
FIG. 23 is a schematic diagram illustrating a luminance ratio of light expressed in a CIE color coordinate system in case that an in-plane retardation value of a second retardation layer is 100 nm, in the display device including the polarizing plate according to the embodiment of FIG. 9.
Figure 24:
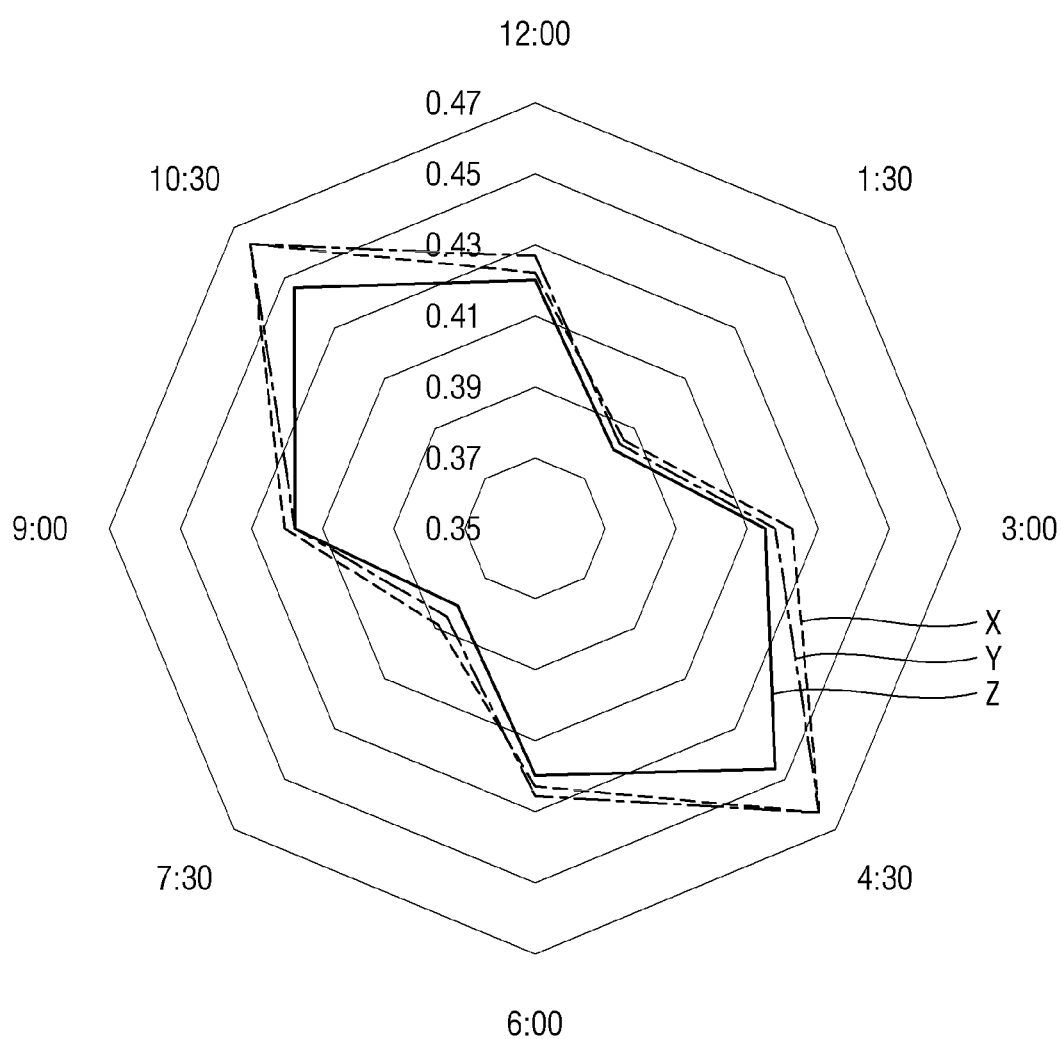
FIG. 24 is a schematic diagram illustrating a luminance ratio of light expressed in a CIE color coordinate system in case that an in-plane retardation value of a second retardation layer is 70 nm, in the display device including the polarizing plate according to the embodiment of FIG. 9.

FIG. 23 is a schematic diagram illustrating a luminance ratio of light expressed in a CIE color coordinate system in case that an in-plane retardation value of a second retardation layer is about 100 nm, in the display device including the polarizing plate according to the embodiment of FIG. 9. FIG. 24 is a schematic diagram illustrating a luminance ratio of light expressed in a CIE color coordinate system in case that an in-plane retardation value of a second retardation layer is about 70 nm, in the display device including the polarizing plate according to the embodiment of FIG. 9.

FIGS. 23 and 24 show the luminance ratio of red light X, the luminance ratio of green light Y, and the luminance ratio of blue light Z expressed as CIE XYZ tristimulus values measured in a state where the display device 10 displays white light at maximum luminance. In FIGS. 23 and 24, 1:30, 3:00, 4:30, 6:00, 7:30, 9:00, 10:30, and 12:00 indicate a clock's hour hand direction on a plane defined by the first direction DR1 and the second direction DR2 with respect to an origin OP, which is the center portion of the top surface (or upper surface) of the display device 10.

Referring to FIGS. 23 and 24, the in-plane retardation value $R_o$ of the second retardation layer 1300 may correspond to the in-plane retardation value $R_o$ at about 550 nm of the second retardation layer 1300. In case that the in-plane retardation value $R_o$ of the second retardation layer 1300 is about 100 nm, in the 4:30 o'clock direction and the 10:30 o'clock direction, the luminance ratio of the red light X and the luminance ratio of the green light Y may be about 0.41, whereas the luminance ratio of the blue light Z is only about 0.37. For example, in case that the in-plane retardation value $R_o$ of the second retardation layer 1300 is about 100 nm, in the 4:30 o'clock direction and the 10:30 o'clock direction, there is a difference of about 10% between the luminance ratio of the red light X or the luminance ratio of the green light Y and the luminance ratio of the blue light Z.

In comparison, in case that the in-plane retardation value $R_o$ of the second retardation layer 1300 is about 70 nm, in the 4:30 o'clock direction and the 10:30 o'clock direction, the luminance ratio of the red light X and the luminance ratio of the green light Y may be about 0.46, whereas the luminance ratio of the blue light Z is close to 0.43. For example, in case that the in-plane retardation value $R_o$ of the second retardation layer 1300 is about 70 nm, in the 4:30 o'clock direction and the 10:30 o'clock direction, there is a difference of about 5% between the luminance ratio of the red light X or the luminance ratio of the green light Y and the luminance ratio of the blue light Z.

As such, in case that the in-plane retardation value $R_o$ of the second retardation layer 1300 is about 70 nm, the difference between the luminance ratio of the red light X or the luminance ratio of the green light Y and the luminance ratio of the blue light Z may be reduced compared to the case where the in-plane retardation value $R_o$ of the second retardation layer 1300 is about 100 nm. Therefore, the difference between the luminance ratio of the red light X or the luminance ratio of the green light Y and the luminance ratio of the blue light Z may be less than about 10%. Accordingly, the in-plane retardation value $R_o$ of the second retardation layer 1300 may be less than about 100 nm.

As described with reference to FIGS. 20 and 22, in case that the maximum color difference value is considered, the in-plane retardation value $R_o$ of the second retardation layer 1300 may be equal to or less than about 100 nm. However, as shown in FIGS. 23 and 24, in order to reduce the difference between the luminance ratio of the red light X or the luminance ratio of the green light Y and the luminance ratio of the blue light Z to less than about 10%, the in-plane retardation value $R_o$ of the second retardation layer 1300 may be than about 100 nm.

Figure 25A:
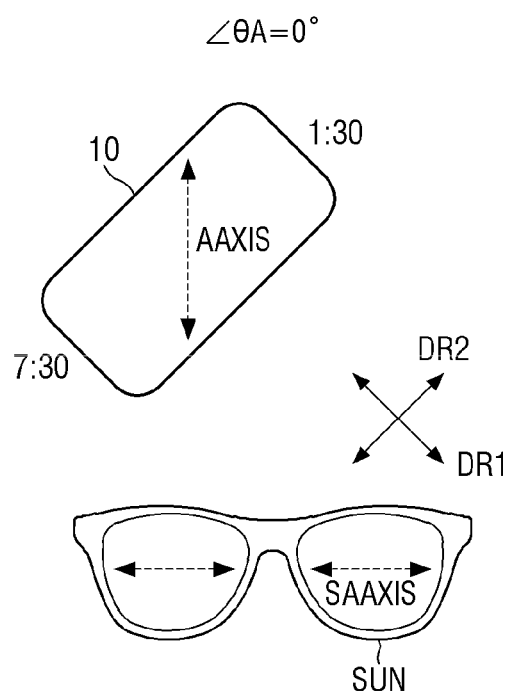
FIGS. 25A, 25B, 25C, and 25D are schematic diagrams illustrating angles between an absorption axis of a polarizer of a polarizing plate of a display device and an absorption axis of polarized sunglasses.

FIG. 25A is a schematic diagram illustrating an angle between an absorption axis of a polarizer of a polarizing plate of a display device and an absorption axis of polarized sunglasses.

Referring to FIG. 25A, it is shown that the absorption axis AAXIS of the polarizer 1100 of the polarizing plate POL of the display device 10 is inclined by about 45° with respect to the first direction DR1, which is the short side direction of the display device 10, and an absorption axis SAAXIS of polarized sunglasses SUN is in a direction parallel to the first direction DR1.

As shown in FIG. 25A, in case that the upper side of the display device 10 is disposed in the 1:30 o'clock direction and the lower side of the display device 10 is disposed in the 7:30 o'clock direction, an angle ∠θA between the absorption axis AAXIS of the polarizer 1100 and the absorption axis SAAXIS of the polarized sunglasses SUN may be about 0°.

Figure 25B:
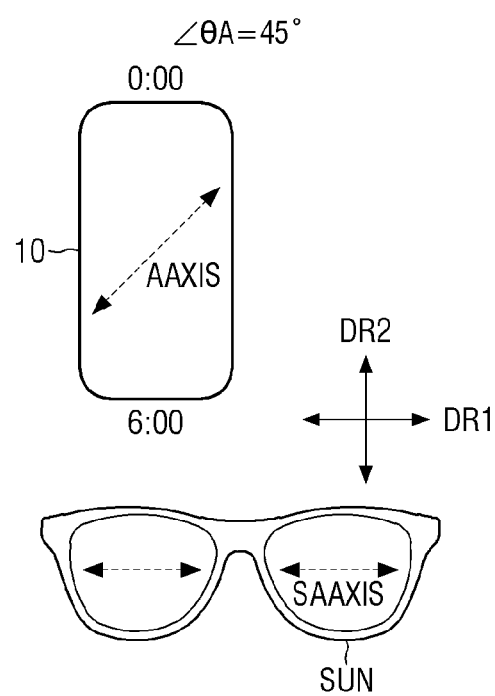

As shown in FIG. 25B, in case that the upper side of the display device 10 is disposed in the 0:00 o'clock direction and the lower side of the display device 10 is disposed in the 6:00 o'clock direction, the angle ∠θA between the absorption axis AAXIS of the polarizer 1100 and the absorption axis SAAXIS of the polarized sunglasses SUN may be about 45°.

Figure 25C:
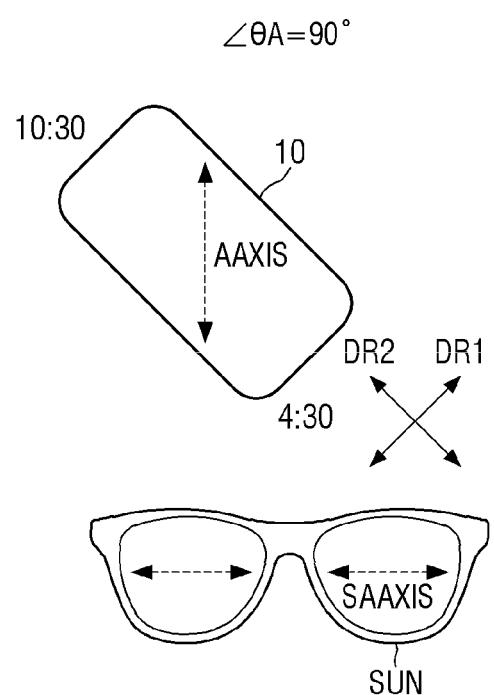

As shown in FIG. 25C, in case that the upper side of the display device 10 is disposed in the 10:30 o'clock direction and the lower side of the display device 10 is disposed in the 4:30 o'clock direction, an angle ∠θA between the absorption axis AAXIS of the polarizer 1100 and the absorption axis SAAXIS of the polarized sunglasses SUN may be about 90°.

Figure 25D:
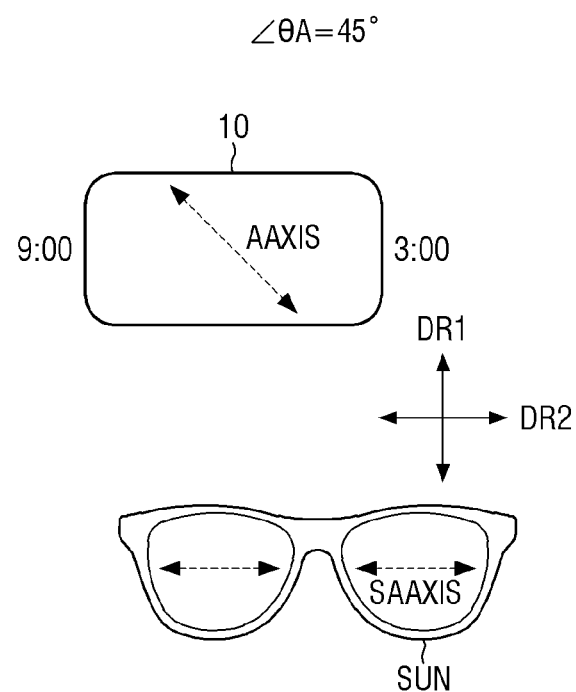

As shown in FIG. 25D, in case that the upper side of the display device 10 is disposed in the 3:00 o'clock direction and the lower side of the display device 10 is disposed in the 9:00 o'clock direction, the angle ∠θA between the absorption axis AAXIS of the polarizer 1100 and the absorption axis SAAXIS of the polarized sunglasses SUN may be about 45°.

Figure 25E:
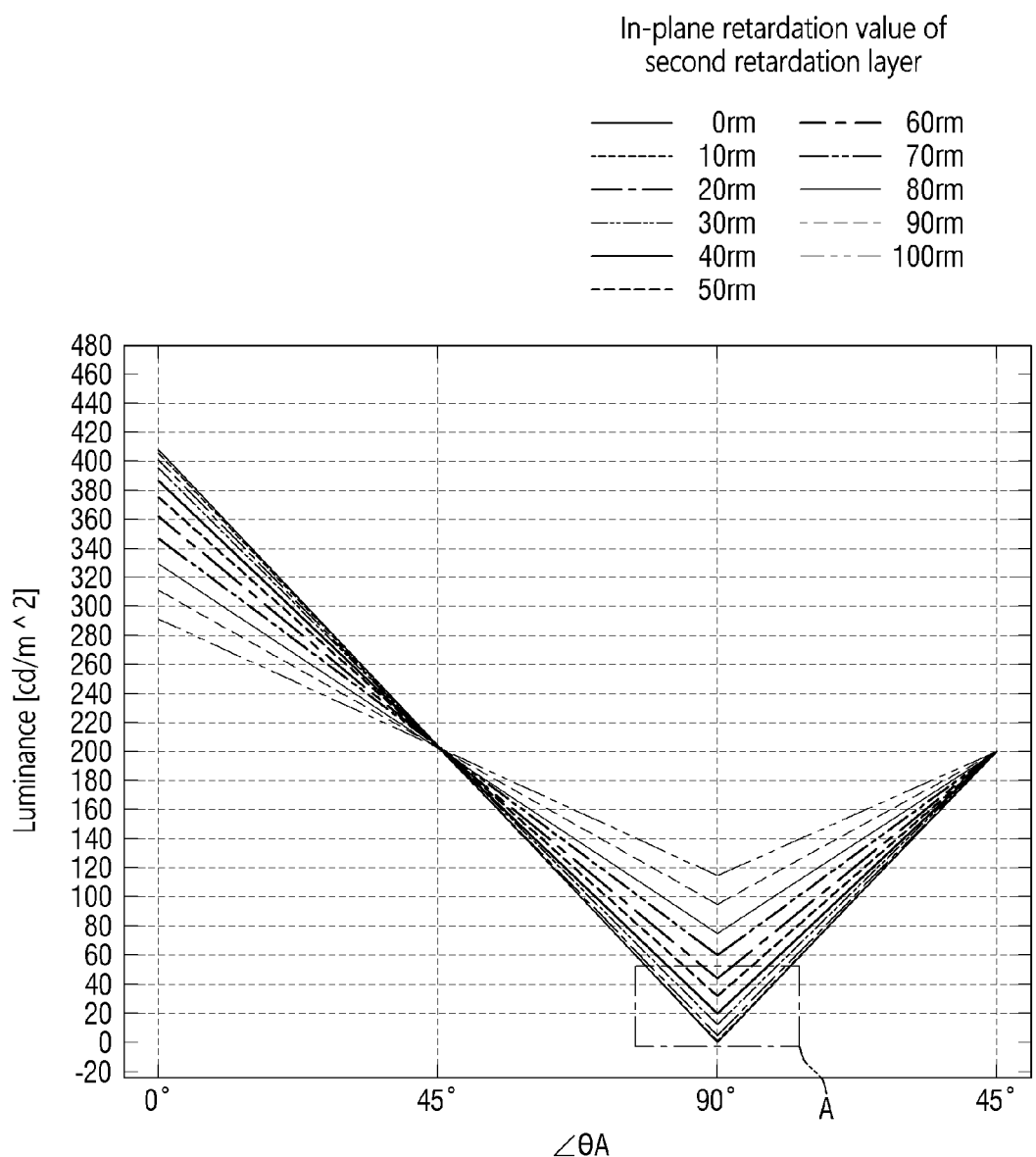
FIG. 25E is a graph showing luminance of a display device measured after wearing polarized sunglasses depending on an angle between an absorption axis of a polarizer of a polarizing plate of a display device and an absorption axis of polarized sunglasses for each in-plane retardation value of a second retardation layer.
Figure 25F:
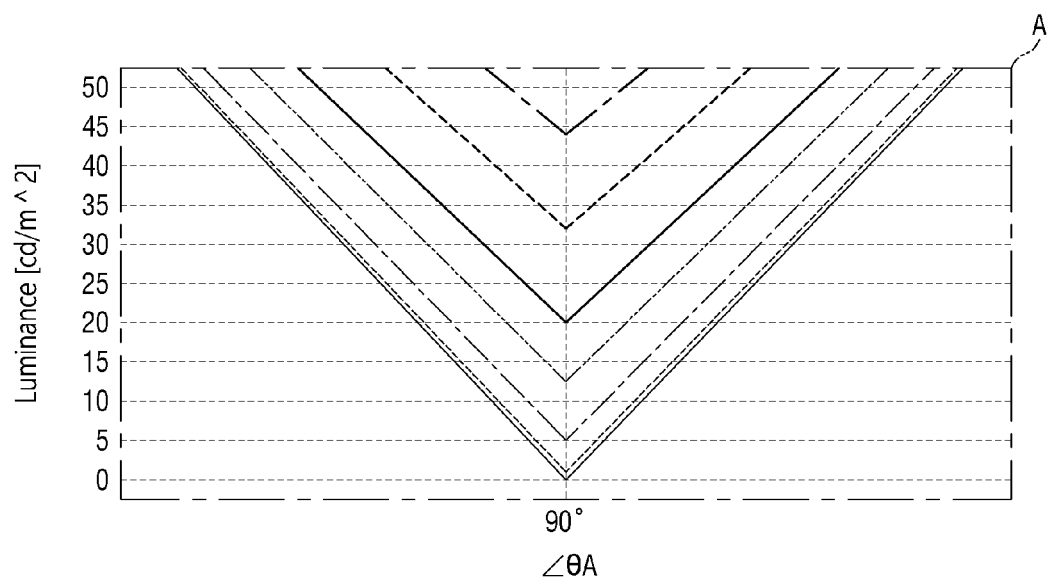
FIG. 25F is an enlarged graph showing area A of FIG. 25E.

FIG. 25E is a graph showing luminance of a display device measured after wearing polarized sunglasses depending on an angle between an absorption axis of a polarizer of a polarizing plate of a display device and an absorption axis of polarized sunglasses for each in-plane retardation value of a second retardation layer. FIG. 25F is an enlarged graph showing area A of FIG. 25E.

Referring to FIGS. 25E and 25F, the horizontal axis indicates the angle ∠θA between the absorption axis AAXIS of the polarizer 1100 and the absorption axis SAAXIS of the polarized sunglasses SUN shown in FIGS. 25A, 25B, 25C, and 25D. The vertical axis indicates the luminance of the display device 10 measured after wearing the polarized sunglasses SUN in case that all pixels of the display device 10 display white light at maximum luminance.

For each in-plane retardation value $R_o$ of the second retardation layer 1300, the luminance of the display device 10 measured after wearing the sunglasses is the highest in case that the angle ∠θA between the absorption axis AAXIS of the polarizer 1100 and the absorption axis SAAXIS of the polarized sunglasses SUN is about 0°. In case that the angle ∠θA between the absorption axis AAXIS of the polarizer 1100 and the absorption axis SAAXIS of the polarized sunglasses SUN is about 90°, an angle between the transmission axis TAXIS of the polarizer 1100 of the display device 10 and the absorption axis SAAXIS of the polarized sunglasses SUN may substantially correspond to about 0°. Therefore, in case that the angle ∠θA between the absorption axis AAXIS of the polarizer 1100 and the absorption axis SAAXIS of the polarized sunglasses SUN is about 90°, the luminance of the display device 10 measured after wearing the sunglasses may be the lowest.

In case that the angle ∠θA between the absorption axis AAXIS of the polarizer 1100 and the absorption axis SAAXIS of the polarized sunglasses SUN is about 90°, as the in-plane retardation value $R_o$ of the second retardation layer 1300 decreases, the luminance of the display device 10 measured after wearing the polarized sunglasses SUN may be lowered. For example, the luminance of the display device 10 measured after wearing the polarized sunglasses SUN may be proportional to the in-plane retardation value $R_o$ of the second retardation layer 1300.

As shown in FIG. 25F, in case that the in-plane retardation value $R_o$ of the second retardation layer 1300 is about 10 nm, the luminance of the image of the display device 10 viewed by the viewer wearing the polarized sunglasses SUN may be lower than a minimum threshold value of about 5 nits. Therefore, visibility of the image of the display device 10 viewed by the viewer wearing the polarized sunglasses SUN may be very low. Accordingly, in order to ensure the quality of the image of the display device 10 viewed by the viewer wearing the polarized sunglasses SUN, the in-plane retardation value $R_o$ of the second retardation layer 1300 may be equal to or greater than about 20 nm.

In summary, as shown in FIGS. 23 and 24, in order to minimize the difference between the luminance ratio of the red light X, the luminance ratio of the green light Y, and the luminance ratio of the blue light Z, and as shown in FIGS. 25A to 25F, to ensure the visibility of the image of the display device 10 viewed by the viewer wearing the polarized sunglasses SUN, the in-plane retardation value $R_o$ of the second retardation layer 1300 may be equal to or greater than about 20 nm, and less than about 100 nm.

Figure 26:
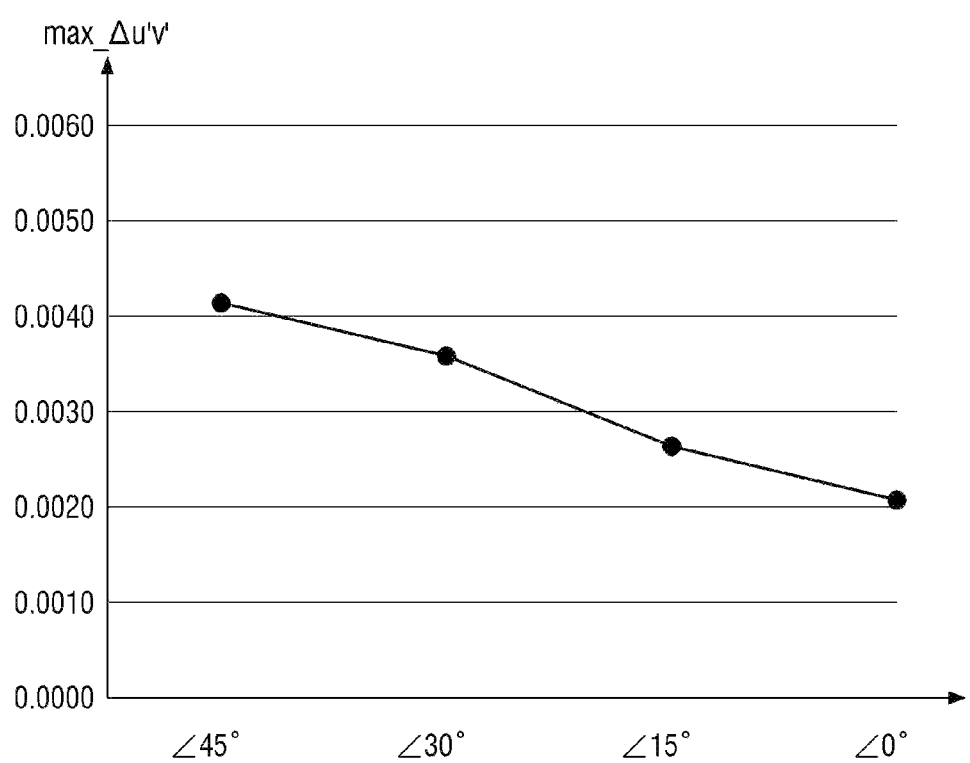
FIG. 26 is a graph showing a maximum color difference value depending on an angle between a retardation axis of a second retardation layer and an absorption axis of a polarizer in case that an in-plane retardation value of the second retardation layer is 100 nm, in the display device including the polarizing plate according to the embodiment of FIG. 9.

FIG. 26 is a graph showing a maximum color difference value depending on an angle between a retardation axis of a second retardation layer and an absorption axis of a polarizer in case that an in-plane retardation value $R_o$ of the second retardation layer is about 100 nm, in the display device including the polarizing plate according to the embodiment of FIG. 9.

In FIG. 26, the horizontal axis indicates an angle between the retardation axis SAXIS2 of the second retardation layer 1300 and the absorption axis AAXIS of the polarizer 1100, and the vertical axis indicates the maximum color difference value max_Δu'v'.

Referring to FIG. 26, in case that the in-plane retardation value $R_o$ of the second retardation layer 1300 is about 100 nm, as the angle between the retardation axis SAXIS2 of the second retardation layer 1300 and the absorption axis AAXIS of the polarizer 1100 increases, the maximum color difference value max_Δu'v' may increase.

Figure 27:
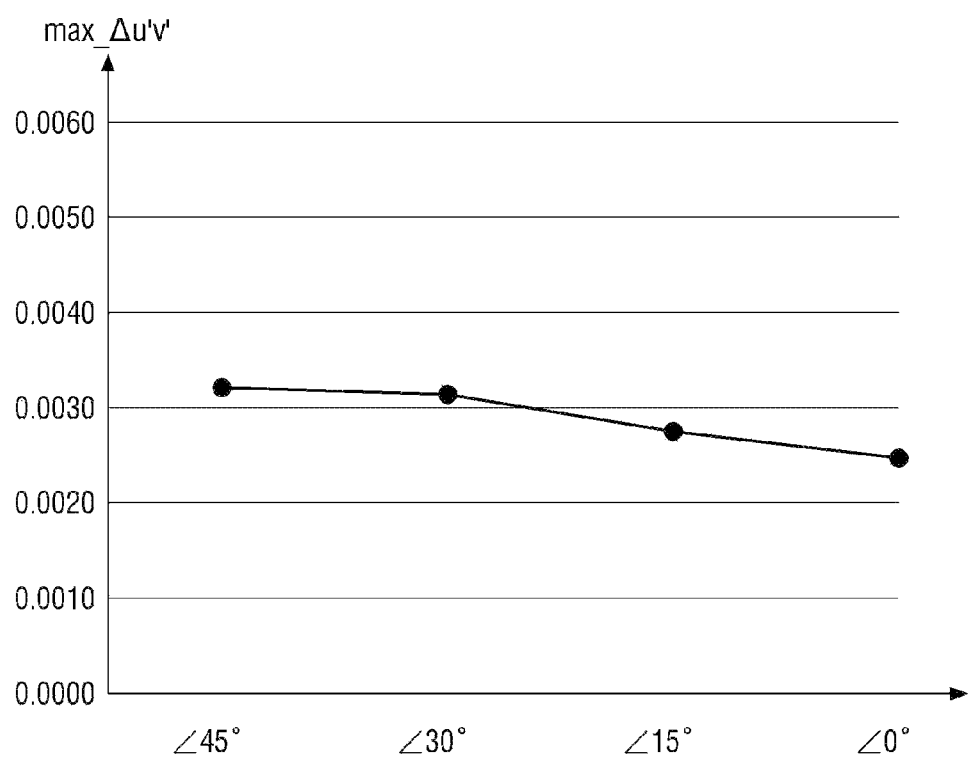
FIG. 27 is a graph showing a maximum color difference value max_Δu'v' depending on an angle between a retardation axis of a second retardation layer and an absorption axis of a polarizer in case that an in-plane retardation value of the second retardation layer is 70 nm, in the display device including the polarizing plate according to the embodiment of FIG. 9.

FIG. 27 is a graph showing a maximum color difference value max_Δu'v' depending on an angle between a retardation axis of a second retardation layer and an absorption axis of a polarizer in case that an in-plane retardation value $R_o$ of the second retardation layer is about 70 nm, in the display device including the polarizing plate according to the embodiment of FIG. 9.

In FIG. 27, the horizontal axis indicates the angle between the retardation axis SAXIS2 of the second retardation layer 1300 and the absorption axis AAXIS of the polarizer 1100, and the vertical axis indicates the maximum color difference value max_Δu'v'.

Referring to FIG. 27, in case that the in-plane retardation value $R_o$ of the second retardation layer 1300 is about 70 nm, as the angle between the retardation axis SAXIS2 of the second retardation layer 1300 and the absorption axis AAXIS of the polarizer 1100 increases, the maximum color difference value max_Δu'v' may increase.

As shown in FIGS. 26 and 27, regardless of the in-plane retardation value $R_o$ of the second retardation layer 1300, the maximum color difference value max_Δu'v' may increase as the angle between the retardation axis SAXIS2 of the second retardation layer 1300 and the absorption axis AAXIS of the polarizer 1100 increases.

Figure 25G:
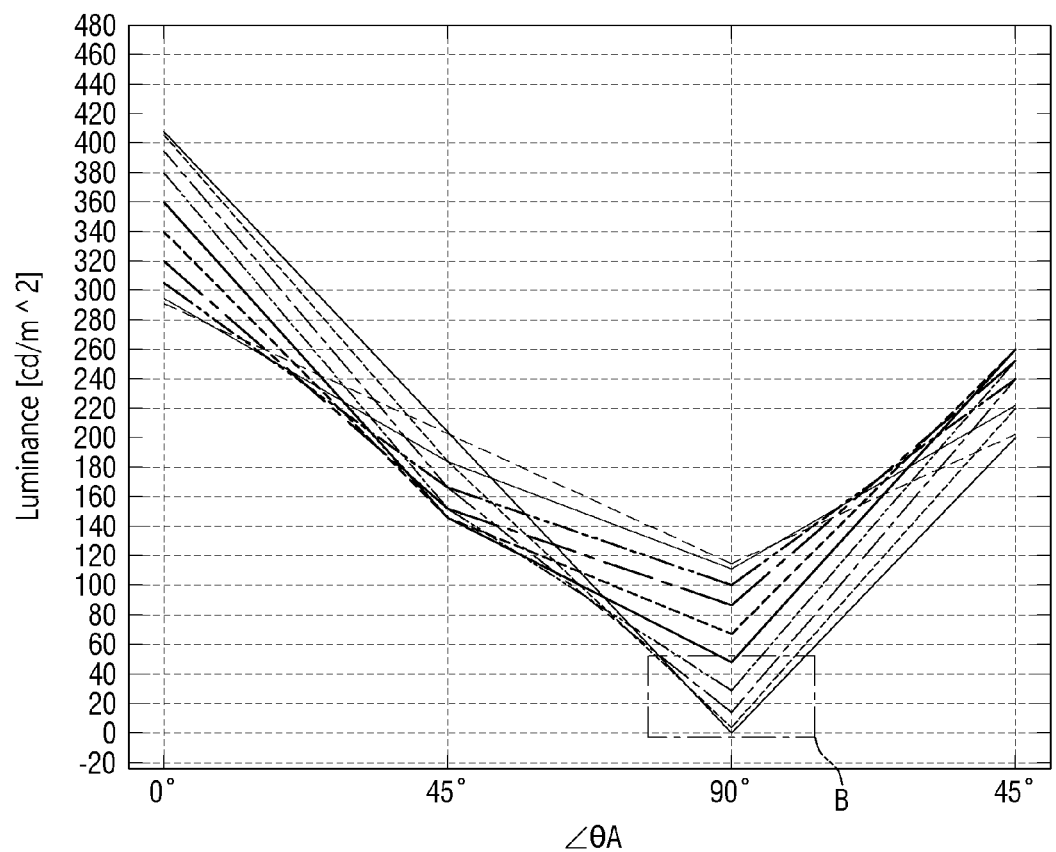
FIG. 25G is a graph showing luminance of a display device measured after wearing polarized sunglasses depending on an angle between an absorption axis of a polarizer of a polarizing plate of a display device and an absorption axis of the polarized sunglasses for each angle between a retardation axis of a second retardation layer and the absorption axis of the polarizer.
Figure 25H:
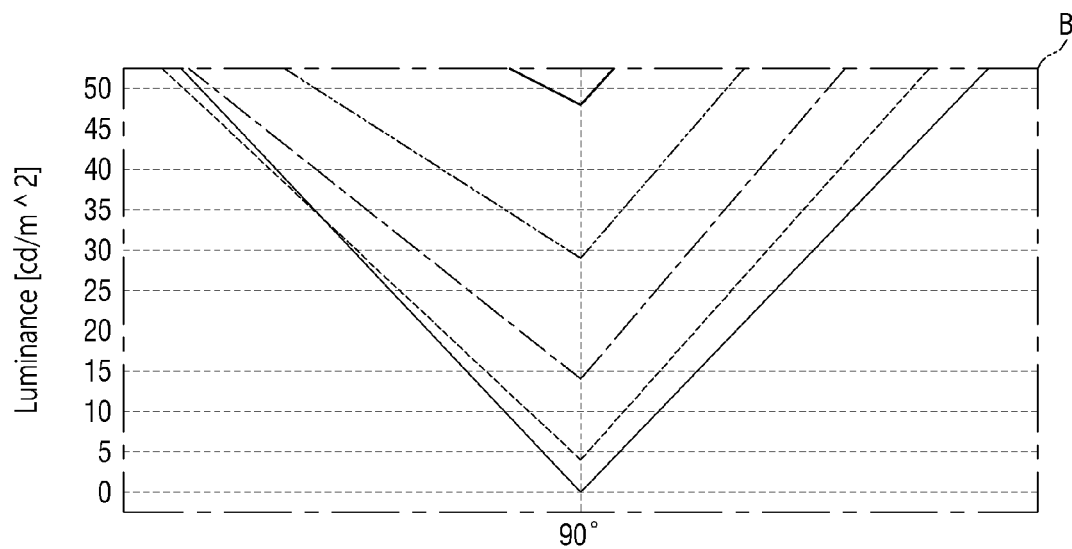
FIG. 25H is an enlarged graph showing area B of FIG. 25G.

FIG. 25G is a graph showing luminance of a display device measured after wearing polarized sunglasses depending on an angle between an absorption axis of a polarizer of a polarizing plate of a display device and an absorption axis of the polarized sunglasses for each angle between a retardation axis of a second retardation layer and the absorption axis of the polarizer. FIG. 25H is an enlarged graph showing area B of FIG. 25G.

Referring to FIGS. 25A, 25B, 25C, 25D, 25G, and 25H, the horizontal axis indicates the angle ∠θA between the absorption axis AAXIS of the polarizer 1100 and the absorption axis SAAXIS of the polarized sunglasses SUN shown in FIGS. 25A, 25B, 25C, and 25D. The vertical axis indicates the luminance of the display device 10 measured after wearing the polarized sunglasses SUN in case that all pixels of the display device 10 display white light at maximum luminance.

For each angle between the retardation axis SAXIS2 of the second retardation layer 1300 and the absorption axis AAXIS of the polarizer 1100, the luminance of the display device 10 measured after wearing the sunglasses is the highest in case that the angle ∠θA between the absorption axis AAXIS of the polarizer 1100 and the absorption axis SAAXIS of the polarized sunglasses SUN is about 0°. In case that the angle ∠θA between the absorption axis AAXIS of the polarizer 1100 and the absorption axis SAAXIS of the polarized sunglasses SUN is about 90°, the angle between the transmission axis TAXIS of the polarizer 1100 of the display device 10 and the absorption axis SAAXIS of the polarized sunglasses SUN may substantially correspond to about 0°. Therefore, in case that the angle ∠θA between the absorption axis AAXIS of the polarizer 1100 and the absorption axis SAAXIS of the polarized sunglasses SUN is about 90°, the luminance of the display device 10 measured after wearing the sunglasses may be the lowest.

In case that the angle ∠θA between the absorption axis AAXIS of the polarizer 1100 and the absorption axis SAAXIS of the polarized sunglasses SUN is about 90°, as the angle between the retardation axis SAXIS2 of the second retardation layer 1300 and the absorption axis AAXIS of the polarizer 1100 decreases, the luminance of the display device 10 measured after wearing the polarized sunglasses SUN may be lowered. For example, the luminance of the display device 10 measured after wearing the polarized sunglasses SUN may be proportional to the angle between the retardation axis SAXIS2 of the second retardation layer 1300 and the absorption axis AAXIS of the polarizer 1100.

As shown in FIG. 25H, in case that the angle ∠θA between the absorption axis AAXIS of the polarizer 1100 and the absorption axis SAAXIS of the polarized sunglasses SUN is about 90°, and the angle between the retardation axis SAXIS2 of the second retardation layer 1300 and the absorption axis AAXIS of the polarizer 1100 is about 5°, the luminance of the image of the display device 10 viewed by the viewer wearing the polarized sunglasses SUN may be lower than the minimum threshold value of about 5 nits. Therefore, the visibility of the image of the display device 10 viewed by the viewer wearing the polarized sunglasses SUN may be very low. Accordingly, in order to ensure the quality of the image of the display device 10 viewed by the viewer wearing the polarized sunglasses SUN, the angle between the retardation axis SAXIS2 of the second retardation layer 1300 and the absorption axis AAXIS of the polarizer 1100 may be equal to or greater than about 10°.

In order to minimize the maximum color difference value max_Δu'v' as shown in FIGS. 26 and 27 and ensure the visibility of the image of the display device 10 viewed by the viewer wearing the polarized sunglasses SUN as shown in FIGS. 25A, 25B, 25C, 25D, 25G, and 25H, the angle between the retardation axis SAXIS2 of the second retardation layer 1300 and the absorption axis AAXIS of the polarizer 1100 may be about 10° to about 45°, e.g., about 15° to about 40°.

Figure 28:
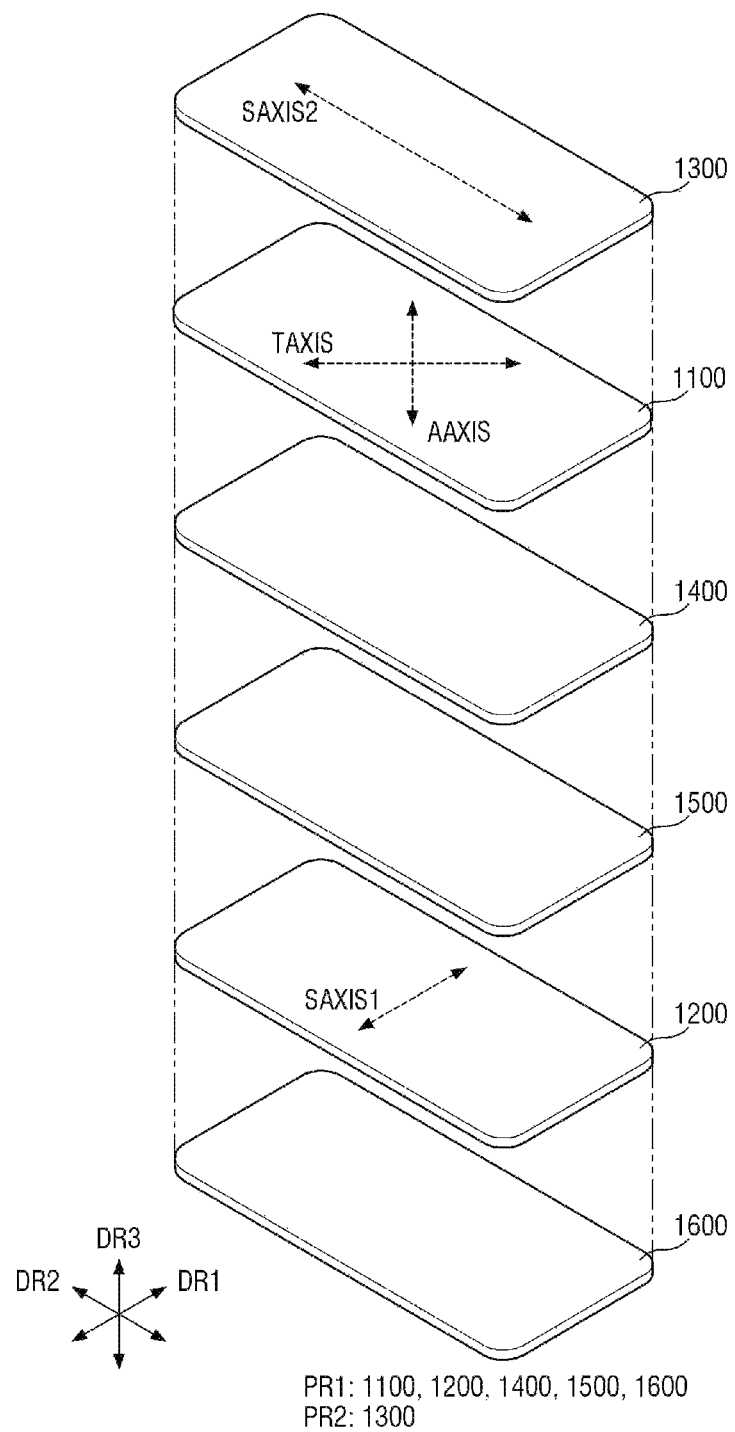
FIG. 28 is an exploded schematic perspective view illustrating a polarizing plate according to another embodiment.

FIG. 28 is an exploded schematic perspective view illustrating a polarizing plate according to another embodiment.

Referring to FIG. 28, the polarizing plate POL may include the polarizer 1100, the first retardation layer 1200, the second retardation layer 1300, the protective film 1400, a first cohesion 1500, and a second cohesion 1600. For example, the first part PR1 of the polarizing plate POL may include the polarizer 1100, the first retardation layer 1200, the protective film 1400, the first cohesion 1500, and the second cohesion 1600. Since the polarizing plate POL shown in FIG. 28 is the same as the polarizing plate POL described in conjunction with FIG. 9 except that it further includes the first cohesion 1500 and the second cohesion 1600, the redundant descriptions will be omitted for descriptive convenience.

The first cohesion 1500 may be disposed between the protective film 1400 and the first retardation layer 1200, and the second cohesion 1600 may be disposed on the bottom surface (or lower surface) of the first retardation layer 1200. With respect to the first retardation layer 1200, the first cohesion 1500 may be disposed on the viewer side, and the second cohesion 1600 may be disposed on the panel side.

The first cohesion 1500 and the second cohesion 1600 may have appropriate adhesion, transparency, and thermal stability so that delamination or bubbles do not occur in handling the laminate.

As the first cohesion 1500 and the second cohesion 1600, conventional or later developed adhesives may be used. For example, the first cohesion 1500 and the second cohesion 1600 may be any one selected from an acrylic cohesion, a rubber-based cohesion, a silicone-based cohesion, a urethane-based cohesion, a polyvinyl alcohol-based cohesion, a polyvinylpyrrolidone-based cohesion, a polyacrylamide-based cohesion, a cellulose-based cohesion, and a vinylalkyl ether-based cohesion. The first cohesion 1500 and the second cohesion 1600 are not limited as long as they have adhesion and viscoelasticity, but may be acrylic cohesions in terms of ease of acquisition and the like. For example, they may include a (meth)acrylate copolymer, a crosslinking agent, a solvent, and the like.

For example, as the crosslinking agent, a conventional or later developed crosslinking agent may be used. For example, the crosslinking agent may include any one of a polyisocyanate compound, epoxy resin, melamine resin, urea resin, dialdehydes, and a methylol polymer. For example, the crosslinking agent may include a polyisocyanate compound.

For example, as the solvent, a common/typical/general solvent used in the field of the resin composition may be used. For example, as the solvent, an alcohol-based compound such as methanol, ethanol, isopropanol, butanol, propylene glycol, methoxy alcohol; a ketone-based compound such as methyl ethyl ketone, methyl butyl ketone, methyl isobutyl ketone, diethyl ketone, and dipropyl ketone; an acetate-based compound such as methyl acetate, ethyl acetate, butyl acetate, and propylene glycol methoxy acetate; a cellosolve compound such as methyl cellosolve, ethyl cellosolve, and propyl cellosolve; and a hydrocarbon-based compound such as hexane, heptane, benzene, toluene, and xylene may be used, and these may be used alone or in combination of two or more.

In another example, the first cohesion 1500 may be replaced with an adhesive (layer). For example, the first cohesion 1500 may be formed by coating an adhesive composition on the bottom surface (or lower surface) of the protective film 1400 to be attached thereto, and by crosslinking the adhesive composition through an exposure process.

As the adhesive, a conventional or later developed adhesive may be used. For example, a photocurable adhesive may be used as the adhesive. The photocurable adhesive may be crosslinked and cured by receiving active energy rays such as ultraviolet (UV) rays and electron beams (EB) to have strong adhesion. The photocurable adhesive may include a reactive oligomer, a reactive monomer, and a photopolymerization initiator.

The reactive oligomer may be an important component that determines the properties of an adhesive, and forms a cured layer by forming a polymer bond through a photopolymerization reaction. The reactive oligomer may be any one of polyester-based resin, polyether-based resin, polyurethane-based resin, epoxy-based resin, polyacrylic resin, and silicone-based resin.

The reactive monomer may function as a crosslinking agent and diluent for the reactive oligomer and affects the adhesive properties. The reactive monomer may be any one of a monofunctional monomer, a polyfunctional monomer, an epoxy-based monomer, vinyl ethers, and cyclic ethers.

The photopolymerization initiator may function to initiate photopolymerization by absorbing light energy and generating radicals or cations. A suitable photopolymerization initiator may be selected and used according to photopolymerization resin.

In order to improve the adhesion between the first cohesion 1500 and the second cohesion 1600, primer treatment, plasma treatment, corona treatment, and saponification (alkali) surface treatment may be performed to/on the attachment surfaces of the first retardation layer 1200 and the protective film 1400.

Figure 29:
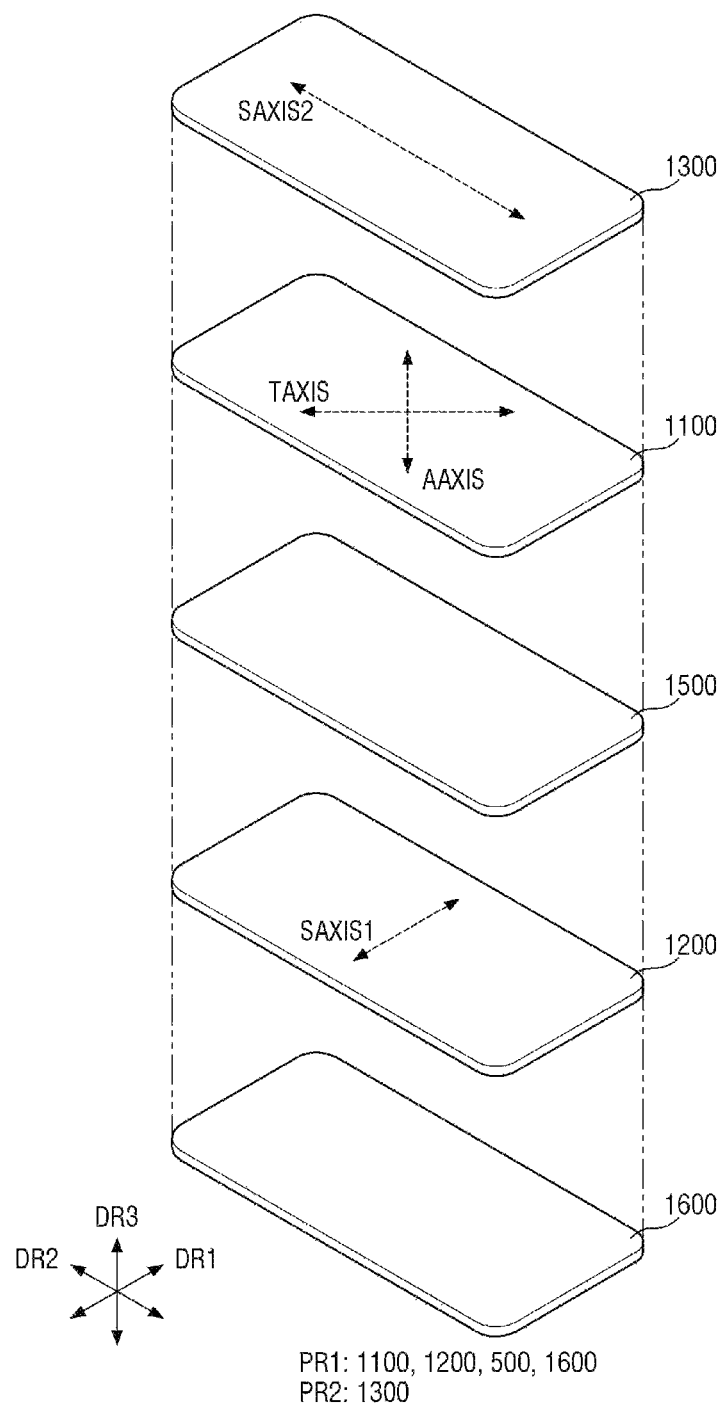
FIG. 29 is an exploded schematic perspective view illustrating a polarizing plate according to still another embodiment.

FIG. 29 is an exploded schematic perspective view illustrating a polarizing plate according to still another embodiment.

Referring to FIG. 29, the polarizing plate POL may include the polarizer 1100, the first retardation layer 1200, the second retardation layer 1300, the first cohesion 1500, and the second cohesion 1600. For example, the first part PR1 of the polarizing plate POL may include the polarizer 1100, the first retardation layer 1200, the first cohesion 1500, and the second cohesion 1600. Since the polarizing plate POL shown in FIG. 29 is the same as the polarizing plate POL described in conjunction with FIG. 28 in that it does not include the protective film 1400, the redundant descriptions will be omitted for descriptive convenience.

For the function as an antireflection unit of the first part PR1, an in-plane retardation value $R_o$ of the first part PR1, which includes the polarizer 1100 and the first retardation layer 1200, at a wavelength of about 550 nm may be in a range of about 100 nm to about 180 nm. For example, $R_o(450)/R_o(550)$ of the first part PR1 may be about 1.00 or less. The $R_o(450)$ may be the in-plane retardation value of the first part PR1 at a wavelength of about 450 nm, and the $R_o(550)$ may be the in-plane retardation value of the first part PR1 at a wavelength of about 550 nm.

Figure 30:
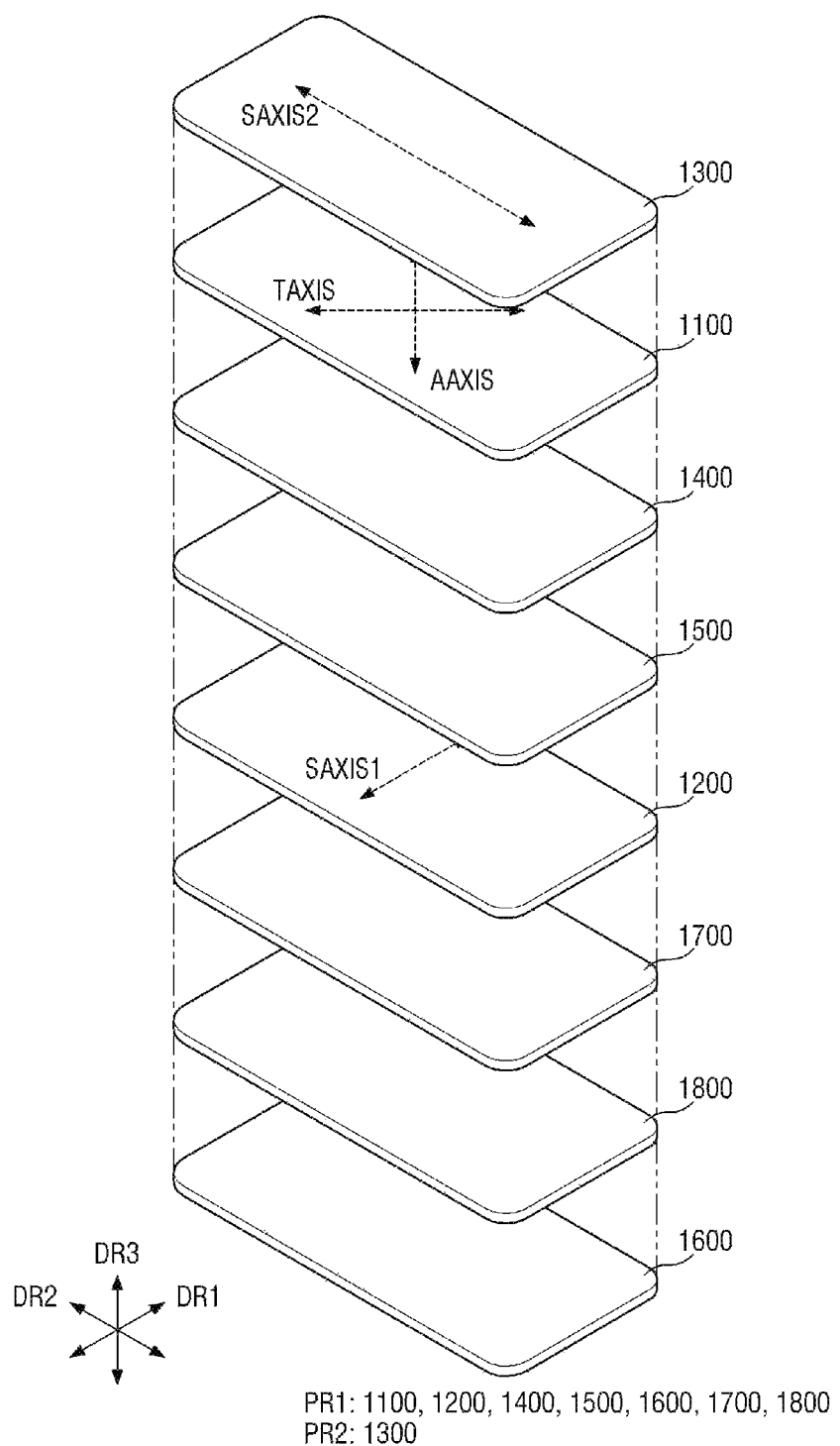
FIG. 30 is an exploded schematic perspective view illustrating a polarizing plate according to still another embodiment.

FIG. 30 is an exploded schematic perspective view illustrating a polarizing plate according to still another embodiment.

Referring to FIG. 30, the polarizing plate POL may include the polarizer 1100, the first retardation layer 1200, the second retardation layer 1300, the protective film 1400, the first cohesion 1500, the second cohesion 1600, an adhesive 1700, and a positive C retardation layer 1800. For example, the first part PR1 of the polarizing plate POL may include the polarizer 1100, the first retardation layer 1200, the protective film 1400, the first cohesion 1500, the second cohesion 1600, the adhesive 1700, and the positive C retardation layer 1800. The polarizing plate POL shown in FIG. 30 is the same as the polarizing plate POL described in conjunction with FIG. 28 except that it further includes the adhesive 1700 and the positive C retardation layer 1800, and thus the redundant descriptions will be omitted for descriptive convenience.

For the function as an antireflection unit of the first part PR1, the in-plane retardation value $R_O$ of the first part PR1, which includes the polarizer 1100, the first retardation layer 1200, the protective film 1400, and the positive C retardation layer 1800, may be in a range of about 100 nm to about 180 nm at a wavelength of about 550 nm. For example, $R_o(450)/R_o(550)$ of the first part PR1 may be about 1.00 or less. The $R_o(450)$ may be the in-plane retardation value of the first part PR1 at a wavelength of about 450 nm, and the $R_o(550)$ may be the in-plane retardation value of the first part PR1 at a wavelength of about 550 nm.

The adhesive 1700 may be disposed between the first retardation layer 1200 and the second cohesion 1600. The positive C retardation layer 1800 may be disposed between the adhesive 1700 and the second cohesion 1600.

The positive C retardation layer 1800 may further improve image quality by improving a reflective color in an oblique direction toward the viewer side. The positive C retardation layer 1800 may refer to a retardation plate having an optical axis in a direction perpendicular to the plane (e.g., the third direction DR3). For example, it may include a film having a refractive index ratio $N_z$ of negative infinity, substantially about −6 or less. The refractive index ratio $N_z$ may be calculated as in Equation (4):

$$N_z = \frac{(nx - nz)}{(nx - ny)} \quad (4)$$

In Equation (4), nx and ny represent in-plane refractive indices of the film. In case that a vibration direction in which the in-plane refractive index is maximized is x, nx represents the refractive index of light vibrating in the vibration direction. For example, nx and ny may be perpendicular to each other. nz represents the refractive index in the thickness direction of the film.

The positive C retardation layer 1800 may be manufactured by orienting a polymer film by an appropriate method, or manufactured by coating a polymeric cholesteric liquid crystal compound on a surface of a substrate, orienting the polymeric cholesteric liquid crystal compound in a certain direction, and then curing the polymeric cholesteric liquid crystal compound. In the case of using a polymeric cholesteric liquid crystal compound, a zero retardation film may be used as a substrate. The zero retardation film refers to a film in which no substantial retardation occurs in case that light passes therethrough.

The positive C retardation layer 1800 may be bonded to the first retardation layer 1200 via the adhesive 1700. For example, as the adhesive 1700, the adhesive described in conjunction with FIG. 28 may be used, but embodiments are not limited thereto.

For example, although FIG. 30 illustrates that the positive C retardation layer 1800 is disposed above a surface of the first retardation layer 1200, embodiments are not limited thereto. For example, in case that the first retardation layer 1200 includes a plurality of retardation layers, the positive C retardation layer 1800 may be disposed between the plurality of retardation layers.

Figure 31:
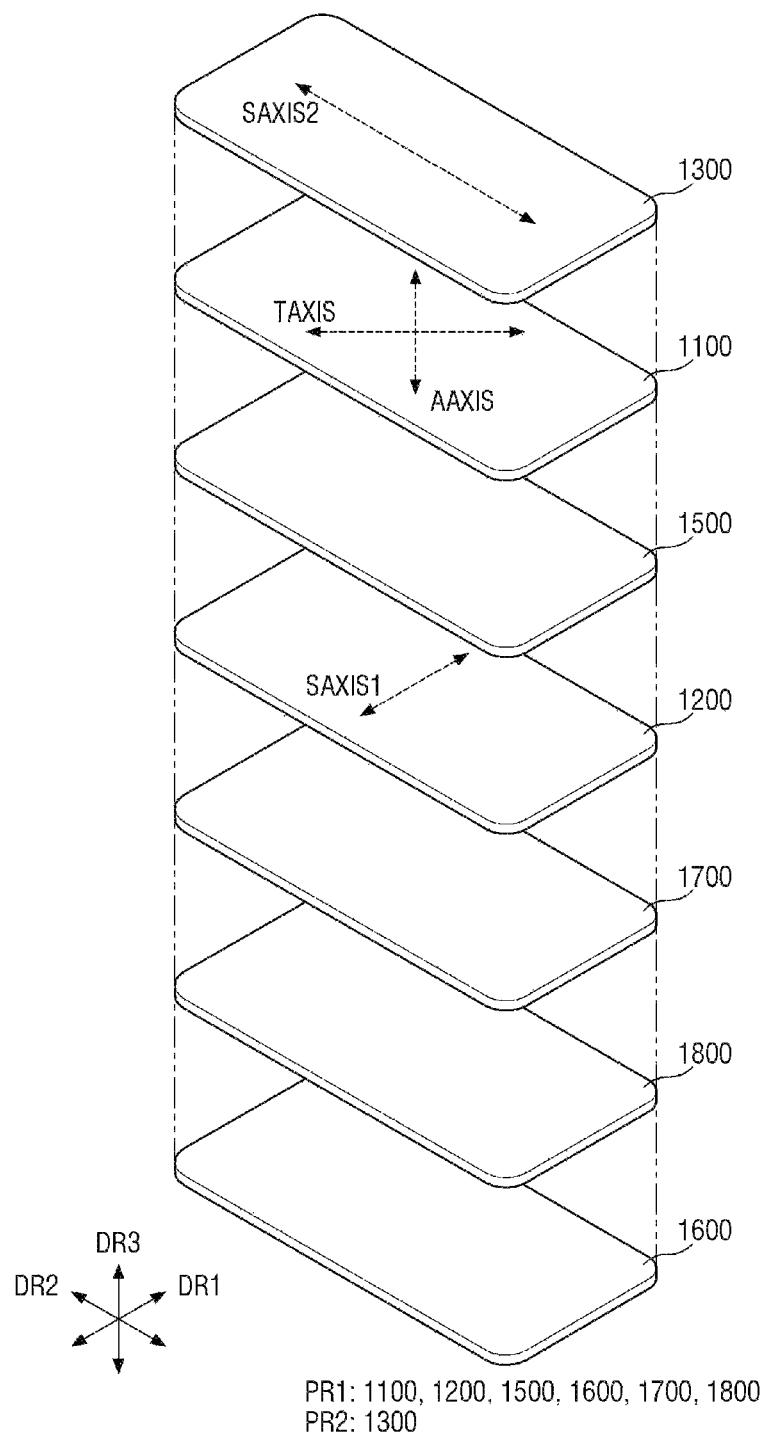
FIG. 31 is an exploded schematic perspective view illustrating a polarizing plate according still another embodiment.

FIG. 31 is an exploded schematic perspective view illustrating a polarizing plate according to still another embodiment.

Referring to FIG. 31, the polarizing plate POL may include the polarizer 1100, the first retardation layer 1200, the second retardation layer 1300, the protective film 1400, the first cohesion 1500, the second cohesion 1600, the adhesive 1700, and the positive C retardation layer 1800. Since the polarizing plate POL shown in FIG. 31 is the same as the polarizing plate POL described in conjunction with FIG. 30 in that it does not include the protective film 1400, the redundant descriptions will be omitted for descriptive convenience.

The polarizing plate POL shown in FIGS. 9 and 28 to 31 may be applied to an organic light emitting display device including an organic light emitting diode, a quantum dot light emitting display device including a quantum dot light emitting layer, an inorganic light emitting display device including an inorganic semiconductor, a micro or nano light emitting display device including a micro or nano light emitting diode (LED) of a micro or nano unit, a liquid crystal display including a liquid crystal layer, a plasma display device, an electroluminescence display device, and the like.

Hereinafter, experimental examples including embodiments are presented to help understanding of the disclosure, but the following embodiments are merely for illustrating the disclosure and do not limit the claims attached hereto, and it is apparent to those skilled in the art that various alterations and modifications may be made within the categories and the scope of the technical ideas of the disclosure, and such alterations and modifications pertain to the claims attached hereto.

Fabrication Example: Fabrication of the Polarizing Plate POL Shown in FIG. 9

A transparent unstretched polyvinyl alcohol film (e.g., PE60 of Kuraray Co., Ltd.) having a saponification degree of about 99.9% or more was immersed in 30° C. water (e.g., deionized water) for about 2 minutes to swell, and then was immersed and dyed for about 4 minutes in a 30° C. dye solution including about 1.25 mM/L of iodine, about 1.25% by weight of potassium iodide, and about 0.0005% by weight of nitric acid. For example, at the swelling and dyeing steps, it was stretched at elongation ratios of about 1.3 times and about 1.4 times, respectively, so that the cumulative elongation ratio until it reached the dyeing tank was about 1.82 times.

Subsequently, it was immersed in a 50° C. aqueous solution for crosslinking including about 10% by weight of potassium iodide and about 3.7% by weight of boric acid for 30 seconds to be crosslinked (first crosslinking), and thus stretched at an elongation ratio of about 2 times. Thereafter, it was immersed in a 50° C. aqueous solution for crosslinking including about 10% by weight of potassium iodide and about 3.7% by weight of boric acid for 20 seconds to be crosslinked (second crosslinking), and thus stretched at an elongation ratio of about 1.5 times (the cumulative elongation ratio of the first crosslinking and the second crosslinking was about 3 times). The total cumulative elongation ratio of the swelling, dyeing and crosslinking steps was set to about 5.46 times. The polarizer 1100 was fabricated by drying the polyvinyl alcohol film, which has been cross-linked, in an oven at about 70° C. for about 4 minutes. The protective film 1400 was attached to the bottom surface (or lower surface) of the polarizer 1100 by using an adhesive, and the second retardation layer 1300 was attached to the top surface (or upper surface) of the polarizer 1100 by using an adhesive. Thereafter, the first retardation layer 1200, which corresponds to a λ/4 retardation layer (e.g., Fuji Film Co., Ltd., $R_o$ 140 nm) having a thickness of 2 μm, was attached to the bottom surface (or lower surface) of the protective film 1400 via a cohesion (Lintec Co., Ltd.), so that the polarizing plate POL formed of the second retardation layer 1300, the polarizer 1100, an adhesive, the protective film 1400, a cohesion, and the first retardation layer 1200 from top to bottom was fabricated as shown in FIG. 9.

EXAMPLES AND COMPARATIVE EXAMPLES

Example 1

The polarizing plate POL of Example 1 was fabricated such that a 30 μm cycloolefin film (e.g., Nippon Zeon Co., Ltd., $R_o$ about 70 nm) was used as the second retardation layer 1300, a 20 μm triacetyl cellulose film (e.g., Fuji Film Co., Ltd., $R_{th}$ 0 nm) was used as the protective film 1400, and the angle between the absorption axis AAXIS of the polarizer 1100 and the retardation axis of the second retardation layer 1300 was about 45°.

Example 2

The polarizing plate POL of Example 2 was fabricated in the same manner as used in Example 1 except that a 30 μm cycloolefin film (e.g., Nippon Zeon Co., Ltd., $R_o$ 80 nm) was used as the first protective film.

Example 3

The polarizing plate POL of Example 3 was fabricated in the same manner as used in Example 1 except that a 30 μm cycloolefin film (e.g., Nippon Zeon Co., Ltd., $R_o$ 90 nm) was used as the first protective film.

Example 4

The polarizing plate POL of Example 4 was fabricated in the same manner as used in Example 1 except that the angle between the absorption axis AAXIS of the polarizer 1100 and the retardation axis SAXIS2 of the second retardation layer 1300 was about 30°.

Example 5

The polarizing plate POL of Example 5 was fabricated in the same manner as used in Example 1 except that the angle between the absorption axis AAXIS of the polarizer 1100 and the retardation axis SAXIS2 of the second retardation layer 1300 was about 15°.

Example 6

The polarizing plate POL was fabricated such that a 30 μm cycloolefin film (e.g., Nippon Zeon Co., Ltd., $R_0$ about 99 nm) was used as the second retardation layer 1300, a 20 m triacetyl cellulose film (e.g., Fuji Film Co., Ltd., $R_{th}$ 0 nm) was used as the protective film 1400, and the angle between the absorption axis AAXIS of the polarizer 1100 and the retardation axis SAXIS2 of the second retardation layer 1300 was about 30°.

Example 7

The polarizing plate POL of Example 7 was fabricated in the same manner as used in Example 6 except that the angle between the absorption axis AAXIS of the polarizer 1100 and the retardation axis SAXIS2 of the second retardation layer 1300 was about 15°.

Comparative Example 1

The polarizing plate POL of Comparative Example 1 was fabricated in the same manner as used in Example 1 except that a 30 km cycloolefin film (e.g., Nippon Zeon Co., Ltd., $R_0$ 100 nm) was used as the second retardation layer 1300.

Comparative Example 2

The polarizing plate POL of Comparative Example 2 was fabricated in the same manner as used in Example 1 except that a 30 km cycloolefin film (e.g., Nippon Zeon Co., Ltd., $R_0$ 110 nm) was used as the second retardation layer 1300.

Comparative Example 3

The polarizing plate POL of Comparative Example 3 was fabricated in the same manner as used in Example 1 except that a 30 km cycloolefin film (e.g., Nippon Zeon Co., Ltd., $R_0$ 120 nm) was used as the second retardation layer 1300.

Comparative Example 4

The polarizing plate POL of Comparative Example 4 was fabricated in the same manner as used in Example 1 except that the angle between the absorption axis AAXIS of the polarizer 1100 and the retardation axis SAXIS2 of the second retardation layer 1300 was about 0°.

Comparative Example 5

The polarizing plate POL of Comparative Example 5 was fabricated in the same manner as used in Comparative Example 1 except that the angle between the absorption axis AAXIS of the polarizer 1100 and the retardation axis SAXIS2 of the second retardation layer 1300 was about 0°.

Experimental Example

Frontside Reflectance Evaluation

Results of measuring the frontside reflection characteristics of the polarizing plates POL fabricated in the examples and the comparative examples are shown in Tables 1 and 2. The polarizing plates POL fabricated in the above examples and comparative examples may be disposed on the top surface (or upper surface) of a substrate, and a reflective plate having a reflectance of about 95% or more may be disposed on the bottom surface (or lower surface) of the substrate. For example, the frontside reflectance refers to a ratio of light, which passes through the polarizing plate POL, is reflected by the reflective plate, and passes through the polarizing plate POL again, to light incident to the polarizing plate POL. The frontside reflectance was measured by using a CM-2600D instrument (Konica Minolta Co., Ltd.) as a spectrophotometer.

Orthogonal Transmittance Evaluation

Results of measuring the orthogonal transmittances of the polarizing plates POL of the examples or the comparative examples are shown in Tables 1 and 2. The orthogonal transmittance of the polarizing plate POL refers to a ratio of light passing through the polarizing plate POL of polarized light that is perpendicular to the absorption axis of the polarizer 1100 of the polarizing plate POL. The orthogonal transmittance of the polarizing plate POL was measured by using V7100 (JASCO Co., Ltd.) as a spectrophotometer.

In Tables 1 and 2, the angle between the retardation axis SAXIS2 of the second retardation layer 1300 and the absorption axis AAXIS of the polarizer 1100 is described as a mutual angle.

TABLE 1

|  | Example 1 | Example 2 | Example 3 | Example 4 | Example 5 | Example 6 | Example 7 |
|---|---|---|---|---|---|---|---|
| In-plane retardation value ($R_o$) | 70 nm | 80 nm | 90 nm | 70 nm | 70 nm | 99 nm | 99 nm |
| Mutual angle (°) | 45 | 45 | 45 | 30 | 15 | 30 | 15 |
| Frontside reflectance (%) | 4.92 | 4.92 | 4.93 | 5.13 | 5.12 | 5.10 | 4.86 |

TABLE 1-continued

|  | Example 1 | Example 2 | Example 3 | Example 4 | Example 5 | Example 6 | Example 7 |
|---|---|---|---|---|---|---|---|
| Orthogonal transmittance (%) | 9.8 | 11.4 | 13.2 | 6.8 | 2.6 | 10.9 | 3.8 |

TABLE 2

|  | Comparative Example 1 | Comparative Example 2 | Comparative Example 3 | Comparative Example 4 | Comparative Example 5 |
|---|---|---|---|---|---|
| In-plane retardation value ($R_o$) | 100 nm | 110 nm | 120 nm | 70 nm | 100 nm |
| Mutual angle (°) | 45 | 45 | 45 | 0 | 0 |
| Frontside reflectance (%) | 4.92 | 4.93 | 4.93 | 5.12 | 4.99 |
| Orthogonal transmittance (%) | 14.8 | 16.3 | 17.1 | 1.9 | 1.2 |

Referring to Tables 1 and 2, since the polarizing plate POL according to an embodiment has a frontside reflectance of less than about 6% and an orthogonal transmittance of about 2% to about 14%, it can be seen that the frontside reflectance and orthogonal transmittance characteristics are fine.

Figure 32:
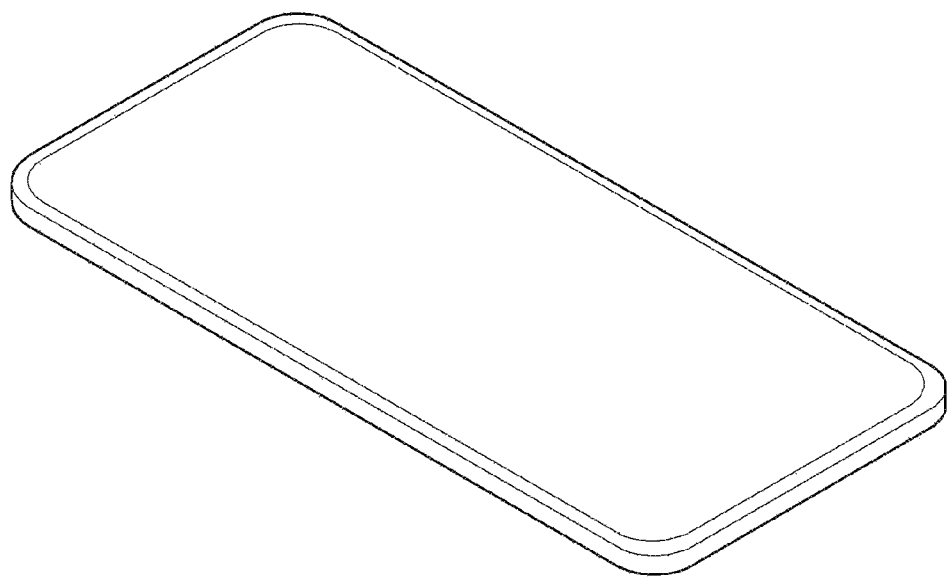
FIG. 32 is a schematic diagram illustrating a smartphone to which a display device according to an embodiment is applied.

FIG. 32 is a schematic diagram illustrating a smartphone to which a display device according to an embodiment is applied. Referring to FIG. 32, the smartphone, to which the display device 10 according to an embodiment is applied, is illustrated as an example of an electronic device.

Figure 33:
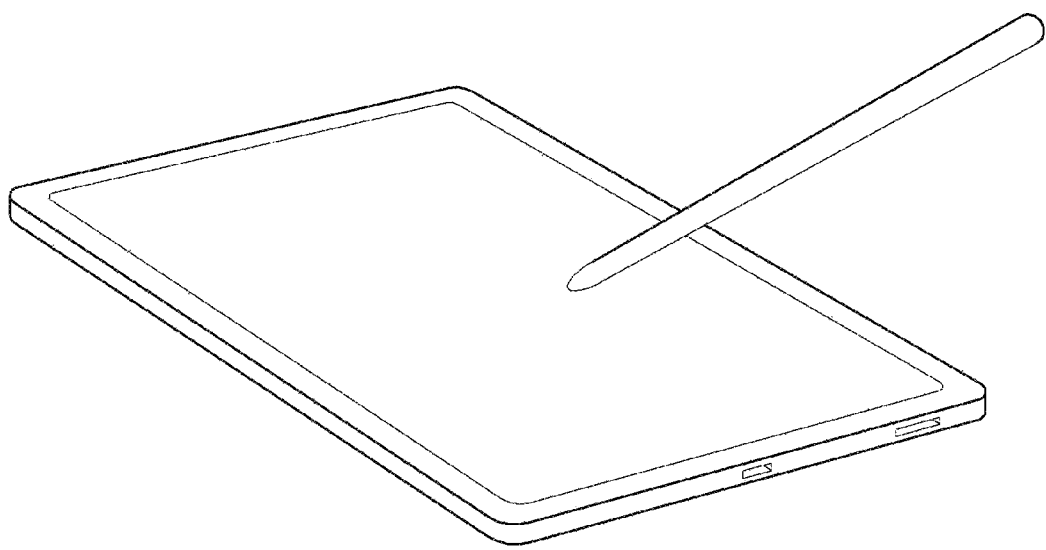
FIG. 33 is a schematic diagram illustrating a tablet PC to which a display device according to an embodiment is applied.

FIG. 33 is a schematic diagram illustrating a tablet PC to which a display device according to an embodiment is applied. Referring to FIG. 33, the tablet PC, to which the display device 10 according to an embodiment is applied, is illustrated as an example of an electronic device.

Figure 34:
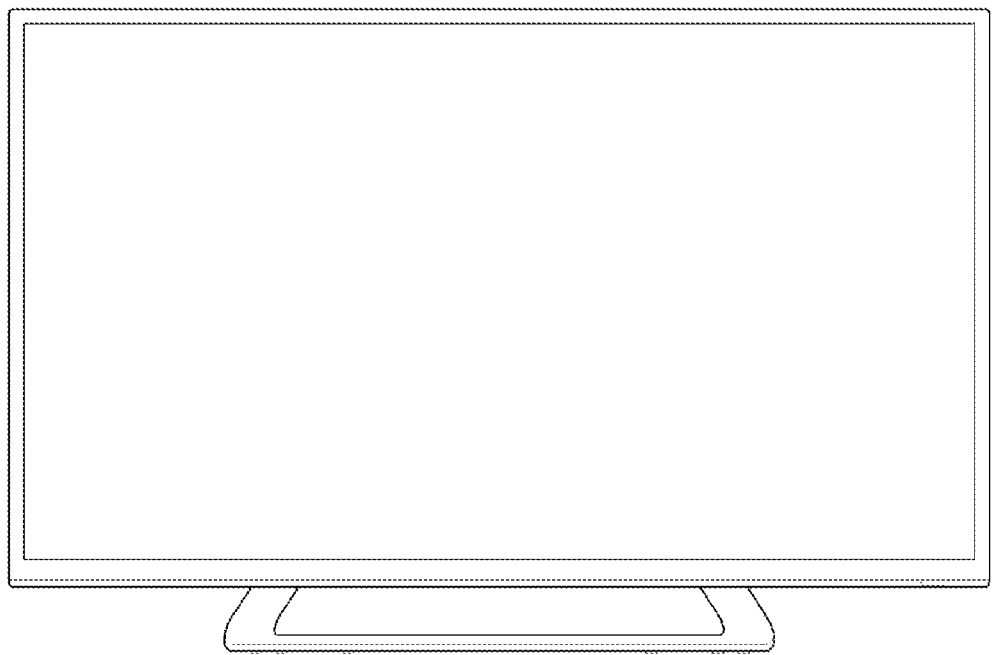
FIG. 34 is a schematic diagram illustrating a television (TV) to which a display device according to an embodiment is applied.

FIG. 34 is a schematic diagram illustrating a television (TV) to which a display device according to an embodiment is applied. Referring to FIG. 34, the TV, to which a display device according to an embodiment is applied, is illustrated as an example of an electronic device.

Figure 35:
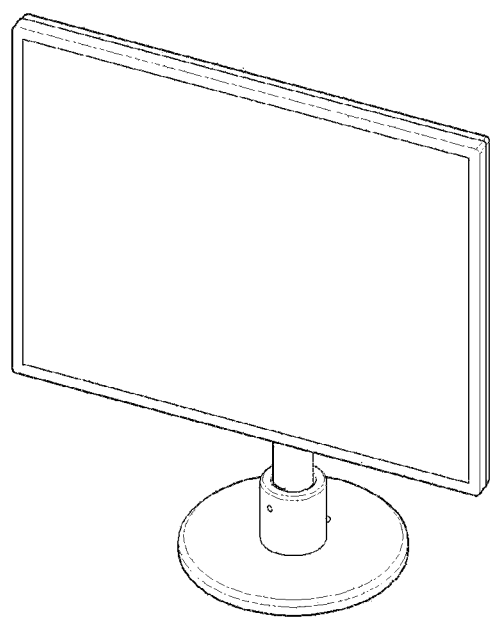
FIG. 35 is a schematic diagram illustrating a monitor to which a display device according to an embodiment is applied.

FIG. 35 is a schematic diagram illustrating a monitor to which a display device according to an embodiment is applied. Referring to FIG. 35, the monitor to which a display device according to an embodiment is applied, is illustrated as an example of an electronic device.

Figure 36:
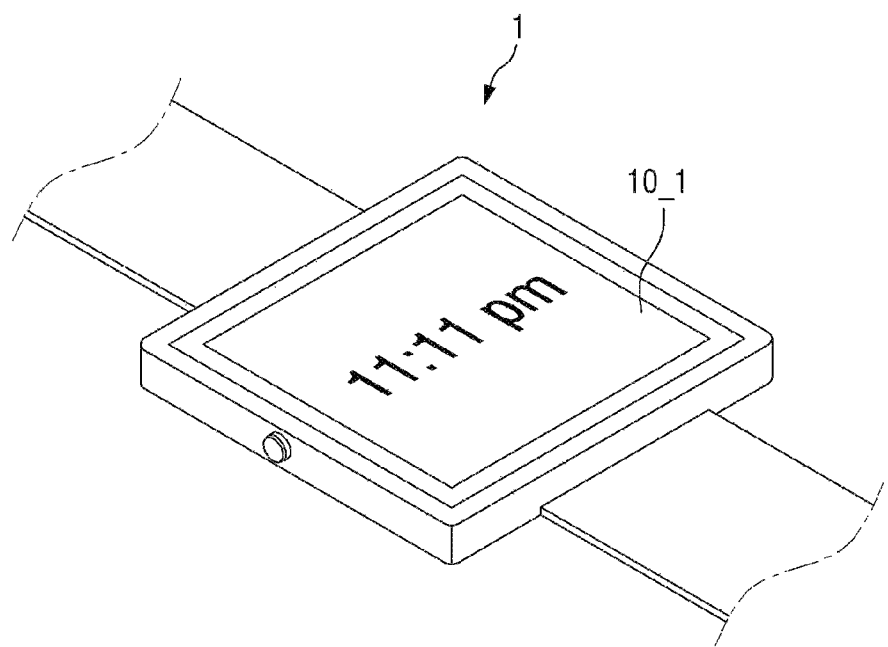
FIG. 36 is a schematic diagram illustrating a smartwatch to which a display device according to an embodiment is applied.

FIG. 36 is a schematic diagram illustrating a smartwatch to which a display device according to an embodiment is applied. Referring to FIG. 36, a display device according to an embodiment may be applied to a smartwatch, which is one of smart devices.

Referring to FIGS. 32 to 36, a display device according to an embodiment may follow the shape of an electronic device to which it is applied in plan view. For example, a display portion of a smartwatch 1 may have a rectangular shape in plan view. A display device 10_1 according to an embodiment may have a rectangular shape in plan view. In another example, in case that the display portion of the smartwatch 1 has a circular or elliptical shape in plan view, the display device 10_1 according to an embodiment may have a circular or elliptical shape in plan view. However, embodiments are not limited thereto, and a display device according to an embodiment may not follow the shape of an electronic device to which it is applied in plan view.

Figure 37:
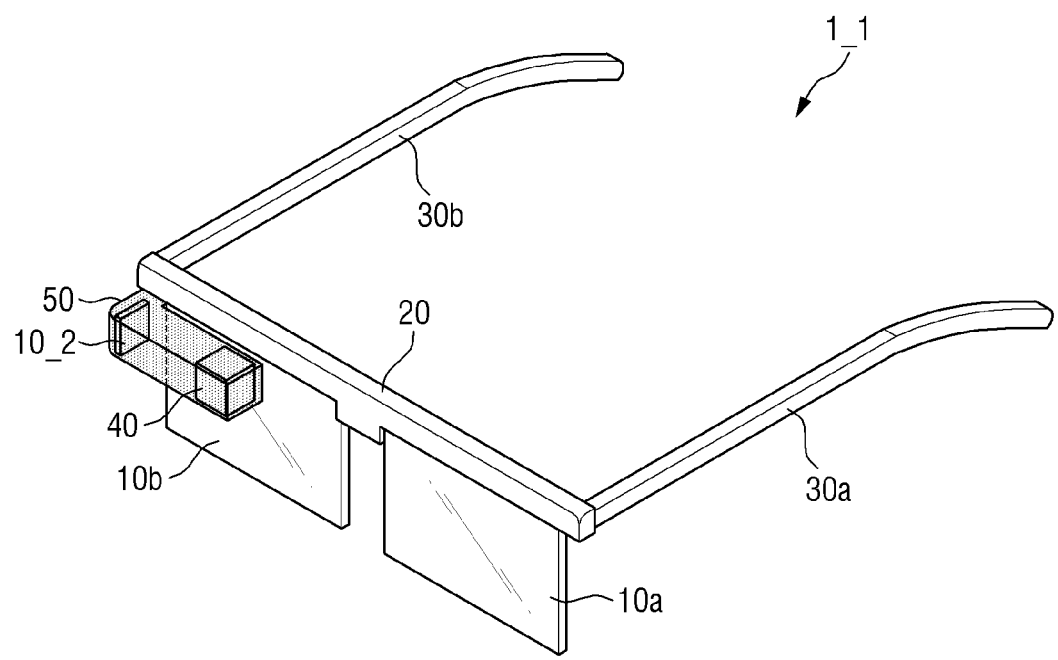
FIG. 37 is a schematic view illustrating a glasses type display device to which a display device according to an embodiment is applied.

FIG. 37 is a schematic view illustrating a glasses type display device to which a display device according to an embodiment is applied.

Referring to FIG. 37, a display device 10_2 according to an embodiment may be applied to a glasses type display device 1_1 used as an augmented reality device. The glasses type display device 1_1 according to an embodiment may include the display device 10_2, a left eye lens 10a, a right eye lens 10b, a support frame 20, temples 30a and 30b, a reflective member 40, and a display device housing 50.

The display device housing 50 may include the display device 10_2 and the reflective member 40. An image displayed on the display device 10_2 may be reflected by the reflective member 40 and provided to the user's right eye through the right eye lens 10b. As a result, the user may view a virtual reality image displayed on the display device 10_2 with the right eye.

FIG. 37 illustrates that the display device housing 50 is disposed at the right end portion of the support frame 20, but embodiments are not limited thereto. For example, the display device housing 50 may be disposed at the left end portion of the support frame 20. For example, an image displayed on the display device 10_2 may be reflected by the reflective member 40, and provided to the user's left eye through the left eye lens 10a. As a result, the user may view the virtual reality image displayed on the display device 10_2 through the left eye. In another example, the display device housings 50 may be disposed at both the left and right end portions of the support frame 20. For example, the user views a virtual reality image displayed on the display device 10_2 with both the left and right eyes.

Figure 38:
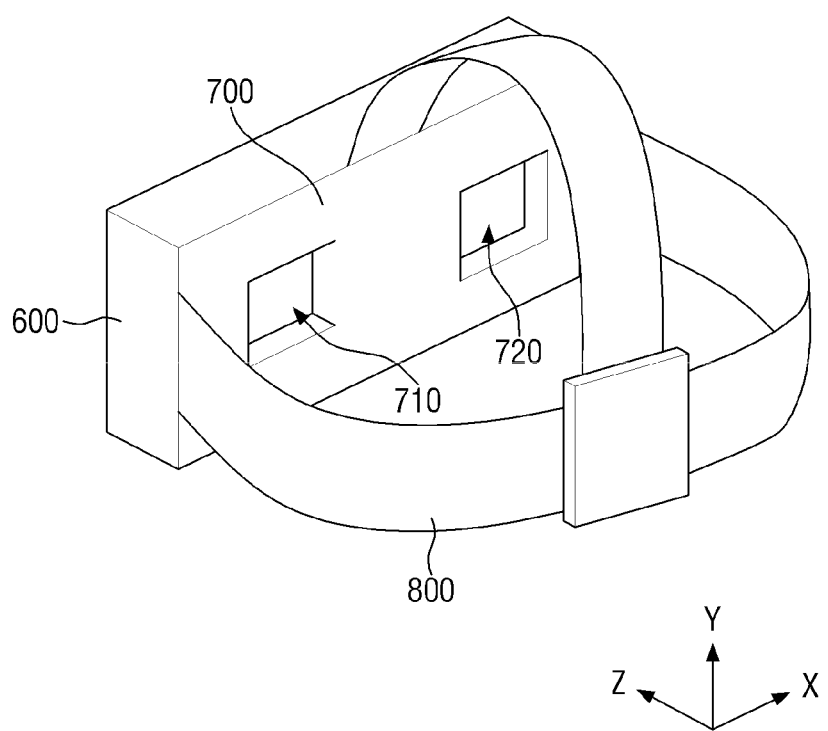
FIGS. 38 and 39 are schematic views illustrating a head mounted display device to which a display device according to an embodiment is applied.
Figure 39:
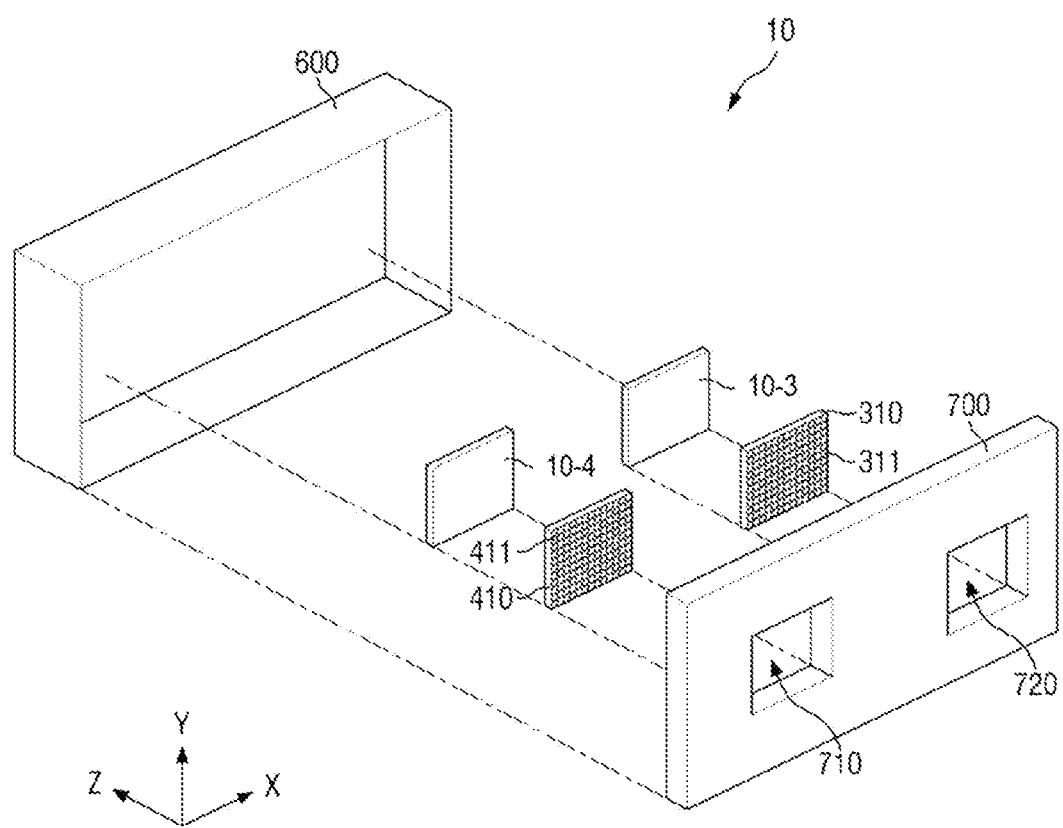

FIGS. 38 and 39 are schematic views illustrating a head mounted display device to which a display device according to an embodiment is applied.

Referring to FIGS. 38 and 39, display devices 10_3 and 10_4 according to an embodiment may be applied to a head mounted display. The first display device 10_3 may provide an image to the user's right eye, and the second display device 10_4 may provide an image to the user's left eye.

A first lens array 310 may be disposed between the first display device 10_3 and a housing cover 700. The first lens array 310 may include lenses 311. The lenses 311 may be formed as convex lenses that are convex in the direction toward the housing cover 700.

A second lens array 410 may be disposed between the second display device 10_4 and the housing cover 700. The second lens array 410 may include lenses 411. The lenses 411 may be formed as convex lenses that are convex in the direction toward the housing cover 700.

A display panel housing 600 may function to accommodate the first display device 10_3, the second display device 104, the first lens array 310, and the second lens array 410. A surface of the display panel housing 600 may be opened to accommodate the first display device 103, the second display device 10_4, the first lens array 310, and the second lens array 410.

The housing cover 700 may cover the opened surface of the display panel housing 600. The housing cover 700 may include a first opening 710 where the user's left eye is positioned and a second opening 720 where the user's right eye is positioned. FIGS. 38 and 39 illustrate that the first opening 710 and the second opening 720 are formed in a rectangular shape, but embodiments are not limited thereto. The first opening 710 and the second opening 720 may be formed in a circular shape or an elliptical shape. In another example, the first opening 710 and the second opening 720 may be combined to be formed as an opening.

The first opening 710 may be aligned with the first display device 10_3 and the first lens array 310, and the second opening 720 may be aligned with the second display device 10_4 and the second lens array 410. Accordingly, the user may view an image of the first display device 103, which is a virtual image enlarged by the first lens array 310, through the first opening 710, and an image of the second display device 10_4, which is a virtual image enlarged by the second lens array 410, through the second opening 720.

A head mounting band 800 functions to fix the display panel housing 600 to the user's head so that the first opening 710 and the second opening 720 of the housing cover 700 may be positioned above the user's left and right eyes, respectively. The head mounting band 800 may be connected to the top (or upper), left and right surfaces of the display panel housing 600.

Figure 40:
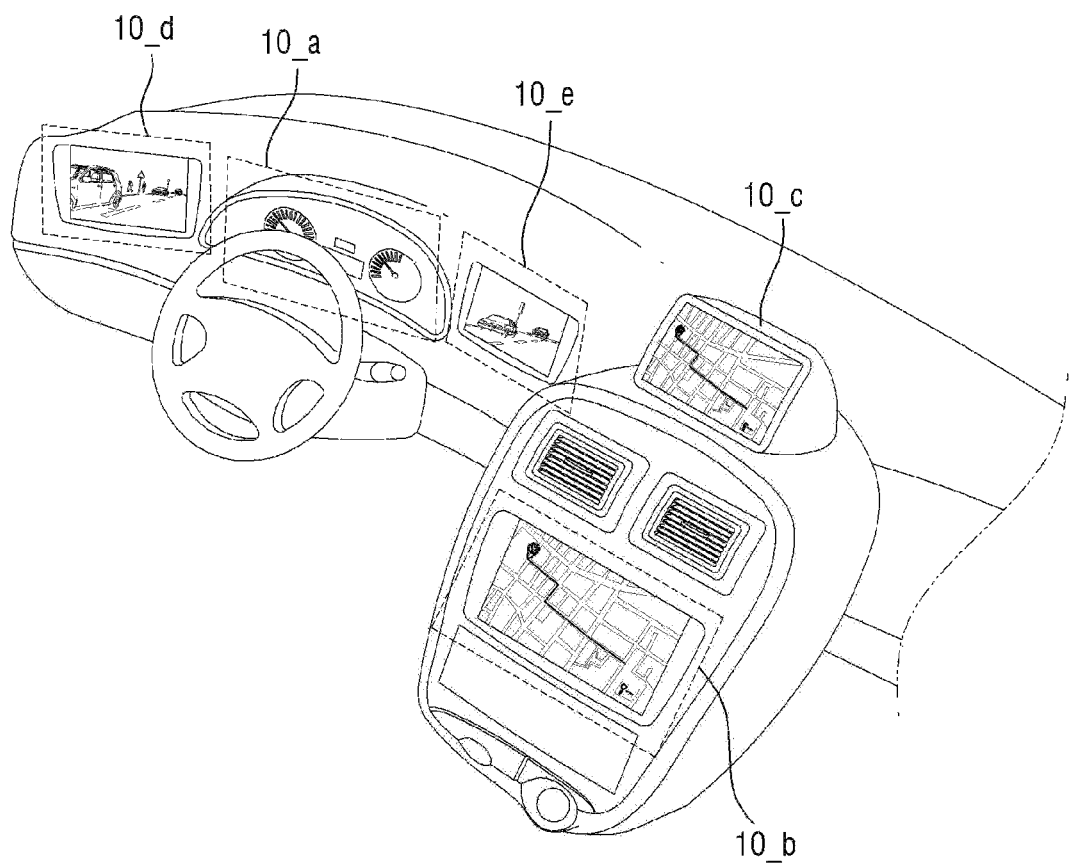
FIG. 40 is a schematic view illustrating a display device for automobile to which a display device according to an embodiment is applied.

FIG. 40 is a schematic view illustrating a display device for automobile to which a display device according to an embodiment is applied.

Referring to FIG. 40, display devices 10_a, 10_b, 10_c, 10_d, and 10_e according to an embodiment may be applied to the display device for automobile. The display devices 10_a, 10_b, and 10_c according to an embodiment may be applied to the dashboard of the automobile, the center fascia of the automobile, or the center information display (CID) of the dashboard of the automobile. Further, the display devices 10_d, and 10_e according to an embodiment may be applied to a room mirror display instead of side mirrors of the automobile.

The above description is an example of technical features of the disclosure, and those skilled in the art to which the disclosure pertains will be able to make various modifications and variations. Therefore, the embodiments of the disclosure described above may be implemented separately or in combination with each other.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A polarizing plate comprising:
   a polarizer comprising an absorption axis and a transmission axis that intersect each other;
   a first retardation layer disposed on a surface of the polarizer; and
   a second retardation layer disposed on another surface opposite to the surface of the polarizer, wherein
   an in-plane retardation value of the second retardation layer is greater than about 20 nm and less than about 100 nm,
   an in-plane retardation value of the first retardation layer is greater than the in-plane retardation value of the second retardation layer, and
   an angle between the absorption axis of the polarizer and a retardation axis of the second retardation layer is in a range of about 10° to about 45°.

2. The polarizing plate of claim 1, wherein an angle between a retardation axis of the first retardation layer and the absorption axis of the polarizer is about 45°.

3. The polarizing plate of claim 1, wherein
   the polarizer and the first retardation layer are defined as a first part,
   an in-plane retardation value ($R_o$) of the first part at a wavelength of about 550 nm is in a range of about 100 nm to about 180 nm,
   a value of $R_o(450)/R_o(550)$ is equal to or less than about 1.00,
   the $R_o(450)$ is an in-plane retardation value of the first part at a wavelength of about 450 nm, and
   the $R_o(550)$ is an in-plane retardation value of the first part at a wavelength of about 550 nm.

4. The polarizing plate of claim 1, further comprising:
   a protective film disposed between the polarizer and the first retardation layer.

5. The polarizing plate of claim 4, wherein
   the polarizer, the protective film, and the first retardation layer are defined as a first part,
   an in-plane retardation value ($R_o$) of the first part at a wavelength of about 550 nm is in a range of about 100 nm to about 180 nm,
   a value of $R_o(450)/R_o(550)$ is equal to or less than about 1.00,
   the $R_o(450)$ is an in-plane retardation value of the first part at a wavelength of about 450 nm, and
   the $R_o(550)$ is an in-plane retardation value of the first part at a wavelength of about 550 nm.

6. The polarizing plate of claim 4, further comprising:
   a positive C retardation layer having an optical axis in a direction perpendicular to the surface of the polarizer.

7. The polarizing plate of claim 6, wherein
   the polarizer, the positive C retardation layer, the protective film, and the first retardation layer are defined as a first part,
   an in-plane retardation value ($R_o$) of the first part at a wavelength of about 550 nm is in a range of about 100 nm to about 180 nm,
   a value of $R_o(450)/R_o(550)$ is equal to or less than about 1.00,
   the $R_o(450)$ is an in-plane retardation value of the first retardation layer at a wavelength of about 450 nm, and
   the $R_o(550)$ is an in-plane retardation value of the first retardation layer at a wavelength of about 550 nm.

8. The polarizing plate of claim 1, further comprising:
   a positive C retardation layer having an optical axis in a direction perpendicular to the surface of the polarizer.

9. The polarizing plate of claim 8, wherein the positive C retardation layer is disposed on a surface of the first retardation layer.

10. The polarizing plate of claim 8, wherein
the first retardation layer comprises a plurality of retardation layers, and
the positive C retardation layer is disposed between the plurality of retardation layers.

11. The polarizing plate of claim 8, wherein
the polarizer, the positive C retardation layer, and the first retardation layer are defined as a first part,
an in-plane retardation value ($R_o$) of the first part at a wavelength of about 550 nm is in a range of about 100 nm to about 180 nm,
a value of $R_o(450)/R_o(550)$ is equal to or less than about 1.00,
the $R_o(450)$ is an in-plane retardation value of the first retardation layer at a wavelength of about 450 nm, and
the $R_o(550)$ is an in-plane retardation value of the first retardation layer at a wavelength of about 550 nm.

12. The polarizing plate of claim 1, wherein a frontside reflectance is less than about 6%.

13. The polarizing plate of claim 1, wherein an orthogonal transmittance is in a range of about 2% to about 14%.

14. The polarizing plate of claim 1, wherein the second retardation layer includes a norbornene-based resin.

15. A display device comprising:
a display panel; and
a polarizing plate disposed on the display panel, wherein the polarizing plate comprises:
　a polarizer comprising an absorption axis and a transmission axis that intersect each other;
　a first retardation layer disposed on a surface of the polarizer; and
　a second retardation layer disposed on another surface opposite to the surface of the polarizer,
an in-plane retardation value of the second retardation layer is greater than about 20 nm and less than about 100 nm,
an in-plane retardation value of the first retardation layer is greater than the in-plane retardation value of the second retardation layer, and
an angle between the absorption axis of the polarizer and a retardation axis of the second retardation layer is in a range of about 10° to about 45°.

16. The display device of claim 15, wherein the display panel comprises:
a pixel electrode disposed on a substrate;
a light emitting layer disposed on the pixel electrode; and
a common electrode disposed on the light emitting layer.

17. The display device of claim 16, wherein the display panel further comprises:
a capping layer disposed on the common electrode; and
an encapsulation layer disposed on the capping layer.

18. The display device of claim 17, wherein the encapsulation layer comprises:
at least two encapsulation inorganic layers having different refractive indices; and
an encapsulation organic layer disposed between the at least two encapsulation inorganic layers and having a refractive index different from those of at least the two encapsulation inorganic layers.

19. The display device of claim 15, wherein a maximum color difference value of light produced by the display panel is less than about 0.0050.

20. The display device of claim 19, wherein
color values are calculated at intervals of about P° at an azimuth angle from about 0° to about 360° and at intervals of about R° at a polar angle from about 0° to about Q°, where P, Q, and R are positive integers,
color difference values are calculated with changing the polar angle at intervals of about R° at first and second azimuth angles, which are two different azimuth angles, and
a maximum value among the calculated color difference values is calculated as the maximum color difference value.

21. The display device of claim 15, wherein a minimum perceptible color difference (MPCD) of light produced by the display panel is equal to or less than about 10.

22. The display device of claim 15, wherein
a difference between a luminance ratio of red light produced by the display device and a luminance ratio of blue light produced by the display device expressed as CIE XYZ tristimulus values is less than about 10%, and
a difference between a luminance ratio of green light produced by the display device and the luminance ratio of blue light produced by the display device expressed as CIE XYZ tristimulus values is less than about 10%.

23. The display device of claim 15, wherein an angle between a retardation axis of the first retardation layer and the absorption axis of the polarizer is about 45°.

24. The display device of claim 15, wherein
the polarizer and the first retardation layer are defined as a first part,
an in-plane retardation value ($R_o$) of the first part at a wavelength of about 550 nm is in a range of about 100 nm to about 180 nm,
a value of $R_o(450)/R_o(550)$ is equal to or less than about 1.00,
the $R_o(450)$ is an in-plane retardation value of the first part at a wavelength of about 450 nm, and
the $R_o(550)$ is an in-plane retardation value of the first part at a wavelength of about 550 nm.

25. The display device of claim 15, further comprising:
a protective film disposed between the polarizer and the first retardation layer.

26. The display device of claim 25, wherein
the polarizer and the first retardation layer are defined as a first part,
an in-plane retardation value ($R_o$) of the first part at a wavelength of about 550 nm is in a range of about 100 nm to about 180 nm,
a value of $R_o(450)/R_o(550)$ is equal to or less than about 1.00,
the $R_o(450)$ is an in-plane retardation value of the first part at a wavelength of about 450 nm, and
the $R_o(550)$ is an in-plane retardation value of the first part at a wavelength of about 550 nm.

27. The display device of claim 25, further comprising:
a positive C retardation layer having an optical axis in a direction perpendicular to the surface of the polarizer.

28. The display device of claim 27, wherein
the polarizer, the positive C retardation layer, the protective film, and the first retardation layer are defined as a first part,
an in-plane retardation value ($R_o$) of the first part at a wavelength of about 550 nm is in a range of about 100 nm to about 180 nm,
a value of $R_o(450)/R_o(550)$ is equal to or less than about 1.00,
the $R_o(450)$ is an in-plane retardation value of the first retardation layer at a wavelength of about 450 nm, and
the $R_o(550)$ is an in-plane retardation value of the first retardation layer at a wavelength of about 550 nm.

29. The display device of claim 15, further comprising:
a positive C retardation layer having an optical axis in a direction perpendicular to the surface of the polarizer.

30. The display device of claim 29, wherein the positive C retardation layer is disposed on a surface of the first retardation layer.

31. The display device of claim 29, wherein
the first retardation layer comprises a plurality of retardation layers, and
the positive C retardation layer is disposed between the plurality of retardation layers.

32. The display device of claim 29, wherein
the polarizer, the first retardation layer, and the positive C retardation layer are defined as a first part,
an in-plane retardation value ($R_o$) of the first part at a wavelength of about 550 nm is in a range of about 100 nm to about 180 nm,
a value of $R_o(450)/R_o(550)$ is equal to or less than about 1.00,
the $R_o(450)$ is an in-plane retardation value of the first part at a wavelength of about 450 nm, and
the $R_o(550)$ is an in-plane retardation value of the first part at a wavelength of about 550 nm.

33. The display device of claim 15, wherein a frontside reflectance of the polarizing plate is less than about 6%.

34. The display device of claim 15, wherein an orthogonal transmittance of the polarizing plate is about 2% to about 14%.

35. The display device of claim 15, wherein the second retardation layer includes a norbornene-based resin.

* * * * *